US012796124B2

(12) United States Patent
Sakamoto et al.

(10) Patent No.: US 12,796,124 B2
(45) Date of Patent: Nov. 10, 2026

(54) IMAGING DEVICE WITH INTER-PIXEL AND IN-PIXEL SEPARATION SECTIONS

(71) Applicant: SONY SEMICONDUCTOR SOLUTIONS CORPORATION, Kanagawa (JP)

(72) Inventors: Michiko Sakamoto, Kanagawa (JP); Hiroshi Tanaka, Tokyo (JP); Shogo Otani, Kanagawa (JP); Takashi Kojima, Kanagawa (JP); Tadashi Iijima, Kanagawa (JP); Shota Kitamura, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 477 days.

(21) Appl. No.: 18/554,022

(22) PCT Filed: Mar. 28, 2022

(86) PCT No.: PCT/JP2022/014960
§ 371 (c)(1),
(2) Date: Oct. 5, 2023

(87) PCT Pub. No.: WO2022/220084
PCT Pub. Date: Oct. 20, 2022

(65) Prior Publication Data

US 2024/0204014 A1 Jun. 20, 2024

(30) Foreign Application Priority Data

Apr. 15, 2021 (JP) ................................ 2021-069276

(51) Int. Cl.
*H10F 39/00* (2025.01)
*H10F 39/18* (2025.01)

(52) U.S. Cl.
CPC ......... *H10F 39/802* (2025.01); *H10F 39/011* (2025.01); *H10F 39/182* (2025.01); *H10F 39/807* (2025.01)

(58) Field of Classification Search
CPC ...... H10F 39/011; H10F 39/12; H10F 39/182; H10F 39/802; H10F 39/8053;
(Continued)

(56) References Cited

U.S. PATENT DOCUMENTS

2015/0091122 A1 4/2015 Okazaki et al.
2017/0012066 A1 1/2017 Choi et al.
(Continued)

FOREIGN PATENT DOCUMENTS

JP 2013-243324 12/2013
JP 2020-188267 11/2020
(Continued)

OTHER PUBLICATIONS

International Search Report and Written Opinion prepared by the Japan Patent Office on Jun. 9, 2022, for International Application No. PCT/JP2022/014960, 3 pgs.

*Primary Examiner* — Hoai V Pham
(74) *Attorney, Agent, or Firm* — SHERIDAN ROSS P.C.

(57) ABSTRACT

An imaging device according to an embodiment of the present disclosure includes: a semiconductor substrate in which a plurality of pixels is arranged in a matrix, the semiconductor substrate including a plurality of photoelectric conversion sections that each generate electric charge corresponding to a light receiving amount by photoelectric conversion for each of the pixels; an inter-pixel separation section between the pixels adjacent to each other, electrically and optically separating the adjacent pixels from each other, and having a first refractive index; and an in-pixel separation section between the photoelectric conversion
(Continued)

sections adjacent to each other inside each of the pixels, electrically separating the adjacent photoelectric conversion sections, and having a second refractive index, a difference between the second refractive index and a refractive index of the semiconductor substrate being smaller than a difference between the first refractive index and the refractive index of the semiconductor substrate.

20 Claims, 52 Drawing Sheets

(58) Field of Classification Search
CPC ............... H10F 39/806; H10F 39/8063; H10F 39/8067; H10F 39/807
See application file for complete search history.

(56) References Cited

U.S. PATENT DOCUMENTS

| | | | | |
|---|---|---|---|---|
| 2019/0252450 | A1 | 8/2019 | Noudo | |
| 2022/0165770 | A1 * | 5/2022 | Ogasahara | H10F 39/8053 |

FOREIGN PATENT DOCUMENTS

| | | |
|---|---|---|
| JP | 2021-027276 | 2/2021 |
| JP | 2021-040088 | 3/2021 |
| WO | WO 2018/078976 | 5/2018 |
| WO | WO 2020/175195 | 9/2020 |

* cited by examiner

IMAGING DEVICE WITH INTER-PIXEL AND IN-PIXEL SEPARATION SECTIONS

CROSS REFERENCE TO RELATED APPLICATIONS

This application is a national stage application under 35 U.S.C. 371 and claims the benefit of PCT Application No. PCT/JP2022/014960, having an international filing date of 28 Mar. 2022, which designated the United States, which PCT application claimed the benefit of Japanese Patent Application No. 2021-069276, filed 15 Apr. 2021, the entire disclosures of each of which are incorporated herein by reference.

TECHNICAL FIELD

The present disclosure relates to an imaging device that makes it possible to acquire imaging information and parallax information, for example.

BACKGROUND ART

For example, PTL 1 discloses an image sensor in which one on-chip lens is disposed across a plurality of pixels. A trench is provided between adjacent pixels and in a central portion of a phase difference acquisition pixel.

CITATION LIST

Patent Literature

PTL 1: U.S. Unexamined Patent Application Publication No. 2017/0012066

SUMMARY OF THE INVENTION

Incidentally, an imaging device in which one on-chip lens is disposed across a plurality of pixels and which is able to acquire imaging information and parallax information as described above is demanded to improve an optical characteristic.

It is desirable to provide an imaging device that makes it possible to improve an optical characteristic.

An imaging device according to an embodiment of the present disclosure includes: a semiconductor substrate which has a first surface and a second surface opposed to each other, and in which a plurality of pixels is arranged in a matrix, the semiconductor substrate including a plurality of photoelectric conversion sections that each generate electric charge corresponding to a light receiving amount by photoelectric conversion for each of the pixels; an inter-pixel separation section provided between the pixels adjacent to each other, electrically and optically separating the adjacent pixels from each other, and having a first refractive index; and an in-pixel separation section provided between the photoelectric conversion sections adjacent to each other inside each of the pixels, electrically separating the adjacent photoelectric conversion sections, and having a second refractive index, a difference between the second refractive index and a refractive index of the semiconductor substrate being smaller than a difference between the first refractive index and the refractive index of the semiconductor substrate.

In the imaging device according to the embodiment of the present disclosure, the pixel separation section having the first refractive index is provided between the adjacent pixels of the semiconductor substrate, and the in-pixel separation section having the second refractive index whose difference with the refractive index of the semiconductor substrate is smaller than difference between the first refractive index and the refractive index of the semiconductor substrate is provided between the photoelectric conversion sections adjacent to each other inside each of the pixels. This allows for light entered in each pixel at a wide angle to be totally reflected between adjacent pixels, and to be prevented from reflecting between adjacent photoelectric conversion sections inside the pixel.

MODES FOR CARRYING OUT THE INVENTION

Figure 1:
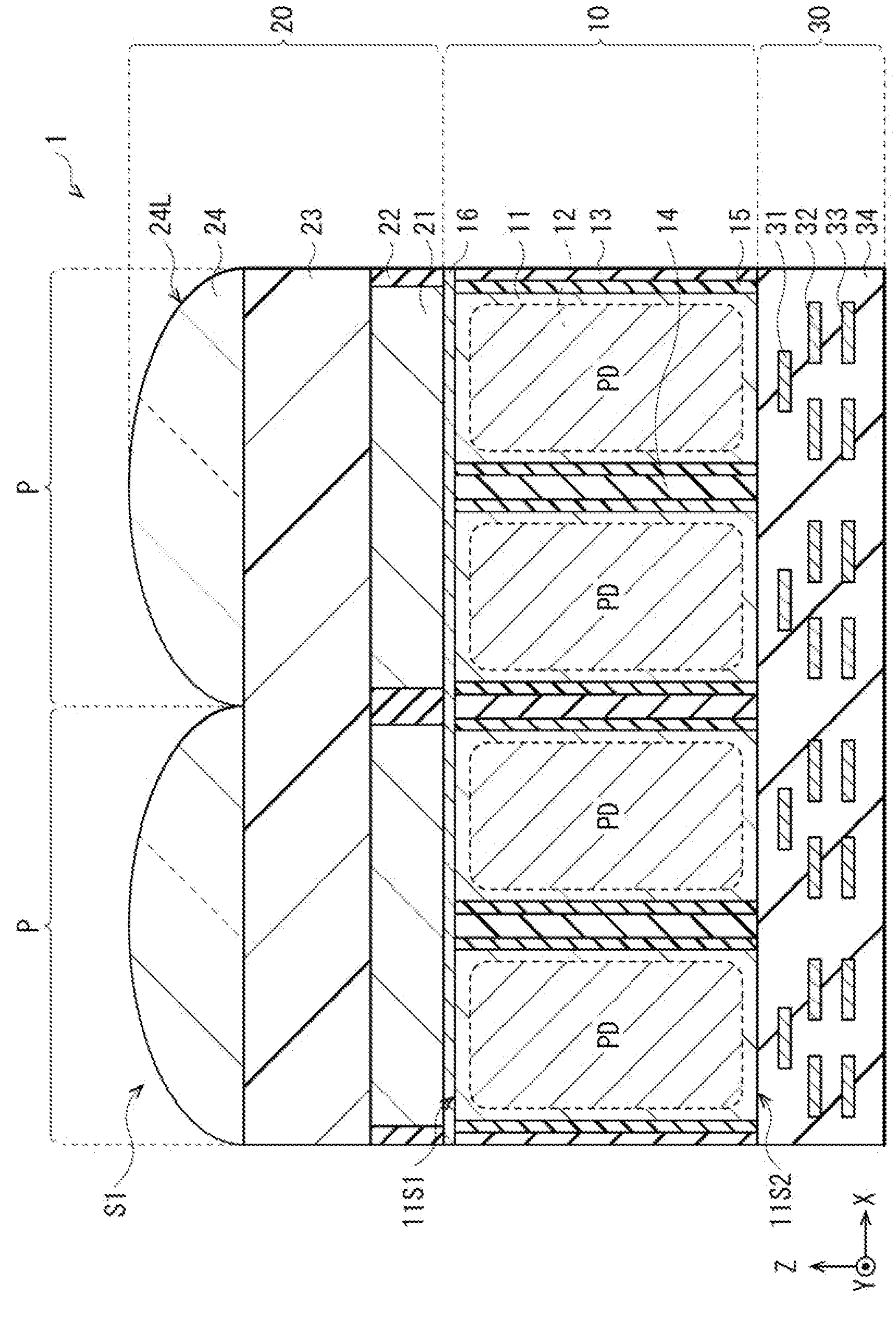
FIG. 1 is a schematic cross-sectional view of an example of a configuration of an imaging device according to an embodiment of the present disclosure.

In the following, description is given in detail of embodiments of the present disclosure with reference to the drawings. The following description is merely a specific example of the present disclosure, and the present disclosure should not be limited to the following aspects. Moreover, the present disclosure is not limited to arrangements, dimensions, dimensional ratios, and the like of each component illustrated in the drawings. It is to be noted that the description is given in the following order.

1. Embodiment (An example of an imaging device including an inter-pixel separation section and in-pixel separation section having respective refractive indexes different from each other)
2. Modification Examples
    - 2-1. Modification Example 1 (Another example of a configuration of the inter-pixel separation section and the in-pixel separation section)
    - 2-2. Modification Example 2 (Another example of a configuration of the in-pixel separation section)
    - 2-3. Modification Example 3 (Another example of the configuration of the inter-pixel separation section and the in-pixel separation section)
    - 2-4. Modification Example 4 (Another example of the configuration of the inter-pixel separation section and the in-pixel separation section)
    - 2-5. Modification Example 5 (Another example of the configuration of the inter-pixel separation section and the in-pixel separation section)
    - 2-6. Modification Example 6 (Another example of the configuration of the inter-pixel separation section and the in-pixel separation section)
    - 2-7. Modification Example 7 (Another example of the configuration of the inter-pixel separation section and the in-pixel separation section)
    - 2-8. Modification Example 8 (Another example of the configuration of the inter-pixel separation section and the in-pixel separation section)
    - 2-9. Modification Example 9 (Another example of a method of manufacturing the inter-pixel separation section and the in-pixel separation section)
    - 2-10. Modification Example 10 (Another example of the configuration of the in-pixel separation section)
    - 2-11. Modification Example 11 (Another example of the configuration of the in-pixel separation section)
    - 2-12. Modification Example 12 (Another example of the configuration of the inter-pixel separation section and the in-pixel separation section)
    - 2-13. Modification Example 13 (An example of applying a voltage to each of the inter-pixel separation section and the in-pixel separation section)
    - 2-14. Modification Example 14 (Another example of a layout of unit pixels and on-chip lenses)
    - 2-15. Modification Example 15 (Another example of the configuration of the inter-pixel separation section and the in-pixel separation section)
3. Application Examples
4. Practical Application Examples

1. EMBODIMENT

Figure 2:
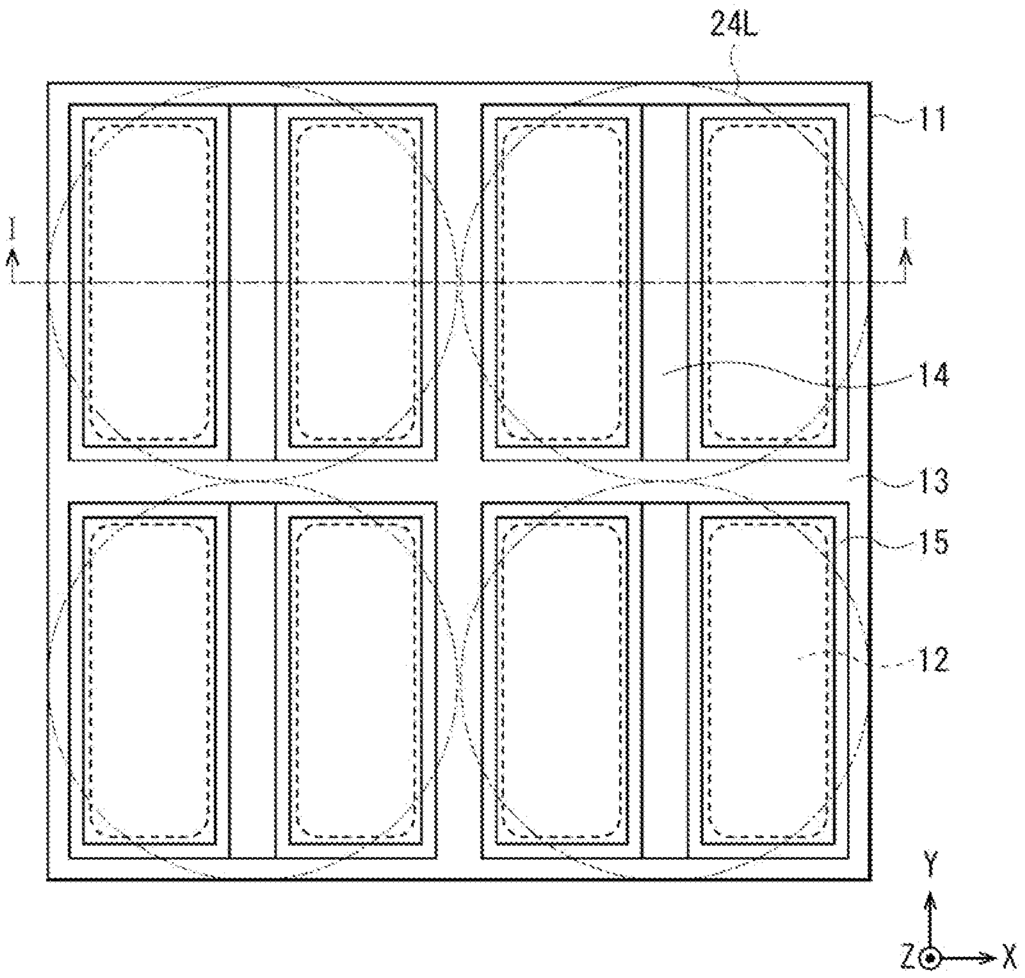
FIG. 2 is a plan schematic view of the example of the configuration of the imaging device illustrated in FIG. 1.
Figure 3:
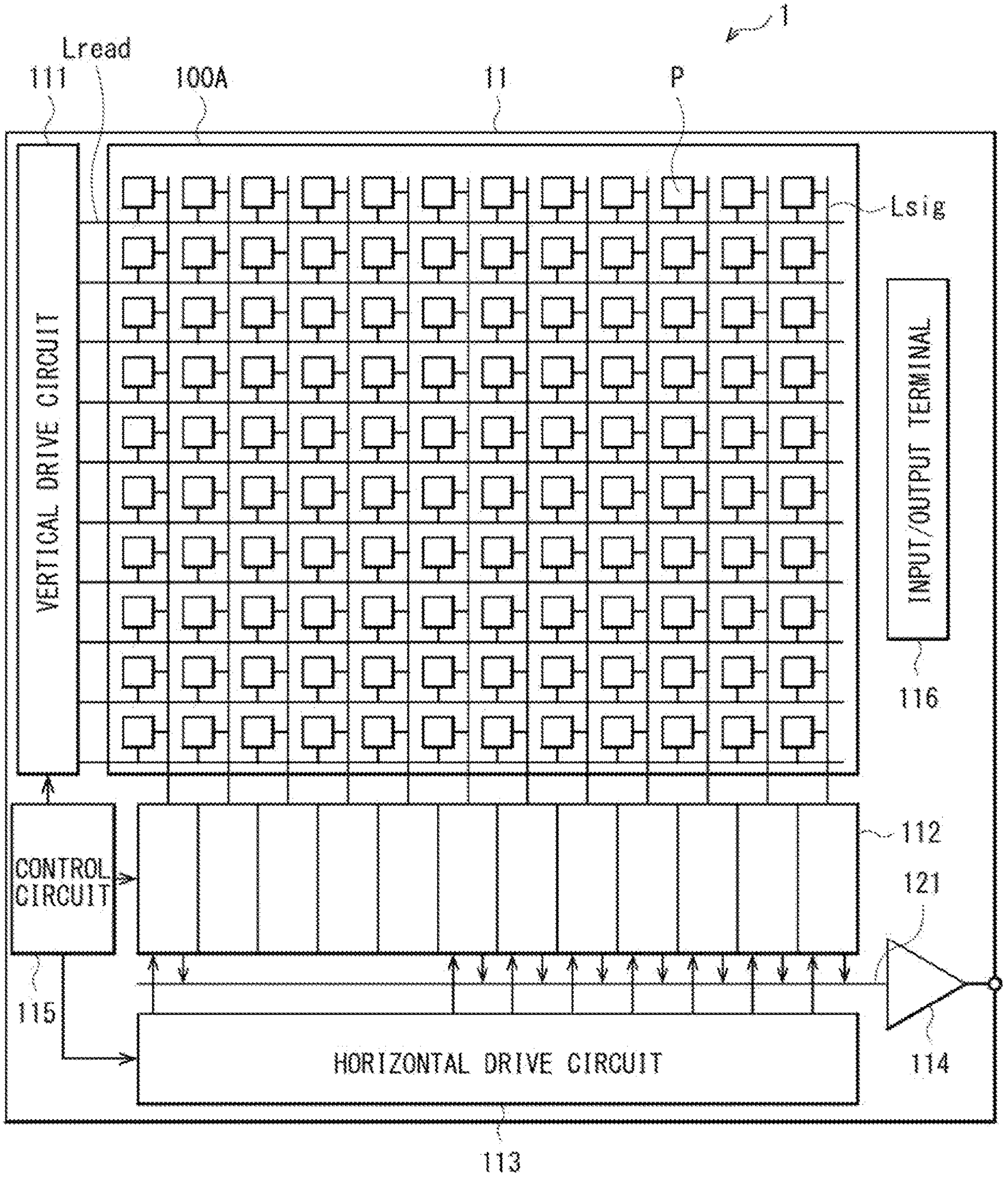
FIG. 3 is a block diagram illustrating an overall configuration of the imaging device illustrated in FIG. 1.

FIG. 1 schematically illustrates an example of a cross-sectional configuration of an imaging device (an imaging device 1) according to an embodiment of the present disclosure. FIG. 2 schematically illustrates an example of a plane configuration of the imaging device 1 illustrated in FIG. 1, and FIG. 1 illustrates a cross section taken along a line I-I in FIG. 2. FIG. 3 illustrates an example of an overall configuration of the imaging device 1 illustrated in FIG. 1. The imaging device 1 is, for example, a CMOS (Complementary Metal Oxide Semiconductor) image sensor or the like to be used for an electronic apparatus such as a digital still camera or a video camera, and includes, as an imaging area, a pixel section (a pixel section 100A) in which a plurality of pixels is two-dimensionally arranged in a matrix. The imaging device 1 is, for example, a so-called back-illuminated imaging device in the CMOS image sensor or the like.

The imaging device 1 of the present embodiment includes a pixel (a unit pixel P) that is able to acquire imaging information and parallax information simultaneously. According to the imaging device 1 of the present embodiment, in the pixel section 100A in which a plurality of unit pixels P each including a plurality of photoelectric conversion sections 12 is arranged in a matrix, an inter-pixel separation section 13 is provided between the pixels adjacent to each other and an in-pixel separation section 14 is provided between the photoelectric conversion sections 12 adjacent to each other inside each of the unit pixels P. The inter-pixel separation section 13 and the in-pixel separation section 14 have respective refractive indexes different from each other.

[Schematic Configuration of Imaging Device]

The imaging device 1 takes in incident light (image light) from a subject via an optical lens system (unillustrated), converts an amount of incident light formed as an image on an imaging surface into electric signals on a pixel-by-pixel basis, and outputs the electric signals as pixel signals. The imaging device 1 includes, on a semiconductor substrate 11, the pixel section 100A as an imaging area, and also includes, in a peripheral region of the pixel section 100A, for example, a vertical drive circuit 111, a column signal processing circuit 112, a horizontal drive circuit 113, an output circuit 114, a control circuit 115, and an input/output terminal 116.

In the pixel section 100A, for example, the plurality of unit pixels P is two-dimensionally arranged in a matrix. Each of the plurality of unit pixels P also serves as an imaging pixel and an image plane phase difference pixel. The imaging pixel photoelectrically converts a subject image formed by an imaging lens at a photodiode PD to generate signals for image generation. The image plane phase difference pixel divides a pupil region of the imaging lens, and photoelectrically converts a subject image from the divided pupil region to generate signals for phase difference detection.

The unit pixels P are provided, for example, with a pixel drive line Lread (specifically, a row selection line and a reset control line) for each of pixel rows, and provided with a vertical signal line Lsig for each of pixel columns. The pixel drive line Lread transmits drive signals for reading signals from the pixels. One end of the pixel drive line Lread is coupled to an output end of the vertical drive circuit 111 corresponding to each of the rows.

The vertical drive circuit 111 is a pixel drive section that is configured by a shift register, an address decoder, and the like, and drives the unit pixels P of the pixel section 100A on a row-by-row basis, for example. Signals outputted from the respective unit pixels P in the pixel rows selectively scanned by the vertical drive circuit 111 are supplied to the column signal processing circuit 112 through the respective vertical signal lines Lsig. The column signal processing circuit 112 is configured by an amplifier, a horizontal selection switch, and the like provided for each of the vertical signal lines Lsig.

The horizontal drive circuit 113 is configured by a shift register, an address decoder, and the like. The horizontal drive circuit 113 drives horizontal selection switches of the column signal processing circuit 112 in order while scanning the horizontal selection switches. The selective scanning by this horizontal drive circuit 113 causes signals of the respective pixels transmitted through the respective vertical signal lines Lsig to be outputted to a horizontal signal line 121 in order, and causes the signals to be transmitted to the outside of the semiconductor substrate 11 through the horizontal signal line 121.

The output circuit 114 performs signal processing on signals sequentially supplied from the respective column signal processing circuits 112 via the horizontal signal line 121, and outputs the signals. The output circuit 114 performs, for example, only buffering in some cases, and performs black level adjustment, column variation correction, various kinds of digital signal processing, and the like in other cases.

A circuit portion including the vertical drive circuit 111, the column signal processing circuit 112, the horizontal drive circuit 113, the horizontal signal line 121, and the output circuit 114 may be formed directly on the semiconductor substrate 11, or may be provided on an external control IC. In addition, the circuit portion may be formed on another substrate coupled by a cable or the like.

The control circuit 115 receives a clock supplied from the outside of the semiconductor substrate 11, data for an instruction about an operation mode, and the like, and also outputs data such as internal information on the imaging device 1. The control circuit 115 further includes a timing generator that generates a variety of timing signals, and controls driving of peripheral circuits including the vertical drive circuit 111, the column signal processing circuit 112, the horizontal drive circuit 113, and the like on the basis of the variety of timing signals generated by the timing generator.

The input/output terminal 116 exchanges signals with the outside.

[Circuit Configuration of Unit Pixel]

Figure 4:
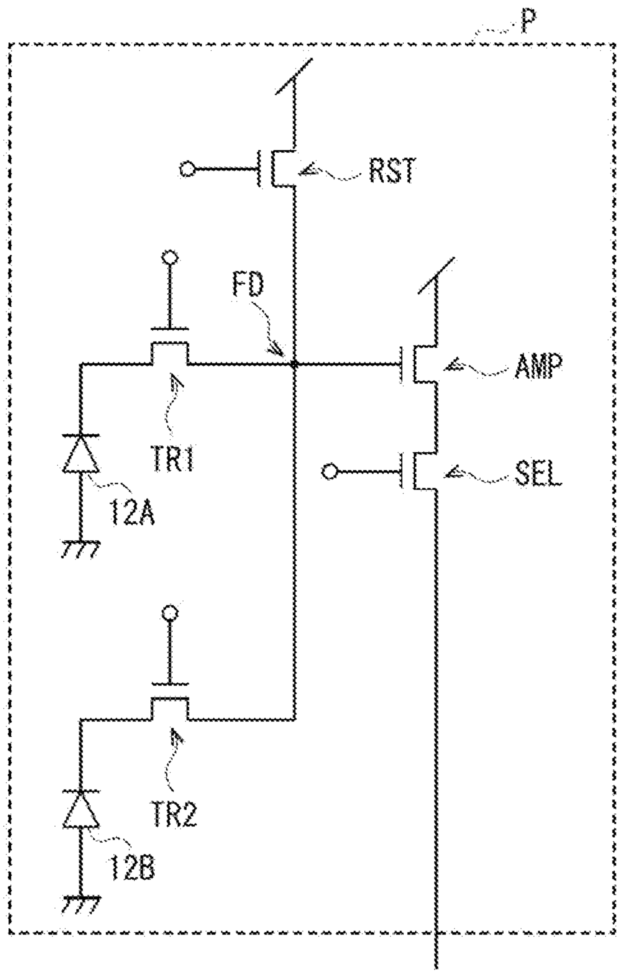
FIG. 4 is an equivalent circuit diagram of a unit pixel illustrated in FIG. 1.

FIG. 4 illustrates an example of a readout circuit of the unit pixel P of the imaging device 1 illustrated in FIG. 3. As illustrated in FIG. 4, the unit pixel P includes, for example, two photoelectric conversion sections 12A and 12B, transfer transistors TR1 and TR2, a floating diffusion FD, a reset transistor RST, an amplification transistor AMP, and a selection transistor SEL.

The photoelectric conversion sections 12A and 12B are each a photodiode (PD). In the photoelectric conversion section 12A, an anode is coupled to a ground voltage line, and a cathode is coupled to a source of the transfer transistor TR1. In the photoelectric conversion section 12B, similarly to the photoelectric conversion section 12A, an anode is coupled to the ground voltage line, and a cathode is coupled to a source of the transfer transistor TR2.

The transfer transistor TR1 is coupled between the photoelectric conversion section 12A and the floating diffusion FD. The transfer transistor TR2 is coupled between the photoelectric conversion section 12B and the floating diffusion FD. A drive signal TRsig is applied to each of gate electrodes of the transfer transistors TR1 and TR2. When the drive signal TRsig is brought into an active state, each of transfer gates of the transfer transistors TR1 and TR2 is brought into an electrically-conductive state, and signal charge accumulated in each of the photoelectric conversion sections 12A and 12B is transferred to the floating diffusion FD via the transfer transistors TR1 and TR2.

The floating diffusion FD is coupled between each of the transfer transistors TR1 and TR2 and the amplification transistor AMP. The floating diffusion FD subjects the signal charge transferred by the transfer transistors TR1 and TR2 to charge-voltage conversion into a voltage signal to output the converted voltage signal to the amplification transistor AMP.

The reset transistor RST is coupled between the floating diffusion FD and a power supply section. A drive signal RSTsig is applied to a gate electrode of the reset transistor RST. When the drive signal RSTsig is brought into an active state, a reset gate of the reset transistor RST is brought into an electrically-conductive state, and a potential of the floating diffusion FD is reset to a level of the power supply section.

The amplification transistor AMP, in which a gate electrode thereof is coupled to the floating diffusion FD and a drain electrode is coupled to the power supply section, serves as an input part of a readout circuit of the voltage signal held by the floating diffusion FD or a so-called source follower circuit. That is, a source electrode of the amplification transistor AMP is coupled to the vertical signal line Lsig via the selection transistor SEL to thereby configure the source follower circuit with a constant current source coupled to one end of the vertical signal line Lsig.

The selection transistor SEL is coupled between the source electrode of the amplification transistor AMP and the vertical signal line Lsig. A drive signal SELsig is applied to a gate electrode of the selection transistor SEL. When the drive signal SELsig is brought into an active state, the selection transistor SEL is brought into an electrically-conductive state, and the unit pixel P is brought into a selected state. This allows a readout signal (pixel signal) outputted from the amplification transistor AMP to be outputted to the vertical signal line Lsig via the selection transistor SEL.

In the unit pixel P, for example, the signal charge generated in the photoelectric conversion section 12A and the signal charge generated in the photoelectric conversion section 12B are read. The respective signal charges read from the photoelectric conversion section 12A and the photoelectric conversion section 12B are outputted to a phase difference calculation block of an external signal processing section, for example, to thereby acquire a signal for phase difference autofocus. In addition, the respective signal charges read from the photoelectric conversion section 12A and the photoelectric conversion section 12B are added together in the floating diffusion FD, and outputted to an imaging block of the external signal processing section, for example, to thereby acquire a pixel signal based on the total electric charge of the photoelectric conversion section 12A and the photoelectric conversion section 12B.

[Configuration of Unit Pixel]

As described above, the imaging device 1 is, for example, a back-illuminated imaging device. The multiple unit pixels P, which are two-dimensionally arranged in the pixel section 100A, each have a configuration in which, for example, a light-receiving section 10, a light-condensing section 20, and a multilayer wiring layer 30 are stacked. The light-condensing section 20 is provided on a light incident side S1 of the light-receiving section 10. The multilayer wiring layer 30 is provided on a side opposite to the light incident side S1 of the light-receiving section 10.

The light-receiving section 10 includes the semiconductor substrate 11 having a first surface 11S1 and a second surface 11S2 opposed to each other, and a plurality of photoelectric conversion sections 12 embedded and formed in the semiconductor substrate 11. The semiconductor substrate 11 is configured by, for example, a silicon substrate. The photoelectric conversion section 12 is, for example, a PIN (Positive Intrinsic Negative)-type photodiode (PD), and has a p-n junction at a predetermined region of the semiconductor substrate 11. As for the photoelectric conversion section 12, as described above, the multiple (e.g., two) photoelectric conversion sections 12A and 12B are embedded and formed for each of the unit pixels P.

The light-receiving section 10 further includes the inter-pixel separation section 13 and the in-pixel separation section 14.

The inter-pixel separation section 13 is provided between unit pixels P adjacent to each other. In other words, the inter-pixel separation section 13 is provided around the unit pixel P, and is provided in a lattice pattern as illustrated in FIG. 2 for example, in the pixel section 100A. The inter-pixel separation section 13 serves to electrically and optically separate the adjacent unit pixels P from each other. The inter-pixel separation section 13 extends from a side of the first surface 11S1 of the semiconductor substrate 11 toward a side of the second surface 11S2 thereof, for example, and penetrates between the first surface 11S1 of the semiconductor substrate 11 and the second surface 11S2 thereof, for example.

The inter-pixel separation section 13 has, for example, a refractive index lower than a refractive index of the semiconductor substrate 11. Examples of a material included in the inter-pixel separation section 13 include a low-refractive-index material such as silicon oxide ($SiO_x$; 1.3 to 1.5). In addition, the inter-pixel separation section 13 may be constituted by a gap. Note that the above-described material is merely exemplary, and is not limited thereto. Further, the inter-pixel separation section 13 including the low-refractive-index material may be covered with, for example, a thin high-refractive-index film such as a barrier film 17 to be described later, which is higher in refractive index than the low-refractive-index material. Alternatively, the inter-pixel separation section 13 may have a multi-layer structure including, for example, a film of a high-refractive-index material therein, as long as it is possible to regard the inter-pixel separation section 13 as a substantially low-refractive-index member.

The in-pixel separation section 14 is provided between the photoelectric conversion section 12A and the photoelectric conversion section 12B, which are adjacent to each other, inside the unit pixel P. The in-pixel separation section 14 serves to electrically separate from each other the photoelectric conversion section 12A and the photoelectric conversion section 12B that are adjacent to each other. As with the inter-pixel separation section 13, the in-pixel separation section 14 extends from the side of the first surface 11S1 of the semiconductor substrate 11 toward the side of the second surface 11S2 thereof, and penetrates between the first surface 11S1 of the semiconductor substrate 11 and the second surface 11S2 thereof, for example.

The in-pixel separation section 14 has, for example, a refractive index substantially equal to the refractive index of the semiconductor substrate 11 or higher than the refractive index of the inter-pixel separation section 13. Examples of a material included in the in-pixel separation section 14 include tantalum oxide ($TaO_x$; 2.2), diamond (2.4), titanium oxide ($TiO_x$; 2.4), zirconium oxide ($ZrO_x$; 2.2), hafnium oxide ($HfO_x$; 1.9), cerium oxide ($CeO_x$; 2.2), iron oxide ($FeO_x$; 2.9), aluminum oxide ($AlO_x$; 1.63), silicon nitride (SiN; 1.9), and niobium oxide ($NbO_x$; 2.5). Numerical values in parentheses indicate the respective refractive indexes. In addition, the in-pixel separation section 14 may include non-doped polysilicon (Poly-Si) or amorphous silicon. It is to be noted that the above-described materials are merely exemplary, and is not limited thereto.

Further, as with the inter-pixel separation section 13, the in-pixel separation section 14 may be covered with the barrier film 17 to be described later. Alternatively, the in-pixel separation section 14 may have a multi-layered structure including, for example, a film of a low-refractive-index material therein, as long as it is possible to regard the in-pixel separation section 14 as a member having a refractive index substantially equal to the refractive index of the semiconductor substrate 11 or higher than the refractive index of the inter-pixel separation section 13.

An insulating film 15, for example, is provided around the inter-pixel separation section 13 and the in-pixel separation section 14. Examples of the insulating film 15 include a silicon oxide ($SiO_x$) film.

A fixed charge layer 16 which also serves as an anti-reflection at the first surface 11S1 of the semiconductor substrate 11 is further provided on the first surface 11S1 of the semiconductor substrate 11. The fixed charge layer 16 may be a film having positive fixed charge or a film having negative fixed charge. Examples of a material included in the fixed charge layer 16 include a semiconductor material and a conductive material each having a bandgap wider than a bandgap of the semiconductor substrate 11. Specific examples thereof include hafnium oxide ($HfO_x$), aluminum oxide ($AlO_x$), zirconium oxide ($ZrO_x$), tantalum oxide ($TaO_x$), titanium oxide ($TiO_x$), lanthanum oxide ($LaO_x$), praseodymium oxide ($PrO_x$), cerium oxide ($CeO_x$), neodymium oxide ($NdO_x$), promethium oxide ($PmO_x$), samarium oxide ($SmO_x$), europium oxide ($EuO_x$), gadolinium oxide ($GdO_x$), terbium oxide ($TbO_x$), dysprosium oxide ($DyO_x$), holmium oxide ($HoO_x$), thulium oxide ($TmO_x$), ytterbium oxide ($YbO_x$), lutetium oxide ($LuO_x$), yttrium oxide ($YO_x$), hafnium nitride ($HfN_x$), aluminum nitride ($AlN_x$), hafnium oxynitride ($HfO_xN_y$), and aluminum oxynitride ($AlO_xN_y$). The fixed charge layer 16 may be a single-layer film, or a stacked film including different materials.

The light-condensing section 20 is provided on the light incident side S1 of the light-receiving section 10. The light-condensing section 20 includes, for example, a color filter 21, a light-shielding section 22, a planarization layer 23, and a lens layer 24 for each unit pixel P. The color filter 21, the light-shielding section 22, the planarization layer 23, and the lens layer 24 are stacked in this order from a side of the light-receiving section 10. The color filter 21 selectively transmits, for example, red light (R), green light (G), or blue light (B). The light-shielding section 22 is provided between the unit pixels P of the color filters 21.

Figure 8:
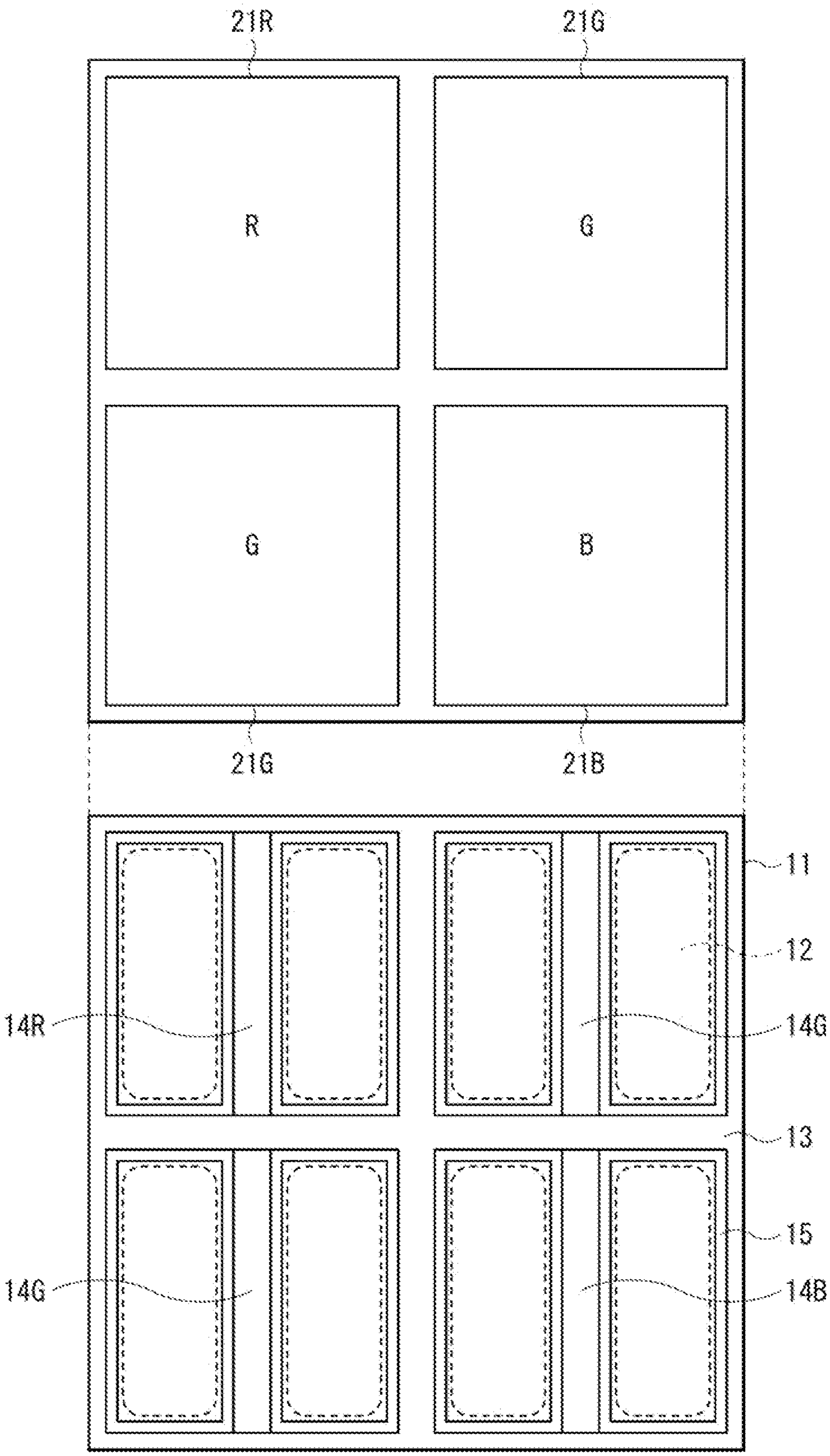
FIG. 8 is a plan schematic view for describing a configuration of an imaging device according to Modification Example 2 of the present disclosure.

Regarding the color filter 21, for example, for four unit pixels P disposed in 2 rows×2 columns, two color filters 21G that selectively transmit the green light (G) are disposed on a diagonal line, and color filters 21R and 21B that selectively transmit the red light (R) and the blue light (B), respectively, are each disposed on the perpendicular diagonal line (see, for example, FIG. 8). In each of the unit pixels P provided with corresponding one of the color filters 21R, 21G, and 21B, for example, the corresponding color light is detected in each photoelectric conversion section 12. That is, in the pixel section 100A, the unit pixels P that detects the red light (R), the unit pixels P that detects the green light (G), and the unit pixels P that detects the blue light (B) are arranged in a Bayer pattern.

The light-shielding section 22 is provided in order to prevent leakage of light obliquely entered in the color filter 21 into the neighboring unit pixel P, and is provided between the unit pixels P of the color filters 21, as described above. In other words, the light-shielding section 22 is provided in a lattice pattern in the pixel section 100A. Examples of a material included in the light-shielding section 22 include a conductive material having a light-shielding property. Specific examples thereof include tungsten (W), silver (Ag), copper (Cu), aluminum (Al), and an alloy of Al and copper (Cu).

The planarization layer 23 serves to planarize a surface of the light incident side S1 including the color filter 21 and the light-shielding section 22. The planarization layer 23 includes, for example, silicon oxide ($SiO_x$), silicon nitride ($SiN_x$), silicon oxynitride ($SiO_xN_y$), or the like.

The lens layer 24 is provided, for example, to cover the entire surface of the pixel section 100A, and includes, on a surface thereof, a plurality of on-chip lenses 24L provided in a gapless manner, for example. The on-chip lens 24L serves to condense incident light from above to the photoelectric conversion section 12, and is provided, for example, for each unit pixel P, as illustrated in FIG. 2. That is, the on-chip lens 24L is provided across the plurality of photoelectric conversion sections 12 inside the unit pixel P. Further, in a plan view, the inter-pixel separation section 13 and a border the plurality of on-chip lenses 24L substantially coincide with each other. The lens layer 24 includes, for example, an inorganic material such as silicon oxide ($SiO_x$) or silicon nitride ($SiN_x$), for example. In addition thereto, the lens layer 24 may include an organic material having a high refractive index such as an episulfide-based resin and a thietane compound or a resin thereof. The shape of the on-chip lens 24L is not particularly limited, and various lens shapes such as a hemispherical shape and a semi-cylindrical shape are adoptable.

The multilayer wiring layer 30 is provided on a side opposite to the light incident side S1 of the light-receiving section 10, specifically, on the side of the second surface 11S2 of the semiconductor substrate 11. The multilayer wiring layer 30 has a configuration, for example, in which multiple wiring layers 31, 32, and 33 are stacked with an interlayer insulating layer 34 interposed therebetween. In addition to the readout circuit described above, the multilayer wiring layer 30 includes, for example, the vertical drive circuit 111, the column signal processing circuit 112, the horizontal drive circuit 113, the output circuit 114, the control circuit 115, the input/output terminal 116, and the like.

The wiring layers 31, 32, and 33 each include, for example, aluminum (Al), copper (Cu), tungsten (W), or the like. In addition thereto, the wiring layers 31, 32, and 33 may each include polysilicon (Poly-Si).

The interlayer insulating layer 34 is formed by, for example, a single-layer film including one of silicon oxide ($SiO_x$), TEOS, silicon nitride ($SiN_x$), silicon oxynitride ($SiO_xN_y$), or the like, or a stacked film including two or more thereof.

[Method of Manufacturing Inter-Pixel Separation Section and in-Pixel Separation Section]

The inter-pixel separation section 13 and the in-pixel separation section 14 according to the present embodiment may be formed, for example, as follows.

Figure 5A:
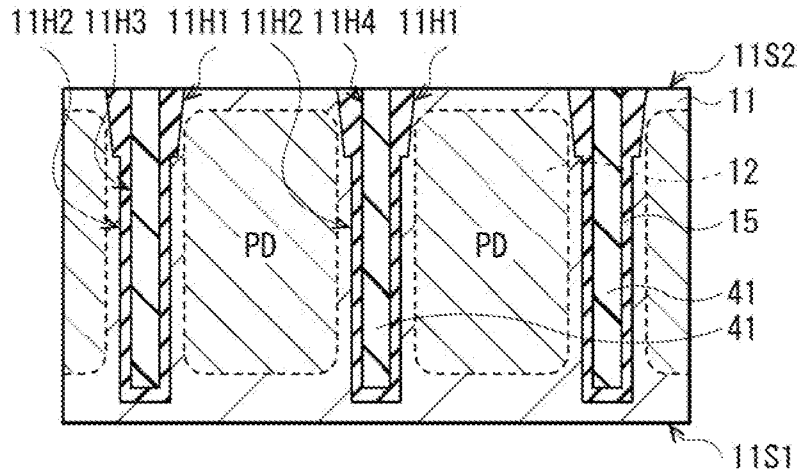
FIG. 5A is a schematic cross-sectional view for describing a method of manufacturing an inter-pixel separation section and an in-pixel separation section illustrated in FIG. 1.

First, a STI (Shallow Trench Isolation) and a FFTI (Full Trench Isolation) are each formed, for example, between two photoelectric conversion sections 12 provided between the unit pixels P and between two photoelectric conversion sections 12 provided inside the unit pixel P. Specifically, as illustrated in FIG. 5A, an opening 11H1 is formed as the STI from the side of the second surface 11S2 of the semiconductor substrate 11 and a $SiO_x$ film, for example, is embedded therein, following which an opening 11H2 is formed as the FFTI inside the STI and a $SiO_x$ film, for example, is similarly embedded therein. Thereafter, as illustrated in FIG. 5A, an opening 11H3 and an opening 11H4 are respectively formed inside the FFTI between the unit pixels P and inside the FFTI inside the unit pixel P, and polysilicon, for example, is embedded therein as the embedding material 41. Thereafter, for example, a p-well is formed inside the semiconductor substrate 11 by ion-implantation, and an n-type photoelectric conversion section 12 is formed in the p-well.

Figure 5B:
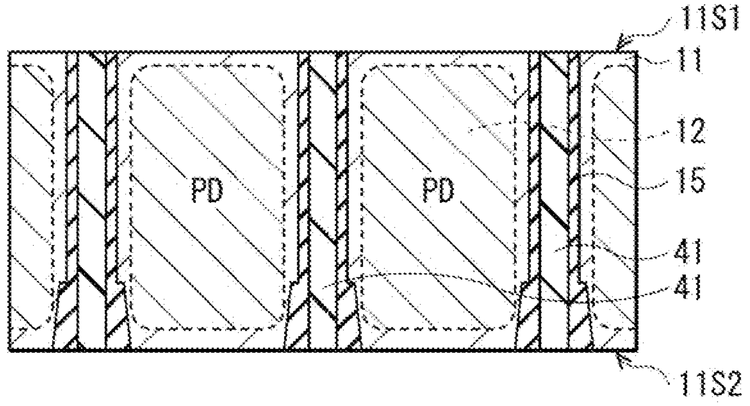
FIG. 5B is a schematic cross-sectional view of a step subsequent to FIG. 5A.
Figure 5C:
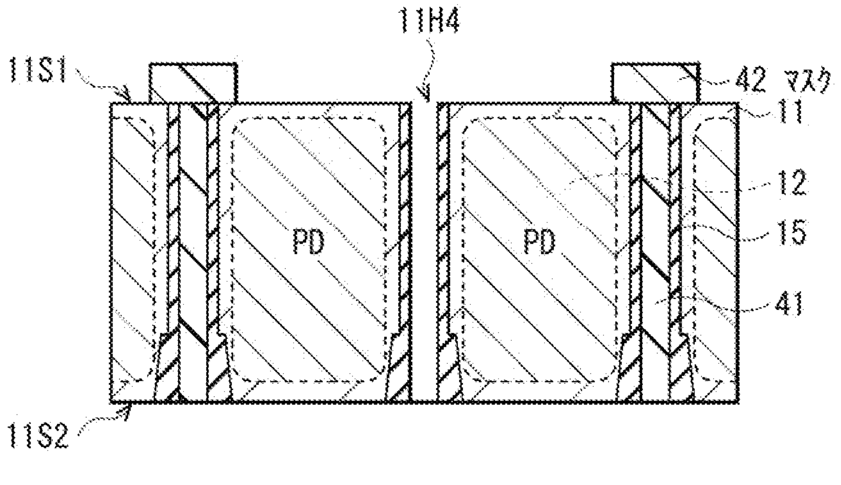
FIG. 5C is a schematic cross-sectional view of a step subsequent to FIG. 5B.

Thereafter, as illustrated in FIG. 5B, the semiconductor substrate 11 is inverted, and the first surface 11S1 of the semiconductor substrate 11 is ground by, for example, CMP (Chemical Mechanical Polishing) to expose the FFTI and the embedding material 41. Thereafter, as illustrated in FIG. 5C, a mask 42 is formed, for example, on the FFTI and the embedding material 41, in which the inter-pixel separation section 13 is to be formed, on the side of the first surface 11S1 of the semiconductor substrate 11. The embedding material 41 inside the opening 11H4 is removed by, for example, wet etching or dry etching. Specifically, remote plasma or chemical dry etching (CDE) makes it possible to remove the embedding material 41 without damaging the semiconductor substrate 11.

Figure 5D:
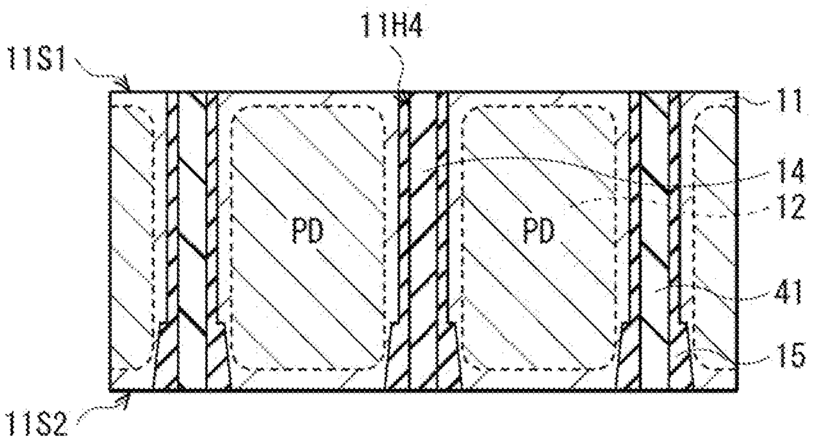
FIG. 5D is a schematic cross-sectional view of a step subsequent to FIG. 5C.
Figure 5E:
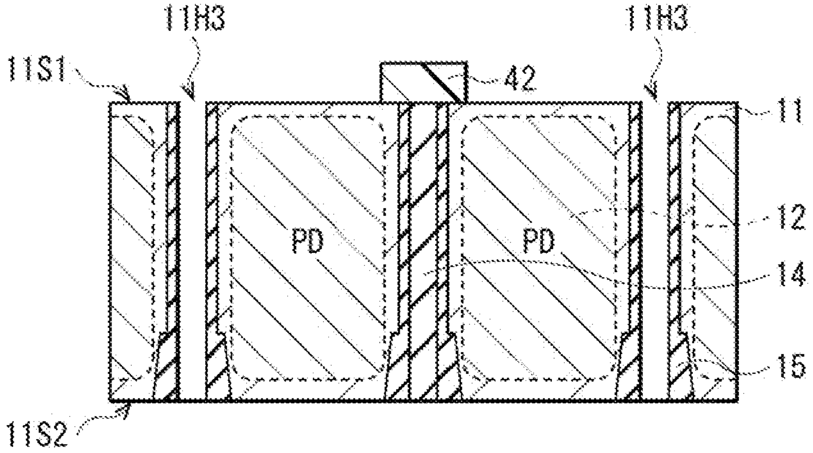
FIG. 5E is a schematic cross-sectional view of a step subsequent to FIG. 5D.
Figure 5F:
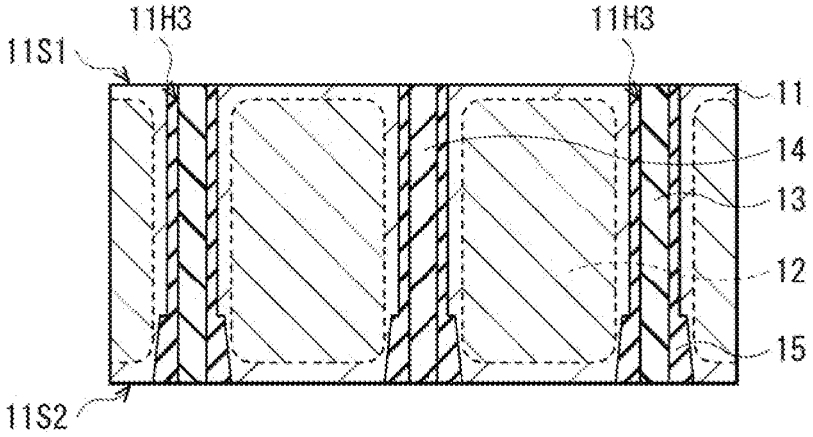
FIG. 5F is a schematic cross-sectional view of a step subsequent to FIG. 5E.

Thereafter, as illustrated in FIG. 5D, a tantalum oxide film, for example, is embedded in the opening 11H4, and the first surface 11S1 of the semiconductor substrate 11 is planarized by, for example, CMP. As a result, the in-pixel separation section 14 is formed. Thereafter, as illustrated in FIG. 5E, the mask 42 is formed on the in-pixel separation section 14, and the embedding material 41 inside the opening 11H3 is removed by, for example, wet etching or dry etching. Thereafter, as illustrated in FIG. 5F, a silicon oxide film, for example, is embedded in the opening 11H3, and the first surface 11S1 of the semiconductor substrate 11 is planarized by, for example, CMP. As a result, the inter-pixel separation section 13 is formed.

Figure 5G:
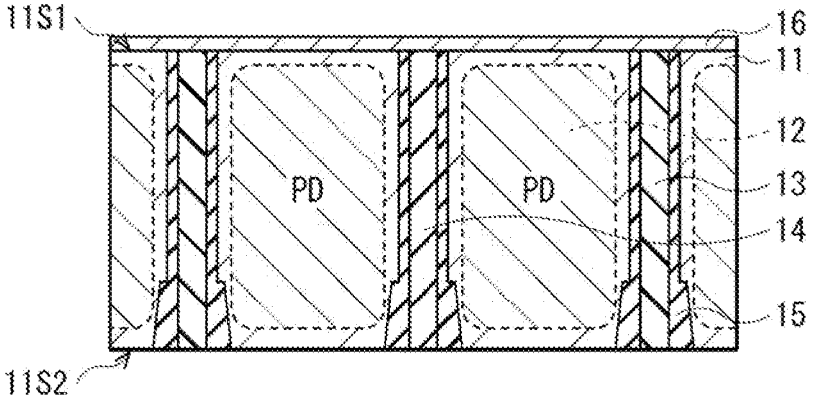
FIG. 5G is a schematic cross-sectional view of a step subsequent to FIG. 5F.
Figure 5H:
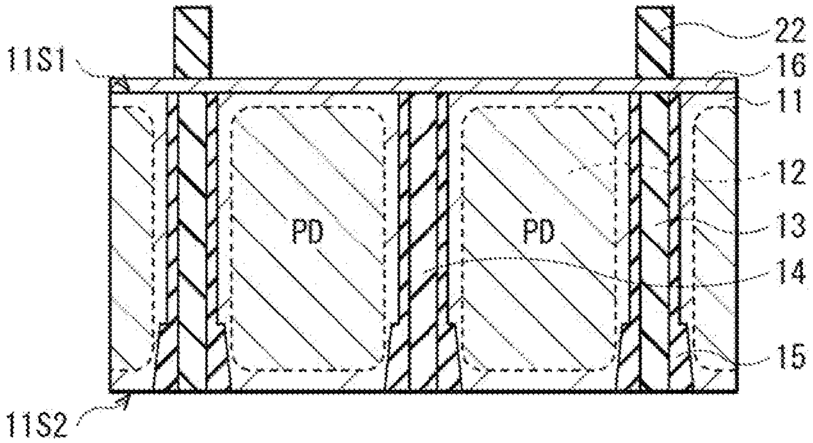
FIG. 5H is a schematic cross-sectional view of a step subsequent to FIG. 5G.
Figure 5I:
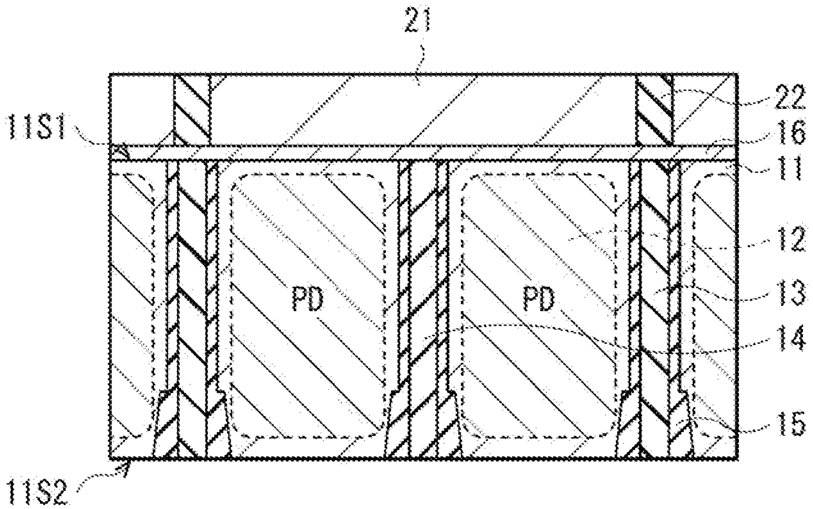
FIG. 5I is a schematic cross-sectional view of a step subsequent to FIG. 5H.

Thereafter, as illustrated in FIG. 5G, the fixed charge layer 16 is formed on the first surface 11S1 of the semiconductor substrate 11. Thereafter, as illustrated in FIG. 5H, the light-shielding section 22 is formed on the fixed charge layer 16, for example, in the lattice pattern. Thereafter, as illustrated in FIG. 5I, the color filter 21 is formed inside the lattice pattern of the light-shielding section 22. Thereafter, the planarization layer 23 is formed on the color filter 21 and the light-shielding section 22, and lastly, the lens layer 24 is bonded to the planarization layer 23. Thus, the imaging device 1 illustrated in FIG. 1 is completed.

[Workings and Effects]

In the imaging device 1 according to the present embodiment, the inter-pixel separation section 13 is provided between the adjacent unit pixels P of the semiconductor substrate 11, and the in-pixel separation section 14 is provided between the adjacent photoelectric conversion sections 12 inside the unit pixel P. The inter-pixel separation section 13 and the in-pixel separation section 14 have respective refractive indexes different from each other. Specifically, the inter-pixel separation section 13 includes a material having a refractive index whose difference with a refractive index of the semiconductor substrate 11 is larger than a difference between a refractive index of the in-pixel separation section 14 and the refractive index of the semiconductor substrate 11, and the in-pixel separation section 14 includes a material having a refractive index substantially equal to the refractive index of the semiconductor substrate 11 or higher than the refractive index of the material included in the inter-pixel separation section 13. Thus, light entered in the unit pixels P, in other words, light entered in the inter-pixel separation section 13 and the in-pixel separation section 14 at a wide angle is totally reflected between adjacent unit pixels P, and is prevented from reflecting between adjacent photoelectric conversion sections inside the unit pixel P. This will be described below.

In recent years, an image sensor has become popular that has a focus detection function using a phase difference detection method. In such an image sensor, each pixel has a plurality of photodiodes. Sharing one on-chip lens with the plurality of photodiodes enables simultaneous acquisition of imaging information and parallax information.

As described above, in the image sensor in which one on-chip lens is shared by the plurality of photodiodes, a separation section is provided between adjacent pixels and a separation section is provided between adjacent photodiodes inside the pixel. The separation section provided between adjacent pixels and the separation section provided between adjacent photodiodes inside the pixel include the same material. Specifically, the separation sections each include a low-refractive-index material (for example, n=1 to 2.5) whose refractive index is lower than a refractive index of silicon (n=3 to 4). In the image sensor having such a configuration, in a case where light enters from a high-refractive-index silicon substrate in a low-refractive-index separation section at a wide angle, total reflection is likely to occur optically.

In contrast, in an inside of the pixel, it is desirable that the light that originally enters the photodiode that is disposed adjacently be transmitted without being reflected by the separation section between the photodiodes, and be photoelectrically converted in the photodiode that is disposed adjacently. However, in the image sensor having the above-described configuration, most of the light entered at a wide angle in the separation section between the photodiodes is totally reflected. Accordingly, an image plane phase difference characteristic can be deteriorated.

To address this, in the present embodiment, the inter-pixel separation section 13 provided between the adjacent unit pixels P includes the material having a refractive index lower than that of the semiconductor substrate 11, and the in-pixel separation section 14 provided between the adjacent photoelectric conversion sections 12 inside the unit pixel P includes the material having a refractive index substantially equal to that of the semiconductor substrate 11 or higher than that of the inter-pixel separation section 13. As a result, the total reflection of the light entered in the in-pixel separation section 14 at a wide angle is reduced.

As described above, it is possible, in the imaging device 1 of the present embodiment, to improve the transmittance of light in the in-pixel separation section 14 that electrically separates the adjacent photoelectric conversion sections 12 from each other inside the unit pixel P, and to photoelectrically convert the light condensed by the on-chip lens 24L by the original photoelectric conversion section 12. It is therefore possible to improve the optical characteristic. For example, it is possible to improve the image plane phase difference characteristic.

Next, description is given of Modification Examples 1 to 15 of the present disclosure. Hereinafter, components similar to those of the foregoing embodiment are denoted by the same reference numerals, and descriptions thereof are omitted as appropriate.

2. MODIFICATION EXAMPLES

2-1. Modification Example 1

Figure 6:
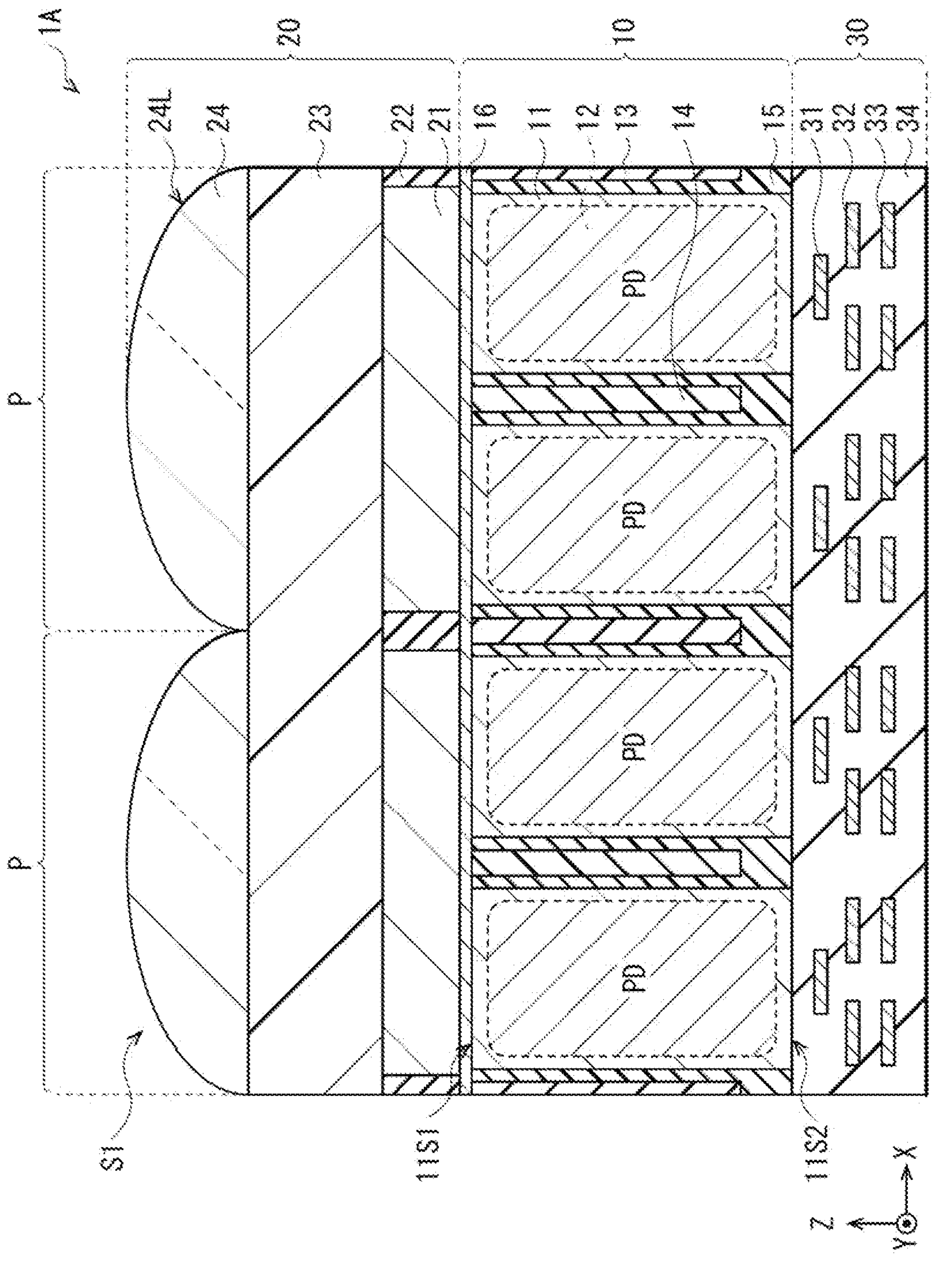
FIG. 6 is a schematic cross-sectional view of an example of a configuration of an imaging device according to Modification Example 1 of the present disclosure.

FIG. 6 schematically illustrates an example of a cross-sectional configuration of an imaging device (an imaging device 1A) according to Modification Example 1 of the present disclosure. The imaging device 1A is a CMOS image sensor or the like to be used, for example, in an electronic apparatus such as a digital still camera or a video camera. Similarly to the foregoing embodiment, the imaging device 1A is, for example, a so-called back-illuminated imaging device.

The foregoing embodiment indicates the example in which both the inter-pixel separation section 13 and the in-pixel separation section 14 penetrates between the first surface 11S1 of the semiconductor substrate 11 and the second surface 11S2 thereof; however, the present disclosure is not limited thereto. For example, as illustrated in FIG. 6, the inter-pixel separation section 13 and the in-pixel separation section 14 may each extend from the first surface 11S1 of the semiconductor substrate 11 toward the second surface 11S2 of the semiconductor substrate 11, and have a bottom formed inside the semiconductor substrate 11.

The inter-pixel separation section 13 and the in-pixel separation section 14 according to the present modification example may also be formed, for example, as follows.

Figure 7A:
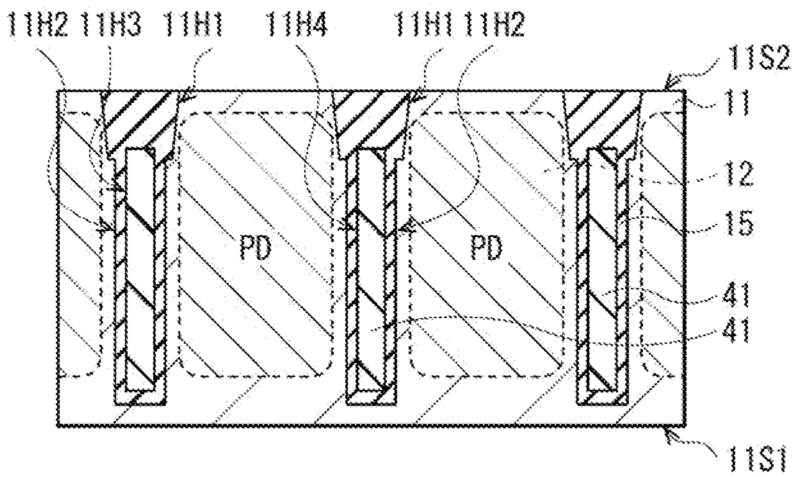
FIG. 7A is a schematic cross-sectional view for describing a method of manufacturing an inter-pixel separation section and an in-pixel separation section illustrated in FIG. 6.

First, similarly to the foregoing embodiment, the STI, the FFTI, and the photoelectric conversion section 12 are formed. Specifically, the opening 11H3 and the opening 11H4 are respectively formed inside the FFTI between the unit pixels P and inside the FFTI inside the unit pixel P, and polysilicon, for example, is embedded therein as the embedding material 41. Thereafter, as illustrated in FIG. 7A, the embedding material 41 is etched back to a predetermined depth, and a $SiO_x$ film is embedded therein. Thereafter, for example, a p-well is formed inside the semiconductor substrate 11 by ion-implantation, and an n-type photoelectric conversion section 12 is formed in the p-well.

Figure 7B:
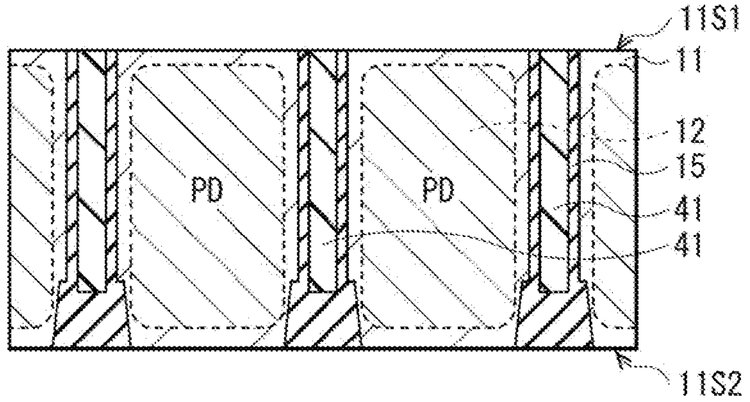
FIG. 7B is a schematic cross-sectional view of a step subsequent to FIG. 7A.

Thereafter, as illustrated in FIG. 7B, the semiconductor substrate 11 is inverted, and the first surface 11S1 of the semiconductor substrate 11 is ground by, for example, CMP, to expose the FFTI. Thereafter, similarly to the above-described embodiment, the inter-pixel separation section 13 and the in-pixel separation section 14 are formed separately, and further, the fixed charge layer 16, the color filter 21, the light-shielding section 22, the planarization layer 23, and the lens layer 24 are sequentially formed. Thus, the imaging device 1A illustrated in FIG. 6 is completed.

2-2. Modification Example 2

FIG. 8 schematically illustrates another example of the plane configuration of the imaging device 1 according to a modification example (Modification Example 2) of the above-described embodiment. Generally, color mixture is more likely to occur at longer wavelengths, and thus, the refractive index of the in-pixel separation section 14 may be changed depending on a wavelength of light to be photoelectrically converted in each unit pixel P, for example. In other words, the refractive index of the in-pixel separation section 14 may be changed depending on the color filter 21 provided in an upper portion of each unit pixel P (on the light incident side S1).

Specifically, the in-pixel separation section 14 preferably has a higher refractive index as the wavelength of the light to be photoelectrically converted in the plurality of photoelectric conversion sections 12 inside the unit pixel P becomes longer. For example, as illustrated in FIG. 8, in the case where, for four unit pixels P disposed in 2 rows×2 columns, the two color filters 21G that selectively transmit the green light (G) are disposed on a diagonal line, and the color filters 21R and 21B that selectively transmit the red light (R) and the blue light (B), respectively, are each disposed on the perpendicular diagonal line, the respective refractive indexes of the in-pixel separation sections 14R, 14G, and 14B formed in each unit pixel P may satisfy 14R>14G>14B.

Further, the in-pixel separation section 14R of the unit pixel P into which the red light (R) in which the color mixture is most likely to occur among R, G, and B enters may include a material having a refractive index higher than those of the other in-pixel separation sections 14G and 14B (14R>14G=14B). Alternatively, the in-pixel separation section 14B of the unit pixel P into which the blue light (B) in which the color mixture is least likely to occur among R, G, and B enters may include a material having a refractive index lower than those of the other in-pixel separation sections 14R and 14G (14R=14G>14B).

Further, only the inter-pixel separation section 13 of the unit pixel P into which the red light (R) enters may be include a material having a refractive index lower than those of the other inter-pixel separation sections 13.

As described above, it is possible to further improve the optical characteristic, in addition to the effects of the foregoing embodiment.

It is to be noted that, the present modification example indicates the example in which the red light (R), the green light (G), and the blue light (B) are photoelectrically converted in the four unit pixels P disposed in 2 rows×2 columns; however, the present disclosure is not limited thereto. For example, the four unit pixels P disposed in 2 rows×2 columns may be configured to photoelectrically convert Y (yellow)/M (magenta)/G (green)/C (cyan), or W (white) or an IR (infrared) may be configured to be photoelectrically converted.

2-3. Modification Example 3

Figure 9:
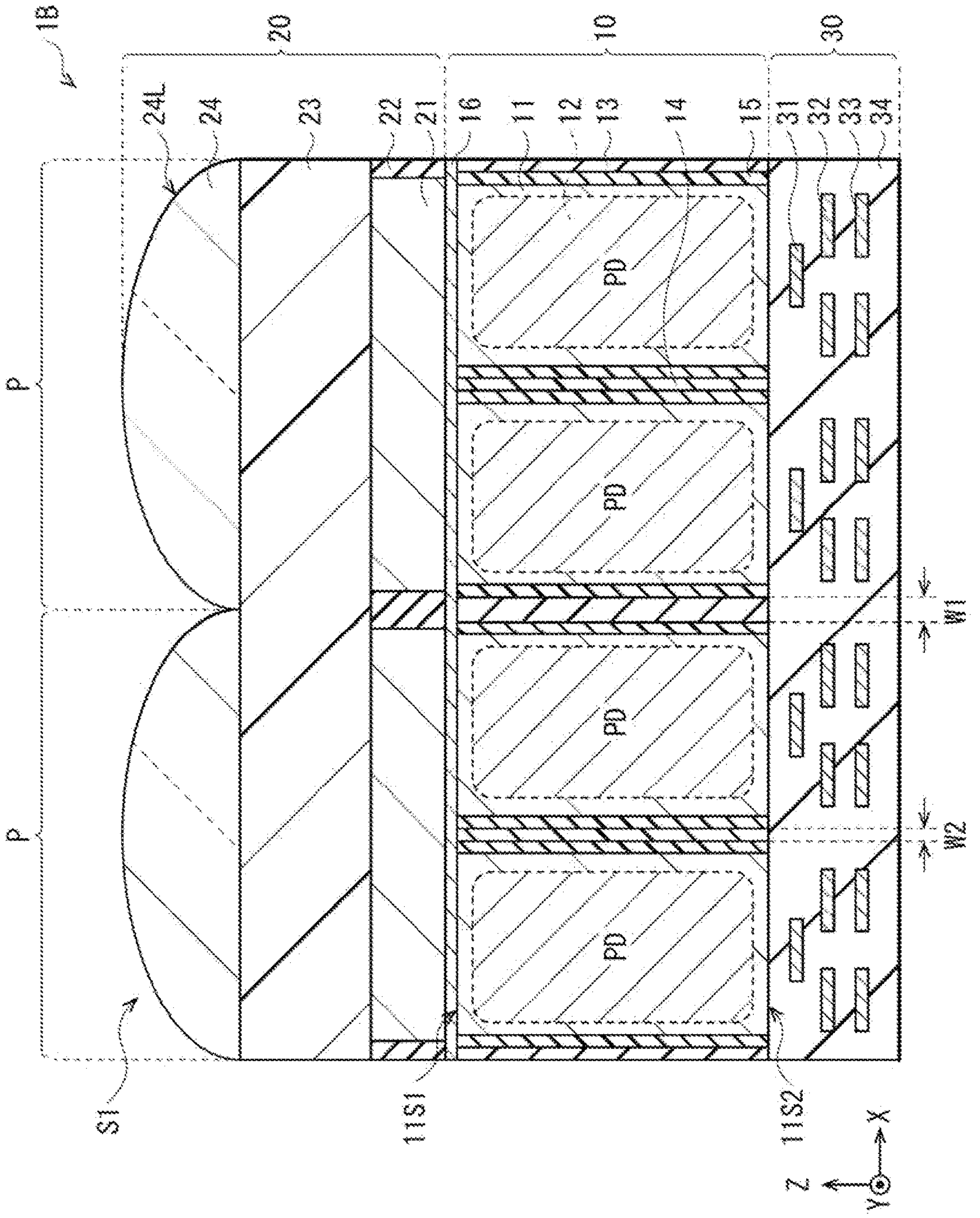
FIG. 9 is a schematic cross-sectional view of an example of a configuration of an imaging device according to Modification Example 3 of the present disclosure.

FIG. 9 schematically illustrates an example of a cross-sectional configuration of an imaging device (an imaging device 1B) according to Modification Example 3 of the present disclosure. The imaging device 1B is a CMOS image sensor or the like to be used, for example, in an electronic apparatus such as a digital still camera or a video camera. Similarly to the foregoing embodiment, the imaging device 1B is, for example, a so-called back-illuminated imaging device.

The foregoing embodiment indicates the example in which the inter-pixel separation section 13 and the in-pixel separation section 14 have their respective widths that are substantially equal to each other; however, as illustrated in FIG. 9, a width W2 of the in-pixel separation section 14 may be narrower than a width W1 of the inter-pixel separation section 13 (W1<W2), for example. Specifically, the width W1 of the inter-pixel separation section 13 is, for example, greater than or equal to 100 nm and less than or equal to 500 nm, and the width W2 of the in-pixel separation section 14 is, for example, greater than or equal to 1 nm and less than or equal to 100 nm, and more preferably greater than or equal to 1 nm and less than or equal to 50 nm.

As a result, when the thickness is reduced to the above-described thickness range, an optical film is in a film thickness range in which total reflection is unlikely to occur. The transmittance of light in the in-pixel separation section 14 is thus remarkably improved, and the light condensed by the on-chip lens 24L is photoelectrically converted by the original photoelectric conversion section 12. Further, a decrease in sensitivity or generation of scattered light caused by the light condensed by the on-chip lens 24L hitting the in-pixel separation section 14 is reduced. It is therefore possible to further improve the optical characteristic in addition to the effects of the foregoing embodiment.

It is to be noted that, in a case where the width W2 of the in-pixel separation section 14 is sufficiently reduced (for example, to less than or equal to 10 nm), the inter-pixel separation section 13 and the in-pixel separation section 14 may include respective materials having the same refractive index. Specifically, the inter-pixel separation section 13 and the in-pixel separation section 14 may each include, for example, silicon oxide ($SiO_x$) having a refractive index smaller than that of the semiconductor substrate 11, or may each be a gap. Further, the inter-pixel separation section 13 and the in-pixel separation section 14 may each be a combination of a silicon oxide film and the gap.

2-4. Modification Example 4

Figure 10:
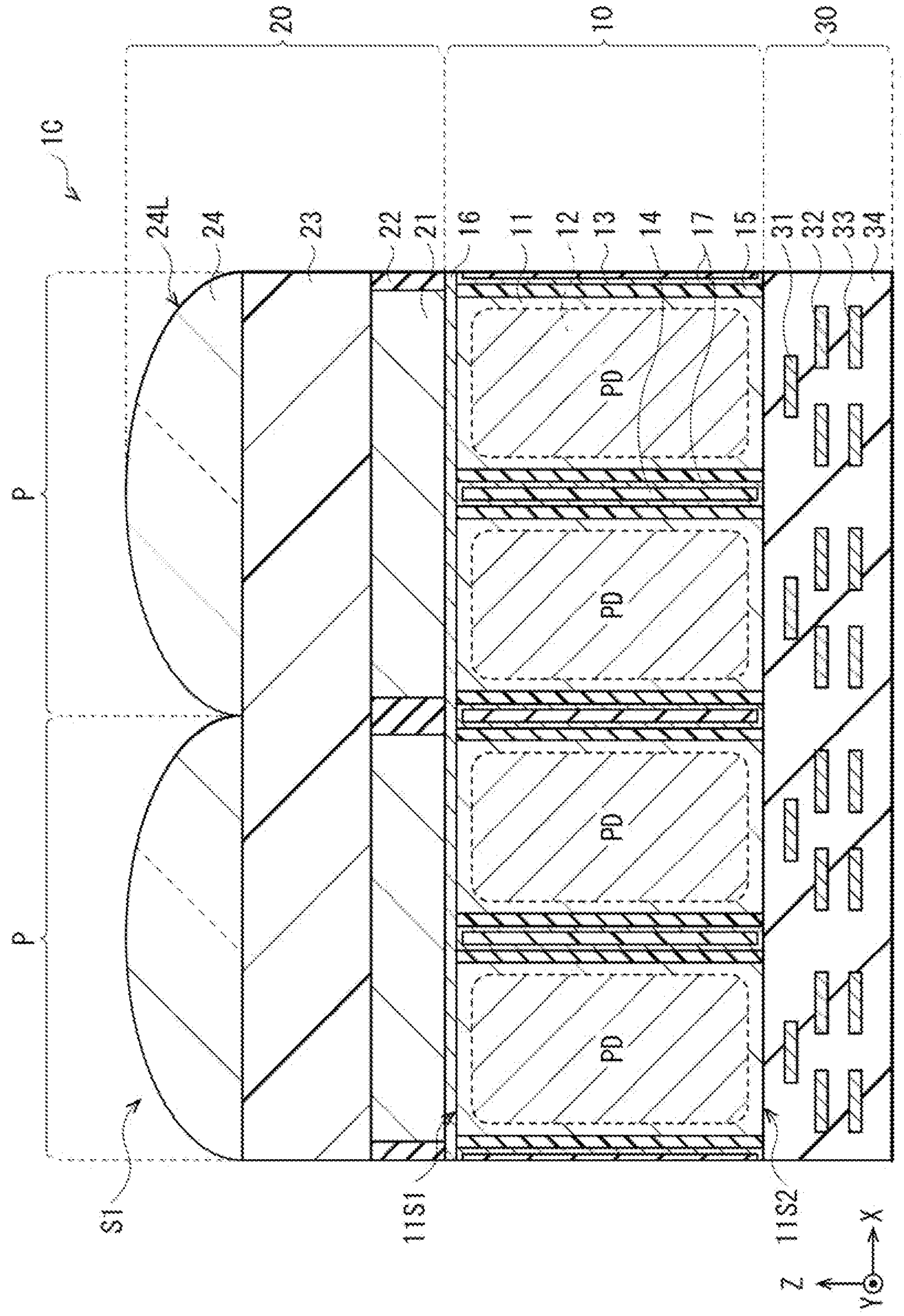
FIG. 10 is a schematic cross-sectional view of an example of a configuration of an imaging device according to Modification Example 4 of the present disclosure.

FIG. 10 schematically illustrates an example of a cross-sectional configuration of an imaging device (an imaging device 1C) according to Modification Example 4 of the present disclosure. The imaging device 1C is a CMOS image sensor or the like to be used, for example, in an electronic apparatus such as a digital still camera or a video camera. Similarly to the foregoing embodiment, the imaging device 1C is, for example, a so-called back-illuminated imaging device.

The barrier film 17 may further be formed around the inter-pixel separation section 13 and around the in-pixel separation section 14. The barrier film 17 may include, for example, aluminum oxide ($AlO_x$) or tantalum oxide ($TaO_x$).

The inter-pixel separation section 13 and the in-pixel separation section 14 according to the present modification example may be formed, for example, as follows.

Figure 11A:
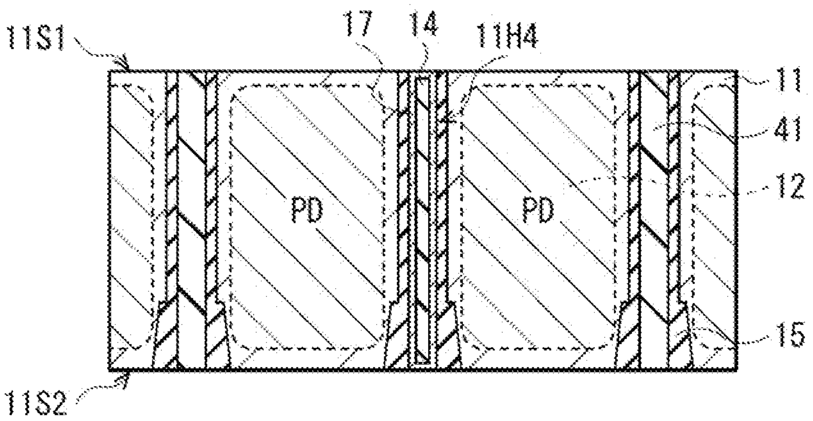
FIG. 11A is a schematic cross-sectional view for describing a method of manufacturing an inter-pixel separation section and an in-pixel separation section illustrated in FIG. 10.

First, similarly to the foregoing embodiment, the embedding material 41 inside the opening 11H4 is removed. Thereafter, as illustrated in FIG. 11A, an aluminum oxide film is formed as the barrier film 17 on a side surface and a bottom surface of the opening 11H4 by, for example, ALD (Atomic Layer Deposition). Thereafter, as illustrated in FIG. 11A, a tantalum oxide film, for example, is embedded in the opening 11H4, following which the aluminum oxide film is formed again as the barrier film 17 on the tantalum oxide film. Thereafter, the first surface 11S1 of the semiconductor substrate 11 is planarized by, for example, CMP. Thus, the in-pixel separation section 14 that is covered by the barrier film 17 is formed.

Figure 11B:
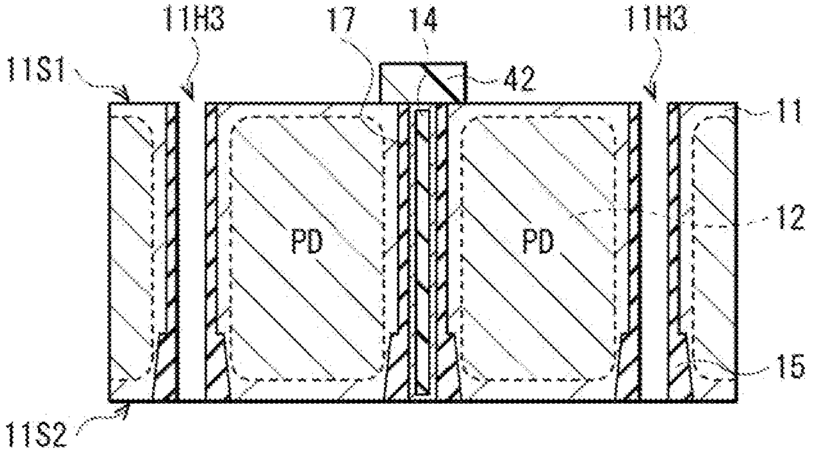
FIG. 11B is a schematic cross-sectional view of a step subsequent to FIG. 11A.
Figure 11C:
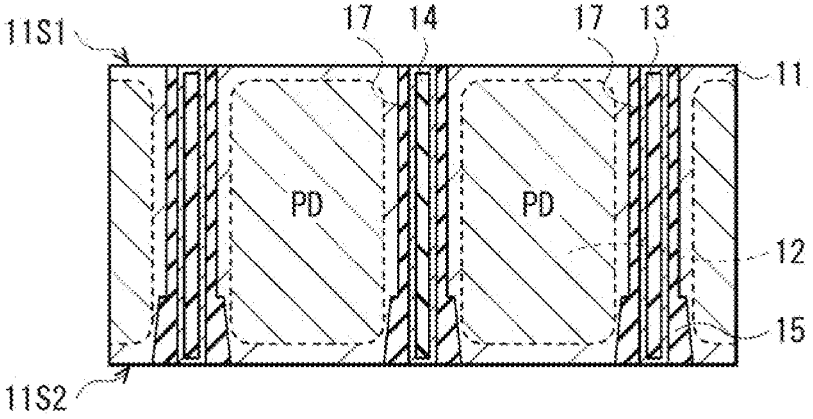
FIG. 11C is a schematic cross-sectional view of a step subsequent to FIG. 11B.

Thereafter, as illustrated in FIG. 11B, the mask 42 is formed on the in-pixel separation section 14, and the embedding material 41 inside the opening 11H3 is removed by, for example, wet etching or dry etching. Thereafter, as illustrated in FIG. 11C, an aluminum oxide film is formed as the barrier film 17 on a side surface and a bottom surface of the opening 11H3 by, for example, ALD, following which a silicon oxide film, for example, is embedded in the opening 11H3, and the aluminum oxide film is formed again as the barrier film 17 on the tantalum oxide film. Thereafter, the first surface 11S1 of the semiconductor substrate 11 is planarized by, for example, CMP. Thus, the inter-pixel separation section 13 that is covered by the barrier film 17 is formed.

Thereafter, similarly to the foregoing embodiment, the fixed charge layer 16, the color filter 21, the light-shielding section 22, the planarization layer 23, and the lens layer 24 are sequentially formed. Thus, the imaging device 1C illustrated in FIG. 10 is completed.

In a case where the in-pixel separation section 14 includes, for example, iron oxide, the in-pixel separation section 14 can become an impurity site of Si and dark current can increase.

In contrast, in the present modification example, the barrier film 17 including, for example, aluminum oxide is formed around the inter-pixel separation section 13 and the in-pixel separation section 14. This makes it possible to reduce diffusion of impurities from the in-pixel separation section 14 to the semiconductor substrate 11.

Figure 12:
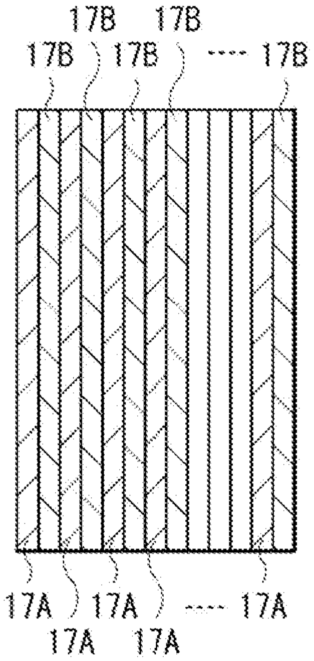
FIG. 12 is a configuration example of the inter-pixel separation section and the in-pixel separation section of the imaging device illustrated in FIG. 10.

Further, as with Modification Example 2 described above, in the case where the refractive index of the in-pixel separation section 14 is changed depending on the wavelength of the light to be absorbed by the photoelectric conversion section 12, it is preferable, for example, to select a plurality (for example, two kinds) of materials out of the above-described constituent materials of the in-pixel separation section 14 and to alternately stack films (a first layer 17A and a second layer 17B) including the respective selected materials by, for example, an ALD method, to thereby provide a multilayer film in which the first layer 17A and the second layer 17B are alternately stacked as illustrated in FIG. 12, for example.

The film formed by the ALD method is a stacked film at the atomic level, and thus, it is not possible to separate the layers even by physical diffractometry or the like, and the in-pixel separation section 14 has a ternary compound structure of two kinds of materials and oxygen (O). In this case, adjusting the number of times the first layer 17A is stacked and the number of times the second layer 17B is stacked makes it possible to easily change a composition ratio. This makes it possible to easily adjust the refractive index of the in-pixel separation section 14.

2-5. Modification Example 5

Figure 13:
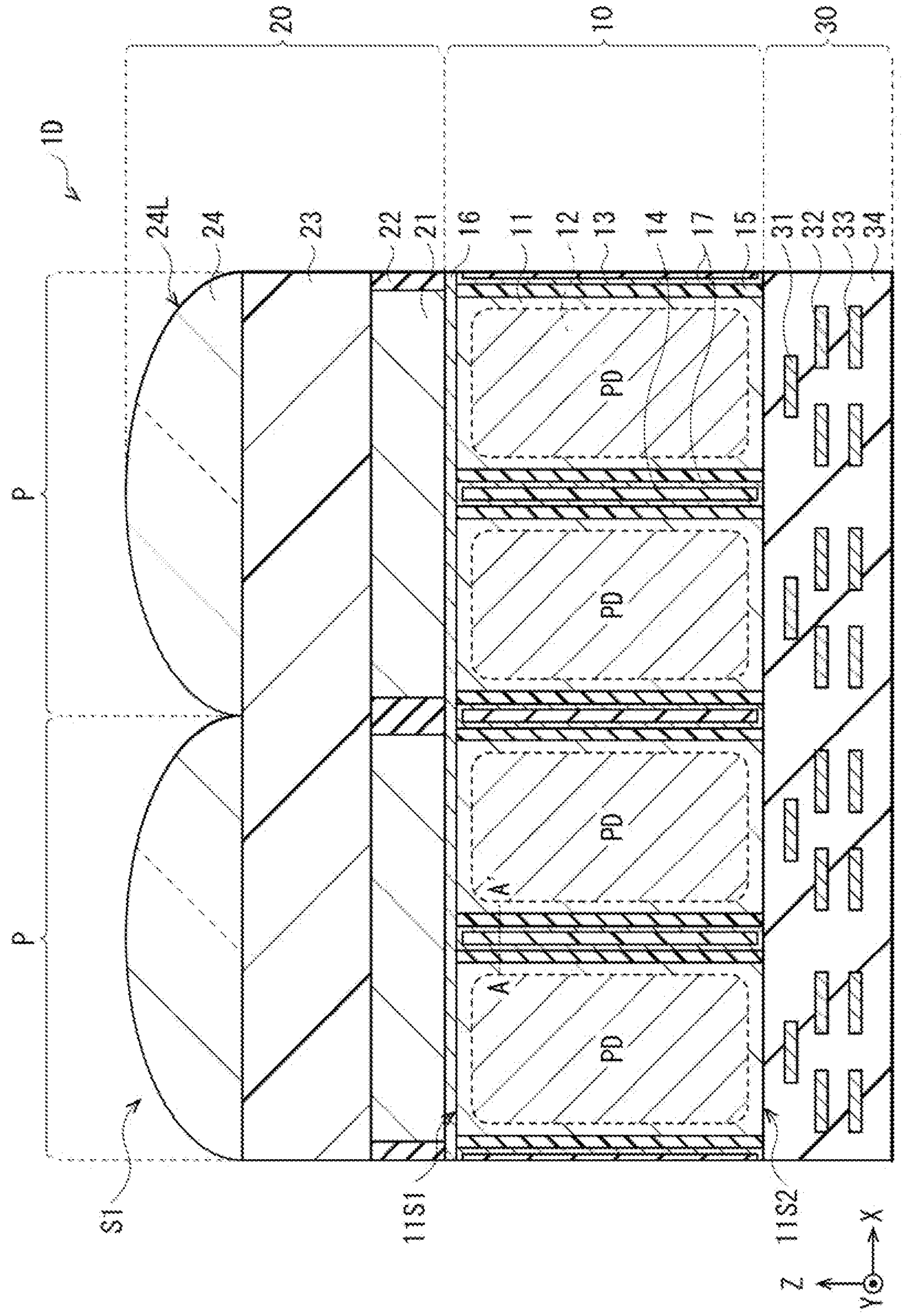
FIG. 13 is a schematic cross-sectional view of an example of a configuration of an imaging device according to Modification Example 5 of the present disclosure.

FIG. 13 schematically illustrates an example of a cross-sectional configuration of an imaging device (an imaging device 1D) according to Modification Example 5 of the present disclosure. The imaging device 1D is a CMOS image sensor or the like to be used, for example, in an electronic apparatus such as a digital still camera or a video camera. Similarly to the foregoing embodiment, the imaging device 1D is, for example, a so-called back-illuminated imaging device.

Figure 14:
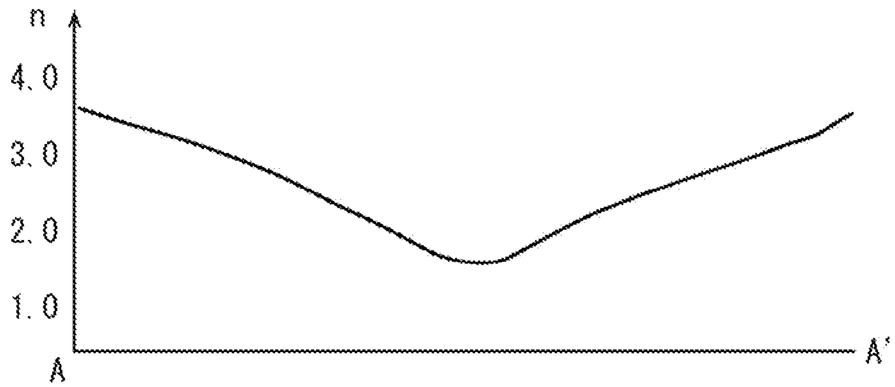
FIG. 14 is an example of an image profile of a refractive index gradient of an in-pixel separation section in the imaging device illustrated in FIG. 13.

As illustrated in FIG. 14, the in-pixel separation section 14 may have, for example, a refractive index gradient in which the refractive index gradually changes from a center part toward an outer edge part in a neighboring direction (for example, an X-axis direction in FIG. 13) of the adjacent photoelectric conversion sections 12 inside the unit pixel P. FIG. 14 illustrates an exemplary refractive index gradient in an A-A' direction in FIG. 13. Specifically, the outer edge part that is close to the photoelectric conversion section 12 has a refractive index equal to that of the semiconductor substrate 11 (the silicon substrate), and the center part has a refractive index lower than that of the outer edge part.

It is possible to form the in-pixel separation section 14 having the refractive index gradient as illustrated in FIG. 14 by using, for example, silicon oxide in which an oxygen content is adjusted from the center part through the outer edge part. Specifically, it is possible to form the in-pixel separation section 14 by causing silicon oxide to be rich in oxygen as being nearer to the center part, and to be rich in silicon as being nearer to the outer edge part. As described above, for example, in a case where the refractive index gradient is formed by changing a composition of the silicon oxide film, it is possible to be formed by increasing or decreasing oxygen supply during formation of an amorphous silicon film using a CVD (Chemical Vapor Deposition) method, for example.

Figure 15:
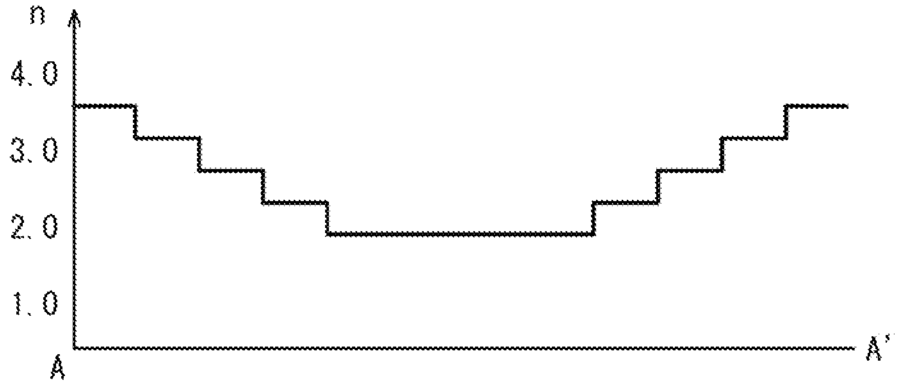
FIG. 15 is another example of the image profile of the refractive index gradient of the in-pixel separation section in the imaging device illustrated in FIG. 13.

It is to be noted that FIG. 14 illustrates an example of an image profile of the refractive index gradient of the in-pixel separation section 14, and the example is not limited thereto. For example, FIG. 14 illustrates an example in which the refractive index gradient of the in-pixel separation section 14 is continuously changed; however, for example, as illustrated in FIG. 15, the refractive index gradient of the in-pixel separation section 14 may be intermittently changed, for example, changed stepwise.

It is also possible to form the refractive index gradient of the in-pixel separation section 14 by combining different materials. In this case, as a material included in the in-pixel separation section 14, it is preferable to select a material having a high bandgap such as hafnium oxide ($HfO_x$), aluminum oxide ($AlO_x$), zirconium oxide ($ZrO_x$), tantalum oxide ($TaO_x$), or the like.

Figure 16:
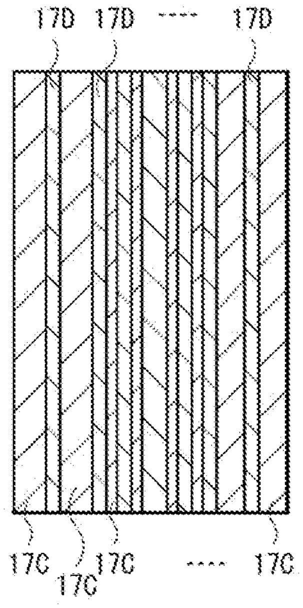
FIG. 16 is a schematic view of a configuration example of the in-pixel separation section in the imaging device illustrated in FIG. 13.

The in-pixel separation section 14 having the refractive index gradient in the neighboring direction (for example, the X-axis direction in FIG. 13) of the adjacent photoelectric conversion sections 12 inside the unit pixel P may be formed, for example, by alternately stacking two kinds of layers (a first layer 17C and a second layer 17D) having different compositions or materials by appropriately changing film thicknesses, as illustrated in FIG. 16. For example, in a case of forming the refractive index gradient using different materials, for example, a film is formed by adjusting respective film thicknesses of an amorphous silicon layer (the first layer 17C) and a high-bandgap-material layer (the second layer 17D) in such a manner that a ratio of the second layer 17D in the center part is high. In this configuration, the high-bandgap-material layer (the second layer 17D) is formed using, for example, an ALD method.

As described above, the present modification example is provided with the in-pixel separation section 14 having the refractive index gradient in which the refractive index gradually changes from the center part toward the outer edge part in the neighboring direction (for example, the X-axis direction) of the adjacent photoelectric conversion sections 12 inside the unit pixel P. Specifically, the outer edge part that is close to the photoelectric conversion section 12 has a refractive index equal to that of the semiconductor substrate 11 (the silicon substrate), and the center part has a refractive index lower than that of the outer edge part. This makes it possible to reduce optical reflection while maintaining electrical separation in the in-pixel separation section 14. It is therefore possible to further improve the optical characteristic in addition to the effects of the foregoing embodiment.

2-6. Modification Example 6

Figure 17:
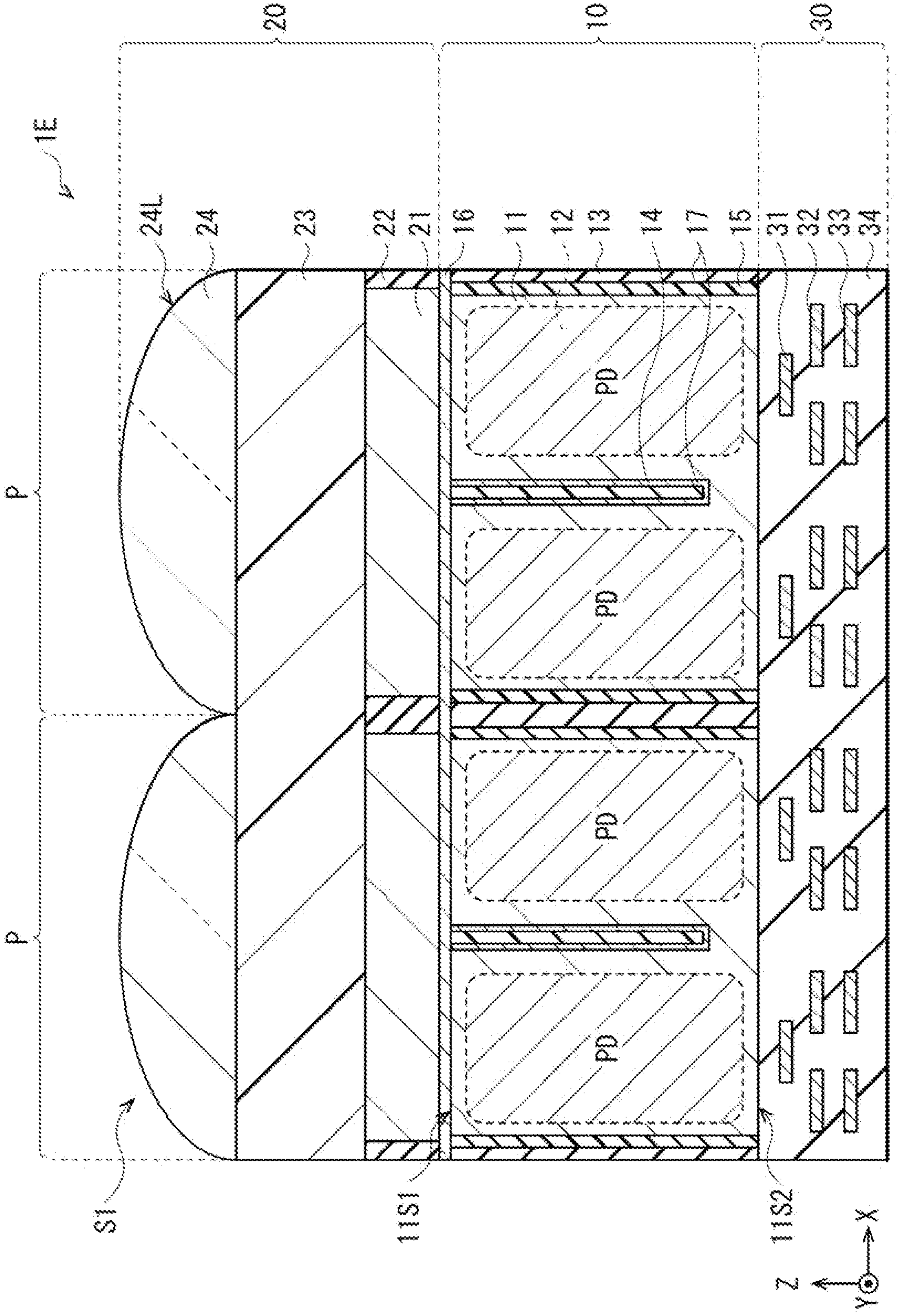
FIG. 17 is a schematic cross-sectional view of an example of a configuration of an imaging device according to Modification Example 6 of the present disclosure.

FIG. 17 schematically illustrates an example of a cross-sectional configuration of an imaging device (an imaging device 1E) according to Modification Example 6 of the present disclosure. The imaging device 1E is a CMOS image sensor or the like to be used, for example, in an electronic apparatus such as a digital still camera or a video camera. Similarly to the foregoing embodiment, the imaging device 1E is, for example, a so-called back-illuminated imaging device.

Modification Example 3 described above indicates the example in which the width W2 of the in-pixel separation section 14 is narrower than the width W1 of the inter-pixel separation section 13 (W1<W2); however, as described above, it is preferable to form the barrier film 17 around the in-pixel separation section 14 in a case where the width W2 of the in-pixel separation section 14 is sufficiently reduced and the in-pixel separation section 14 includes, for example, polysilicon or amorphous silicon. The barrier film 17 has a thickness of, for example, greater than or equal to a thickness of a one-atom layer and less than 5 nm, and preferably greater than or equal to the thickness of the one-atom layer and less than 3 nm. This reduces generation of an interface state between the in-pixel separation section 14 and the semiconductor substrate 11 while suppressing a decrease in the transmittance due to the barrier film 17. Further, in the configuration of the present modification example, the insulating film 15 around the in-pixel separation section 14 is omittable.

As described above, the width W2 of the in-pixel separation section 14 is sufficiently reduced, and the barrier film 17 is further formed around the in-pixel separation section 14. This reduces generation of the interface state between the semiconductor substrate 11 and the in-pixel separation section 14. It is therefore possible to improve an electric characteristic in addition to the effects of Modification Example 2 described above.

Further, for example, in a case where the in-pixel separation section 14 includes polysilicon or amorphous silicon doped with impurities, it is possible to reduce diffusion of impurities from the in-pixel separation section 14 to the semiconductor substrate 11 by the barrier film 17.

In addition, it becomes possible to increase electrical separation between the adjacent photoelectric conversion sections 12 inside the unit pixel P as compared with a case of simply reducing the width W2 of the in-pixel separation section 14.

2-7. Modification Example 7

Figure 18:
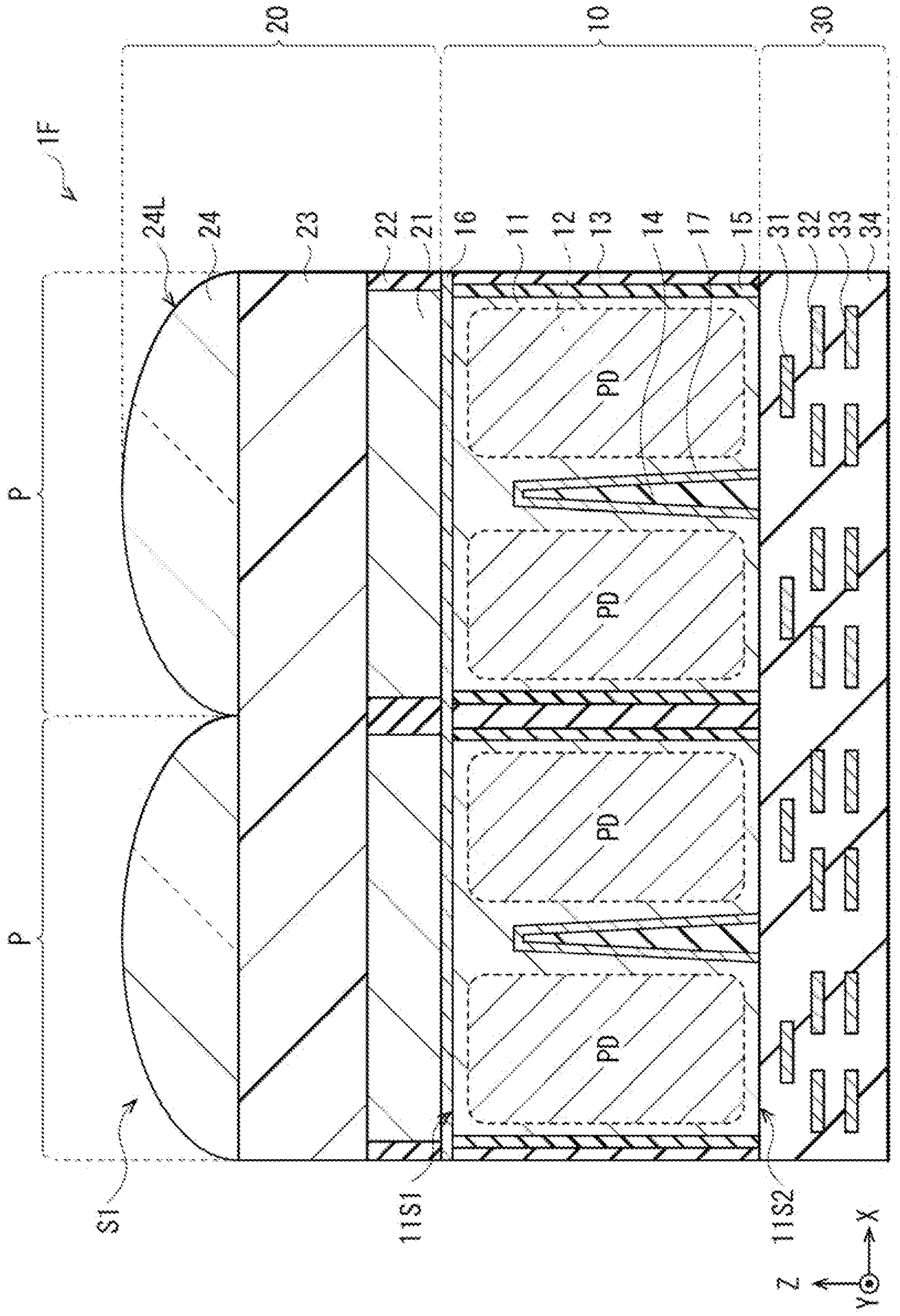
FIG. 18 is a schematic cross-sectional view of an example of a configuration of an imaging device according to Modification Example 7 of the present disclosure.

FIG. 18 schematically illustrates an example of a cross-sectional configuration of an imaging device (an imaging device 1F) according to Modification Example 7 of the present disclosure. The imaging device 1F is a CMOS image sensor or the like to be used, for example, in an electronic apparatus such as a digital still camera or a video camera. Similarly to the foregoing embodiment, the imaging device 1F is, for example, a so-called back-illuminated imaging device.

As illustrated in FIG. 18, for example, the in-pixel separation section 14 may have a space between the in-pixel separation section 14 and the first surface 11S1 of the semiconductor substrate 11, and may be tapered in such a manner that a width in an in-plane direction of the semiconductor substrate 11 (e.g., the X-axis direction) increases from the first surface 11S1 toward the second surface 11S2. As with Modification Example 6 described above, the barrier film 17 is formed around the tapered in-pixel separation section 14.

For example, even in the case where the width W2 of the in-pixel separation section 14 is less than 100 nm, as with Modification Example 3 or the like described above, the in-pixel separation section 14 occupies, for example, about 10% of the unit pixel P in terms of area and volume. Accordingly, light probabilistically close to the percentage is absorbed in the in-pixel separation section 14.

In contrast, the present modification example provides the in-pixel separation section 14 that is tapered in such a manner that the width W2 narrows from the side of the second surface 11S2 of the semiconductor substrate 11 toward the side of the first surface 11S1 thereof, and the space between the first surface 11S1 of the semiconductor substrate 11 and the in-pixel separation section 14. Out of pieces of light entered from the light incident side S1, the blue light (B) has a high absorptance of Si, and is therefore absorbed in the vicinity of the first surface 11S1 of the semiconductor substrate 11. This reduces absorption of the blue light (B) by the in-pixel separation section 14. The red light (R) and the green light (G) have respective absorptances that are lower than that of the blue light (B), and reach a deep part of the semiconductor substrate 11 (the side of the second surface 11S2); however, the in-pixel separation section 14 is tapered in the present modification example, which reduces a probability that the light passing the side of the first surface 11S1 of the semiconductor substrate 11 is absorbed. It is therefore possible to improve light absorption efficiency in addition to the effects of Modification Example 3 and Modification Example 6 described above.

Figure 19:
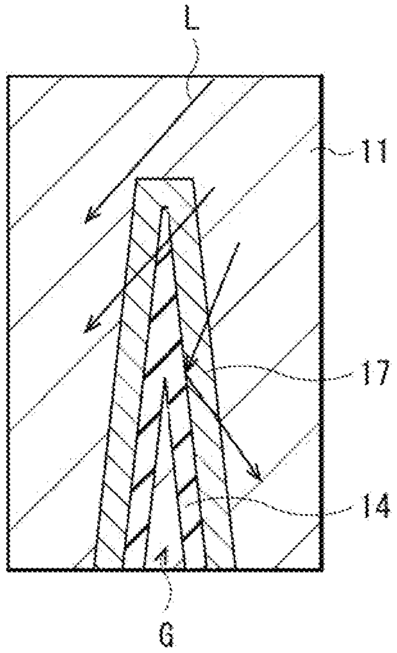
FIG. 19 is a schematic cross-sectional view of another example of a configuration of an in-pixel separation section in the imaging device illustrated in FIG. 18.

Further, the light reaching a lower portion of the tapered in-pixel separation section 14 is absorbed in the vicinity of the border of the adjacent photoelectric conversion sections 12, and thus, an influence on performance of an image plane phase difference is small even if the light is absorbed by any of the adjacent photoelectric conversion sections 12. Accordingly, the light may be reflected on the in-pixel separation section 14 without being transmitted therethrough, for example, a gap G may be formed inside the in-pixel separation section 14 as illustrated in FIG. 19. This further reduces the absorption loss due to the in-pixel separation section 14, and makes it possible to further improve the light absorption efficiency.

2-8. Modification Example 8

FIGS. 20A to 20D schematically illustrate other examples of the shape of the in-pixel separation section 14 of the imaging device 1 according to a modification example (Modification Example 8) of the foregoing embodiment of the present disclosure. The foregoing embodiment indicates the example of the in-pixel separation section 14 extending between the pair of opposite sides of the inter-pixel separation section 13 that surrounds the unit pixel P; the present disclosure is not limited thereto.

Figure 20A:
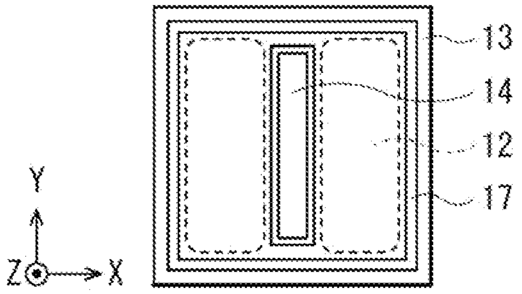
FIG. 20A is a plan schematic view of an example of a shape of an in-pixel separation section in an imaging device according to Modification Example 8 of the present disclosure.
Figure 20B:
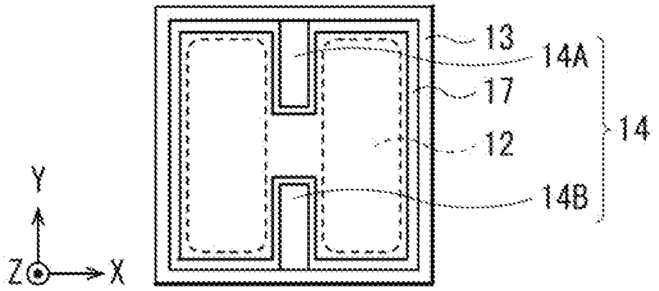
FIG. 20B is a plan schematic view of another example of the shape of the in-pixel separation section in the imaging device according to Modification Example 8 of the present disclosure.
Figure 20C:
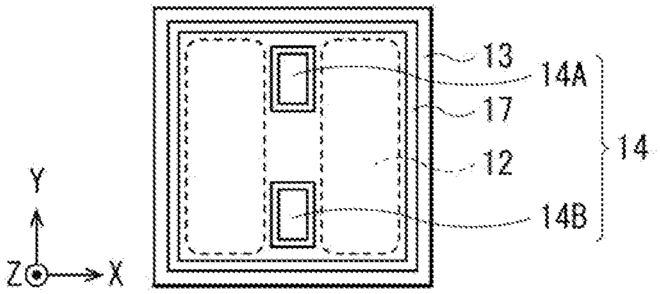
FIG. 20C is a plan schematic view of another example of the shape of the in-pixel separation section in the imaging device according to Modification Example 8 of the present disclosure.
Figure 20D:
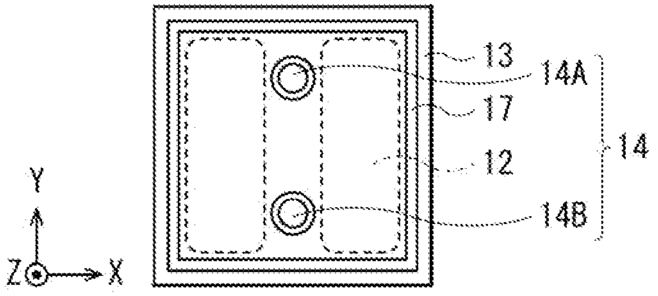
FIG. 20D is a plan schematic view of another example of the shape of the in-pixel separation section in the imaging device according to Modification Example 8 of the present disclosure.

As illustrated in FIG. 20A, for example, the in-pixel separation section 14 may have a space between the in-pixel separation section 14 and the inter-pixel separation section 13 that surrounds the unit pixel P. Further, as illustrated in FIG. 20B, for example, the in-pixel separation section 14 may include two in-pixel separation sections 14A and 14B each extending from corresponding one of the pair of opposite sides of the inter-pixel separation section 13 that surrounds the unit pixel P toward the center of the unit pixel P, and having a space therebetween. Further, as illustrated in FIG. 20C, for example, the in-pixel separation section 14 may have a space between the inter-pixel separation section 13 that surrounds the unit pixel P and each of the two in-pixel separation sections 14A and 14B. Still further, FIG. 20C illustrates an example in which the in-pixel separation sections 14A and 14B each having a rectangular shape in a plan view are provided; however, as illustrated in FIG. 20D, for example, the in-pixel separation sections 14A and 14B may each have a circular shape including, for example, an ellipse.

As described above, providing the in-pixel separation section 14 between the adjacent photoelectric conversion sections 12 in part makes it possible to reduce scattering of light while maintaining an electrical separation characteristic. It is therefore possible to further improve the optical characteristic in addition to the effects of the foregoing embodiment.

Figure 21:
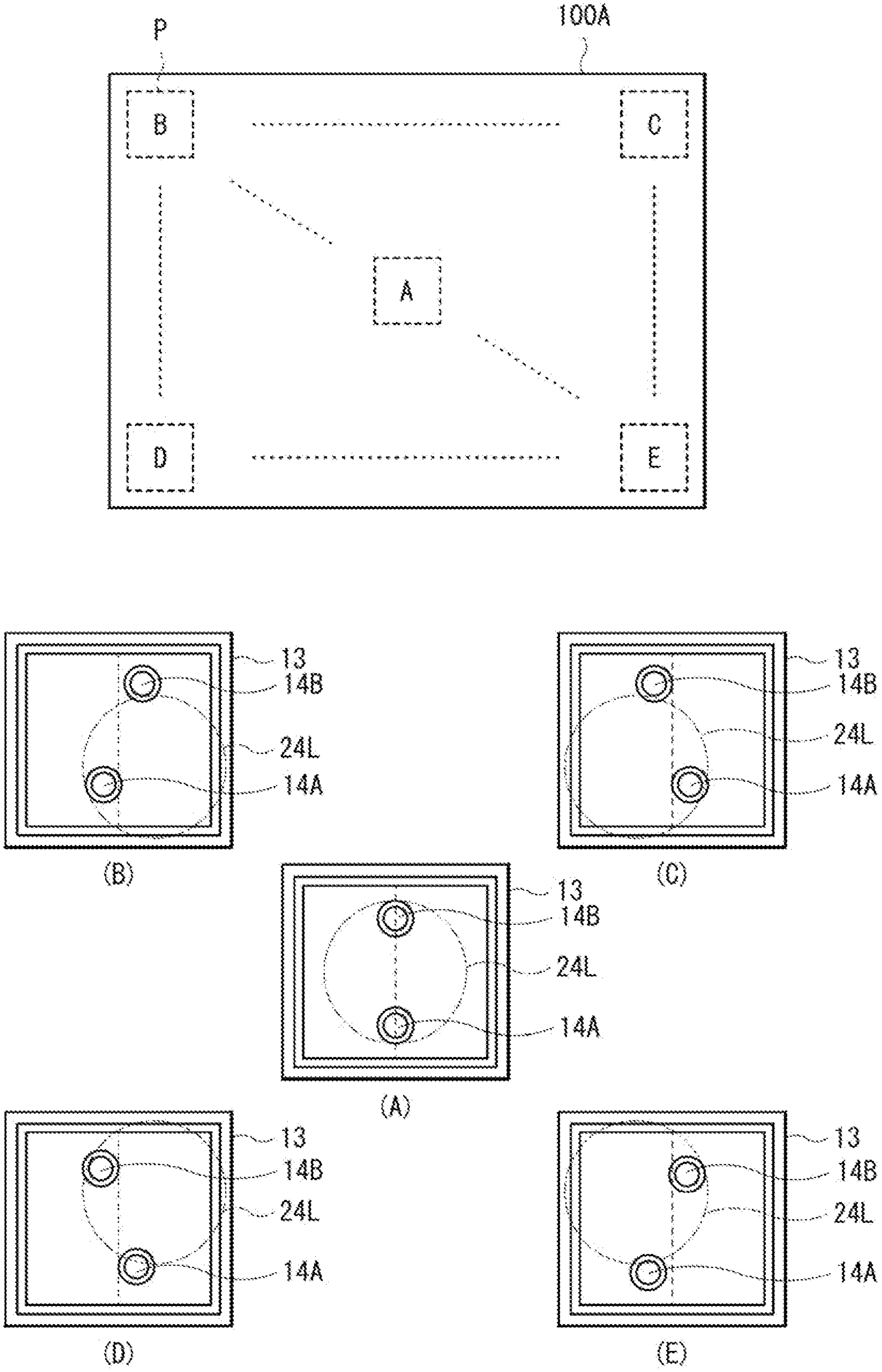
FIG. 21 is a diagram illustrating a layout example of the in-pixel separation section depending on a position in a pixel section.

Further, as illustrated in FIG. 21, for example, positions at which the two in-pixel separation sections 14A and 14B are formed in the unit pixel P may be changed depending on a position of the unit pixel P in the pixel section 100A and an offset amount of the on-chip lens 24L with respect to the center part of the unit pixel P. This makes it possible to reduce a difference in characteristics sensitivity and the like to oblique incident light caused by, for example, lens shift.

2-9. Modification Example 9

FIGS. 22A to 22E illustrate another example of the method of manufacturing the inter-pixel separation section 13 and the in-pixel separation section 14 according to Modification Example 9 of the present disclosure. As described in the foregoing embodiment the inter-pixel separation section 13 may be constituted by a gap. The inter-pixel separation section 13 constituted by the gap may be formed as follows, for example.

Figure 22A:
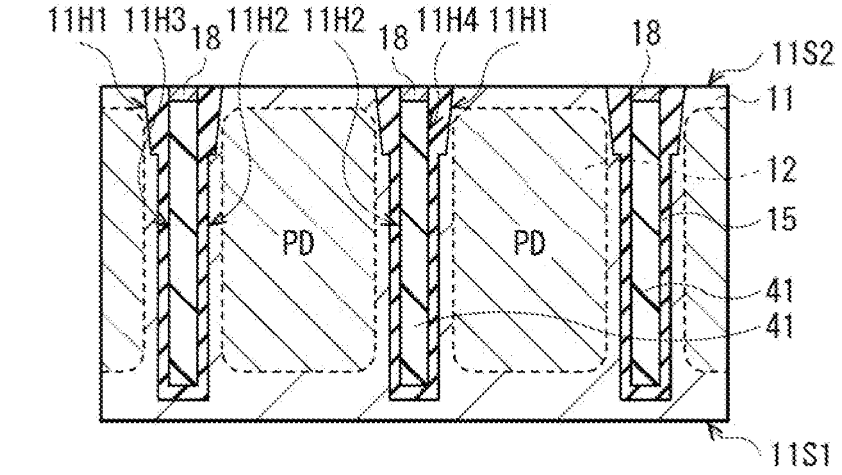
FIG. 22A is a schematic cross-sectional view for describing a method of manufacturing an inter-pixel separation section and an in-pixel separation section according to Modification Example 9 of the present disclosure.

First, similarly to the foregoing embodiment, the STI, the FFTI, and the photoelectric conversion section 12 are formed. Specifically, the opening 11H3 and the opening 11H4 are respectively formed inside the FFTI between the unit pixels P and inside the FFTI inside the unit pixel P, and polysilicon, for example, is embedded therein as the embedding material 41. Thereafter, as illustrated in FIG. 22A, an oxide film 18 is formed in an upper part of the opening 11H2. Selected as a material of the oxide film 18 is a material that is not etched, for example, when the semiconductor substrate 11 is inverted and the embedding material 41 is removed by etching. Thereafter, for example, a p-well is formed inside the semiconductor substrate 11 by ion-implantation, and an n-type photoelectric conversion section 12 is formed in the p-well.

Figure 22B:
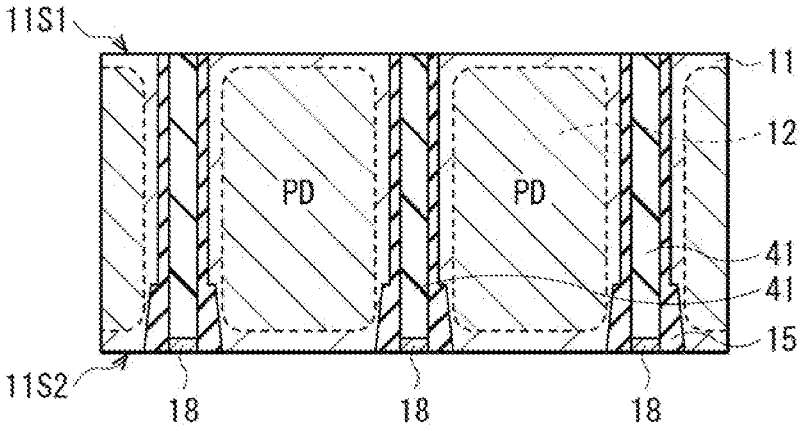
FIG. 22B is a schematic cross-sectional view of a step subsequent to FIG. 22A.
Figure 22C:
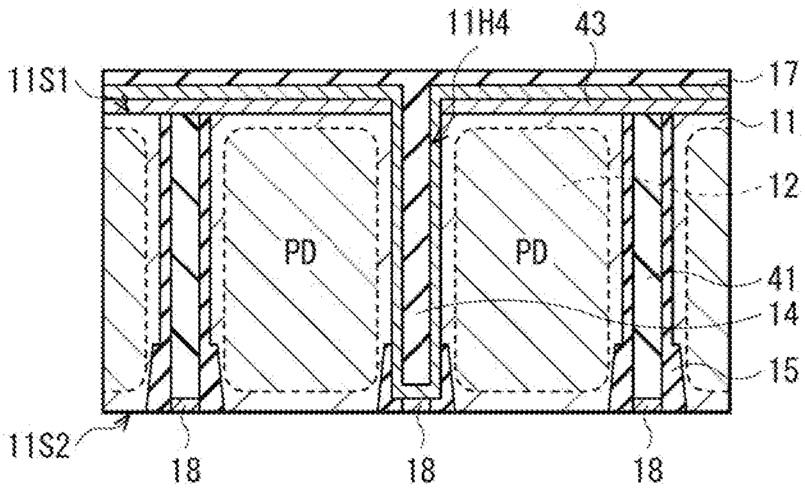
FIG. 22C is a schematic cross-sectional view of a step subsequent to FIG. 22B.

Thereafter, as illustrated in FIG. 22B, the semiconductor substrate 11 is inverted, and the first surface 11S1 of the semiconductor substrate 11 is ground by, for example, CMP, to expose the FFTI and the embedding material 41. Thereafter, as illustrated in FIG. 22C, similarly to the foregoing embodiment, the embedding material 41 inside the opening 11H4 is removed, following which a mask 43 is formed on the first surface 11S1 of the semiconductor substrate 11, the continuous barrier film 17 is formed on the side surface and the bottom surface of the opening 11H4 and the mask 43, and a tantalum oxide film, for example, as the in-pixel separation section 14 is embedded in the opening 11H4.

Figure 22D:
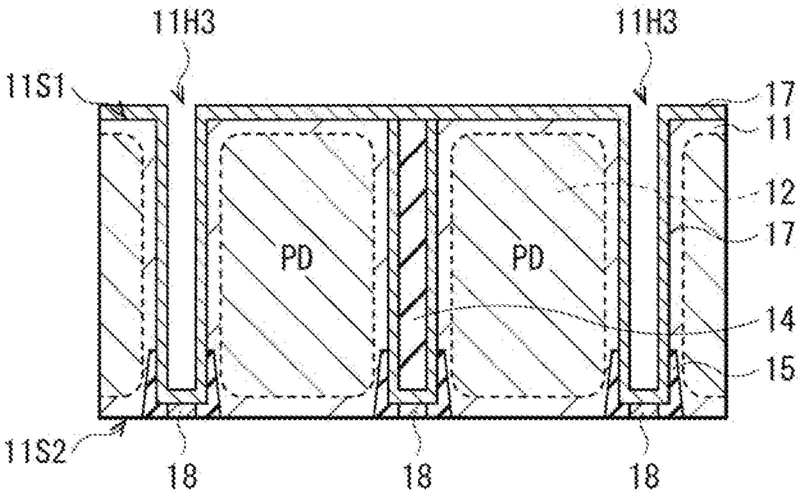
FIG. 22D is a schematic cross-sectional view of a step subsequent to FIG. 22C.
Figure 22E:
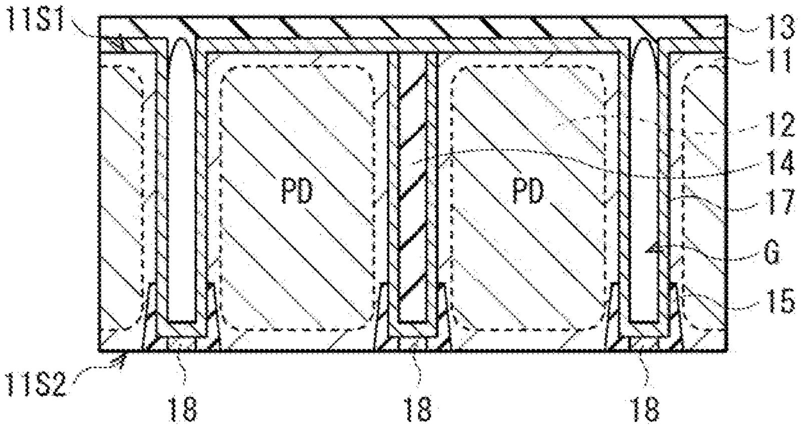
FIG. 22E is a schematic cross-sectional view of a step subsequent to FIG. 22D.

Thereafter, as illustrated in FIG. 22D, etch back, for example, planarizes the first surface 11S1 of the semiconductor substrate 11, removes the embedding material 41 inside the opening 11H3, and forms the barrier film 17 that is continuous on the side surface and the bottom surface of the opening 11H3 and the first surface 11S1 of the semiconductor substrate 11. Thereafter, as illustrated in FIG. 22E, the opening 11H3 is closed by using, for example, a non-conformal film forming condition on the first surface 11S1 of the semiconductor substrate 11, and the inter-pixel separation section 13 constituted by the gap is formed.

Thereafter, similarly to the foregoing embodiment, the fixed charge layer 16, the color filter 21, the light-shielding section 22, the planarization layer 23, and the lens layer 24 are sequentially formed. Thus, the imaging device 1 illustrated in FIG. 1 is completed.

2-10. Modification Example 10

Figure 23:
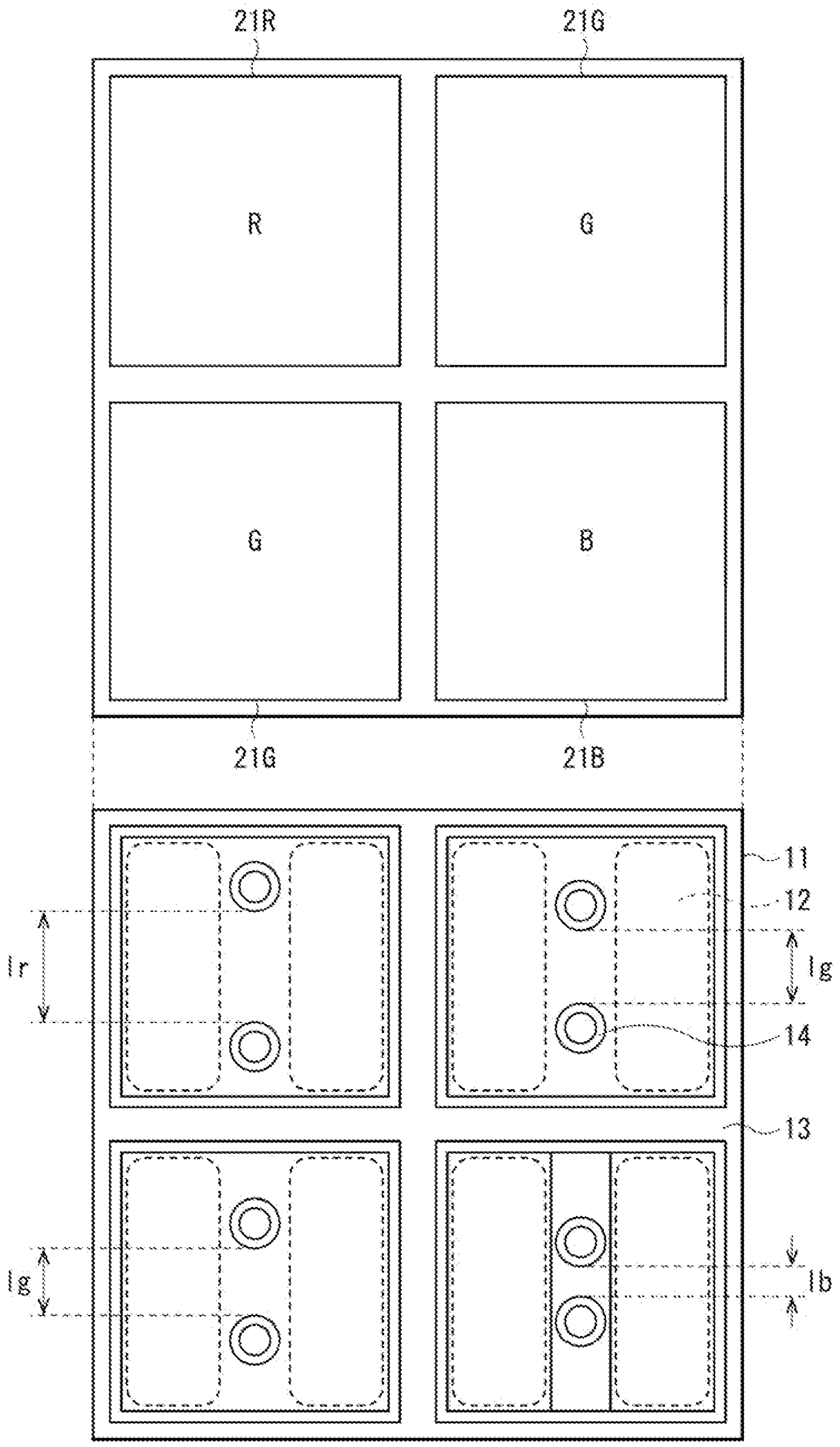
FIG. 23 is a plan schematic view for describing a configuration of an imaging device according to Modification Example 10 of the present disclosure.

FIG. 23 schematically illustrates another example of the plane configuration of the imaging device 1 according to a modification example (Modification Example 10) of Modification Example 8. The two in-pixel separation sections 14A and 14B may vary a distance 1 between the two in-pixel separation sections 14A and 14B depending on the wavelength of the light to be photoelectrically converted in each unit pixel P. In other words, the refractive index of the in-pixel separation section 14 may vary the distance between the two in-pixel separation sections 14A and 14B depending on the color filter 21 provided in the upper portion of each unit pixel P (on the light incident side S1).

For example, it is preferable that the distance between the two in-pixel separation sections 14A and 14B be greater as the wavelength of the light to be photoelectrically converted in the plurality of photoelectric conversion sections 12 inside the unit pixel P is longer. Specifically, as illustrated in FIG. 23, for four unit pixels P disposed in 2 rows×2 columns, the two color filters 21G that selectively transmit the green light (G) are disposed on a diagonal line, and the color filters 21R and 21B that selectively transmit the red light (R) and the blue light (B), respectively, are each disposed on the perpendicular diagonal line. In such a case, distances lr, lg, and lb between the two in-pixel separation sections 14A and 14B each formed in corresponding one of the unit pixels P satisfy lr>lg>lb. This makes it possible to further improve the optical characteristic in addition to the effects of Modification Example 8 described above.

2-11. Modification Example 11

Figure 24:
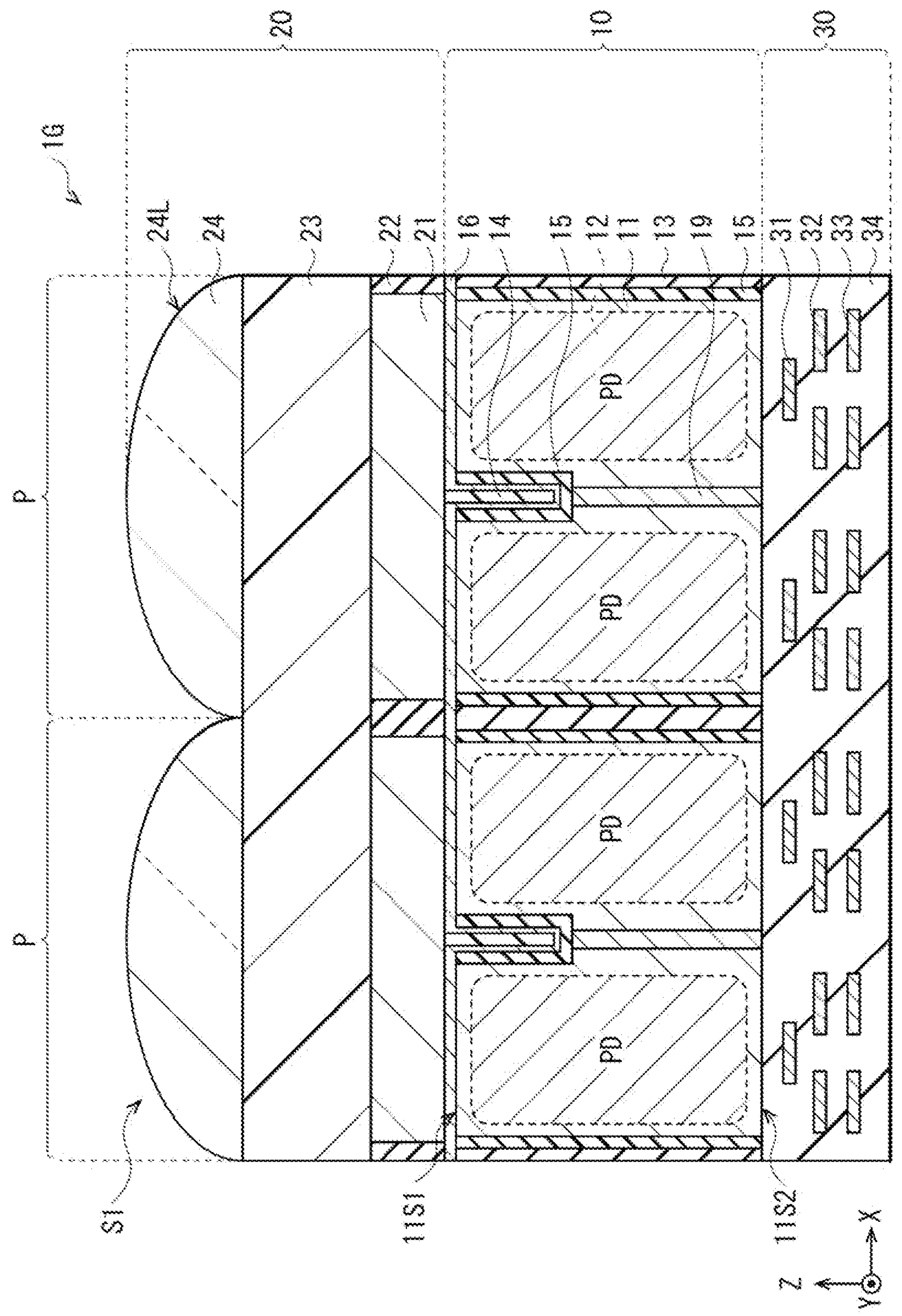
FIG. 24 is a schematic cross-sectional view of an example of a configuration of an imaging device according to Modification Example 11 of the present disclosure.

FIG. 24 schematically illustrates an example of a cross-sectional configuration of an imaging device (an imaging device 1G) according to Modification Example 11 of the present disclosure. The imaging device 1G is a CMOS image sensor or the like to be used, for example, in an electronic apparatus such as a digital still camera or a video camera. Similarly to the foregoing embodiment, the imaging device 1G is, for example, a so-called back-illuminated imaging device.

The foregoing embodiment indicates the example in which the in-pixel separation section 14 has a FFTI structure; however, the present disclosure is not limited thereto. As illustrated in FIG. 24, for example, the in-pixel separation section 14 may have, for example, a RDTI structure that extends from the first surface 11S1 of the semiconductor substrate 11 toward the second surface 11S2 thereof. A diffusion region 19 in which impurities are diffused is formed between the bottom of the in-pixel separation section 14 and the second surface 11S2 of the semiconductor substrate 11. In other words, in the imaging device 1G according to the present modification example, the adjacent photoelectric conversion sections inside the unit pixel P are electrically separated by the in-pixel separation section 14 having the RDTI structure and the diffusion region 19.

Figure 25:
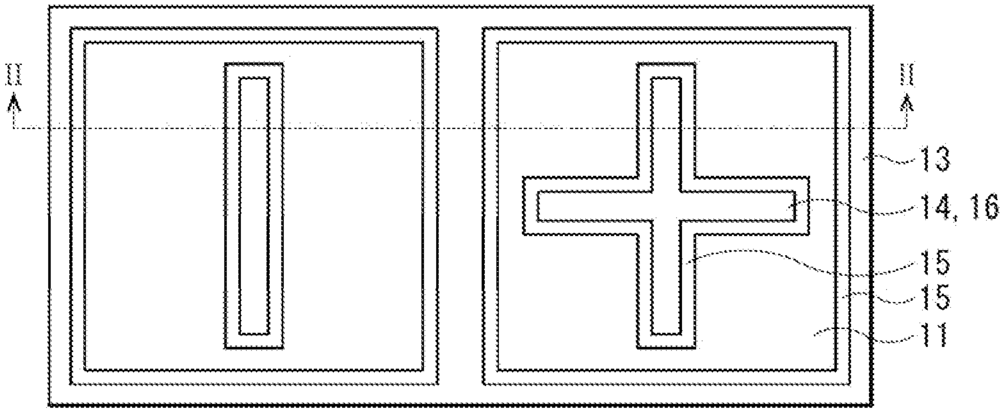
FIG. 25 is a schematic view of an example of a planar shape of an in-pixel separation section of the imaging device illustrated in FIG. 24.
Figure 26:
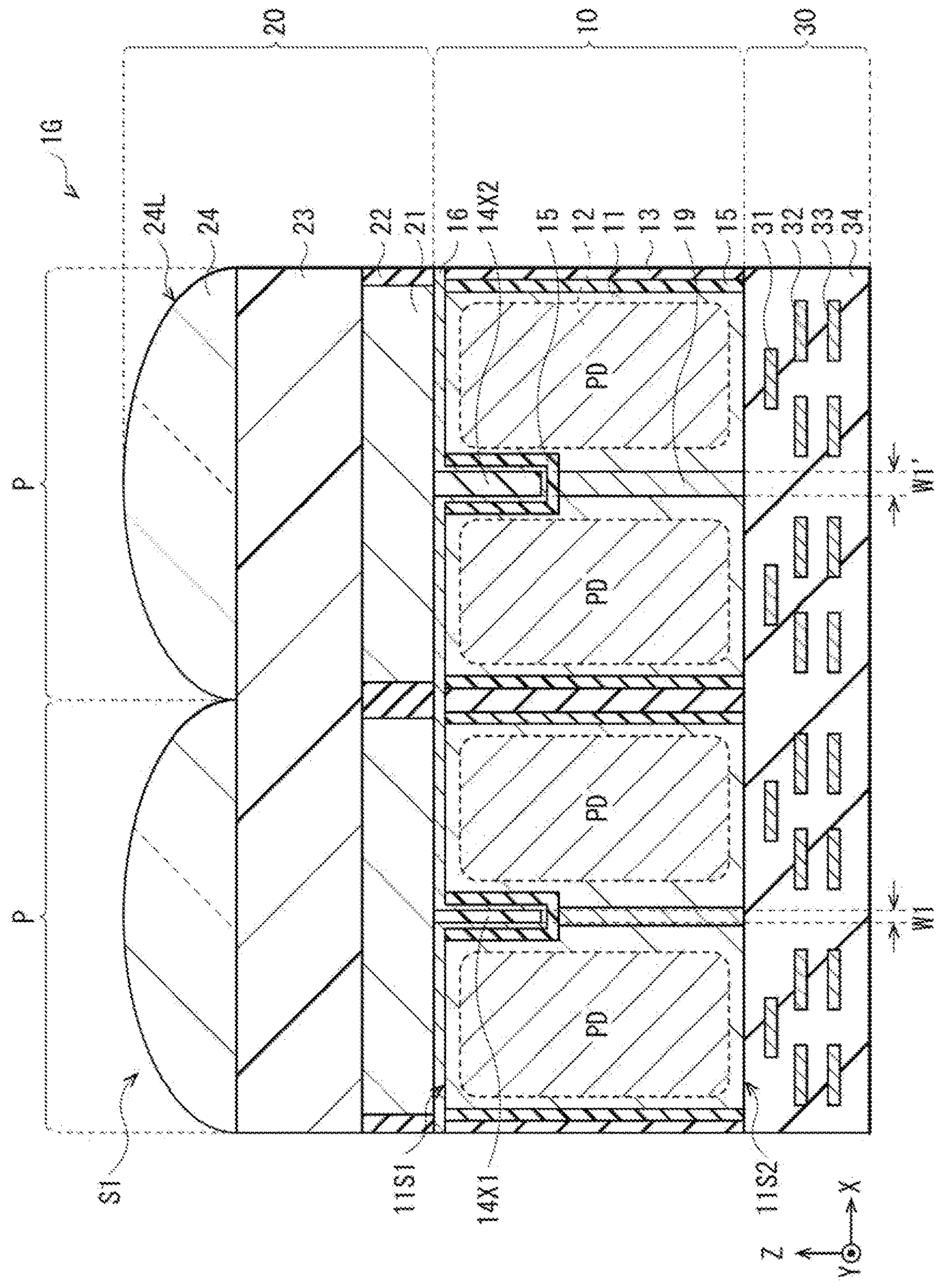
FIG. 26 is a schematic cross-sectional view of another example of the configuration of the imaging device according to Modification Example 11 of the present disclosure.
Figure 27:
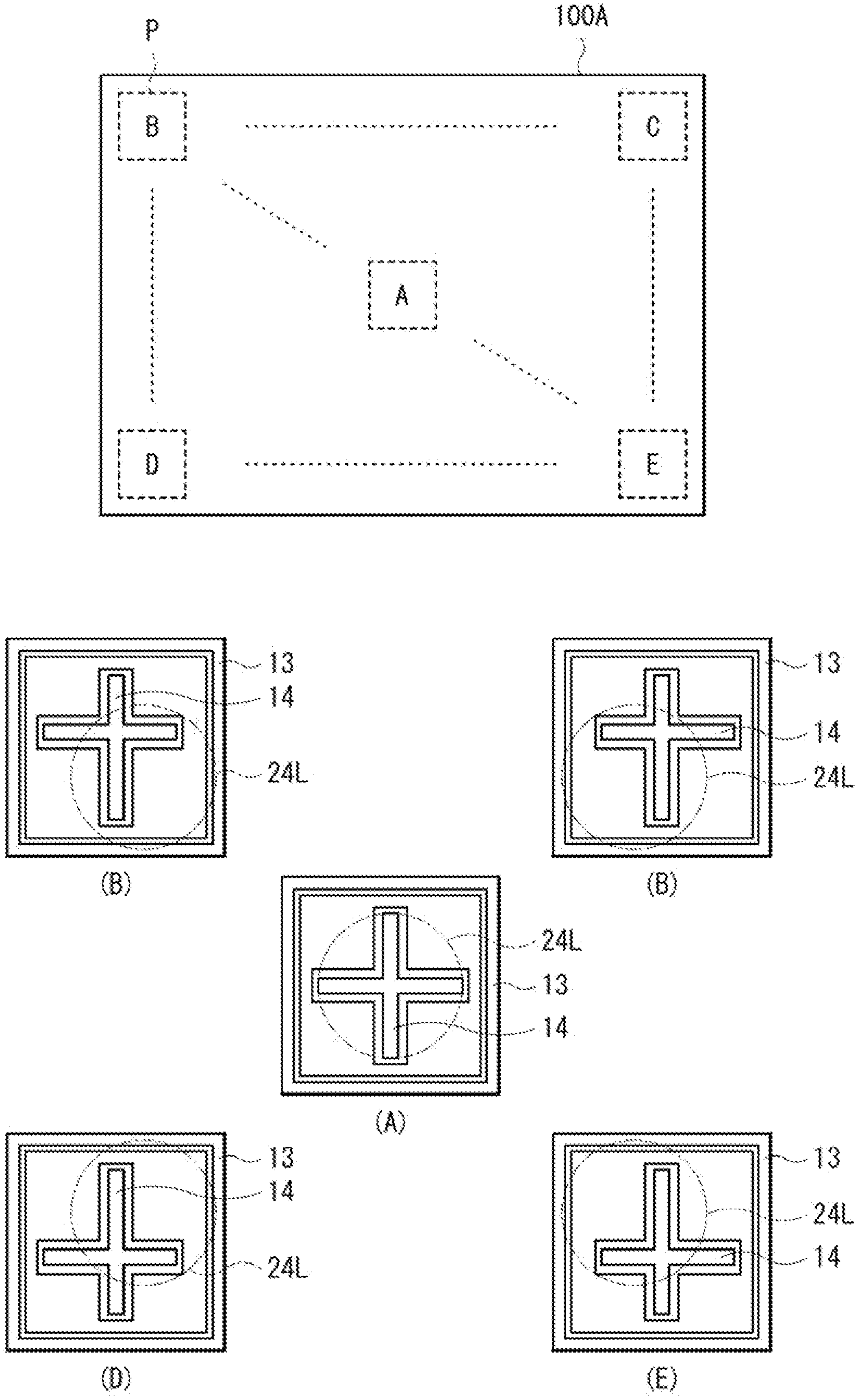
FIG. 27 is a diagram illustrating a layout example of the in-pixel separation section depending on a position in a pixel section.

The in-pixel separation section 14 according to the present modification example may be combined with Modification Example 2 to change materials included therein depending on the wavelength of the light to be photoelectrically converted in each unit pixel P. Further, as illustrated in FIG. 25, a planar layout of the in-pixel separation section 14 may be changed depending on the wavelength of the light to be photoelectrically converted in each unit pixel P. Still further, as illustrated in FIG. 26, a width (W1, W1') and a depth of the in-pixel separation section 14 may be changed depending on the wavelength of the light to be photoelectrically converted in each unit pixel P. Moreover, as illustrated in FIG. 27, in the in-pixel separation section 14 having a substantially cross shape provided in the unit pixel P on the right side of the drawing illustrated in FIG. 25, a position where the substantially-cross-shaped in-pixel separation section 14 is formed in the unit pixel P and a cross position of the substantially-cross-shaped in-pixel separation section 14 may be changed depending on the position of the unit pixel P in the pixel section 100A and the offset amount of the on-chip lens 24L with respect to the center part of the unit pixel P, as with Modification Example 8.

The in-pixel separation section 14 according to the present modification example may also be formed, for example, as follows.

Figure 28A:
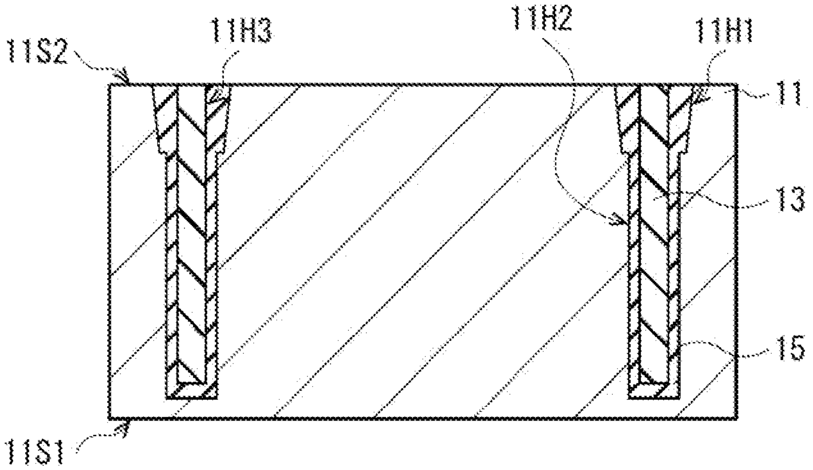
FIG. 28A is a schematic cross-sectional view for describing a method of manufacturing an inter-pixel separation section and an in-pixel separation section illustrated in FIGS. 24 and 26.

First, as illustrated in FIG. 28A, a similarly to the foregoing embodiment, the STI and the FFTI are formed at a position where the inter-pixel separation section 13 is to be formed, following which the opening 11H3 is formed in the FFTI, and polysilicon, for example, is embedded therein as the embedding material 41.

Figure 28B:
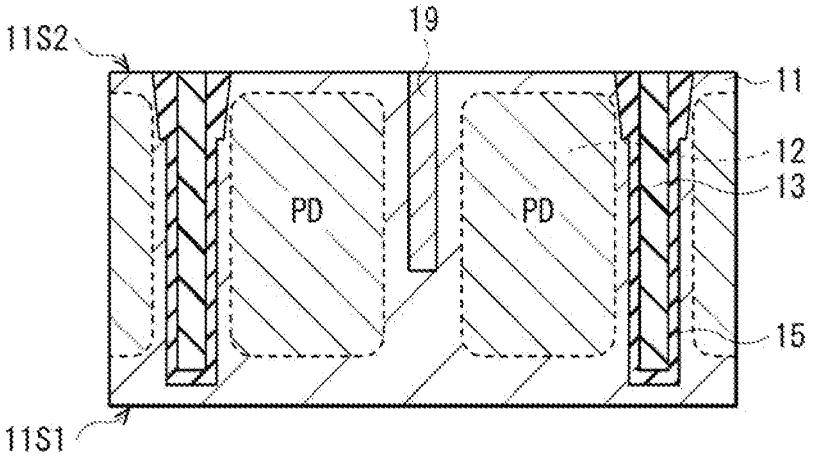
FIG. 28B is a schematic cross-sectional view of a step subsequent to FIG. 28A.
Figure 28C:
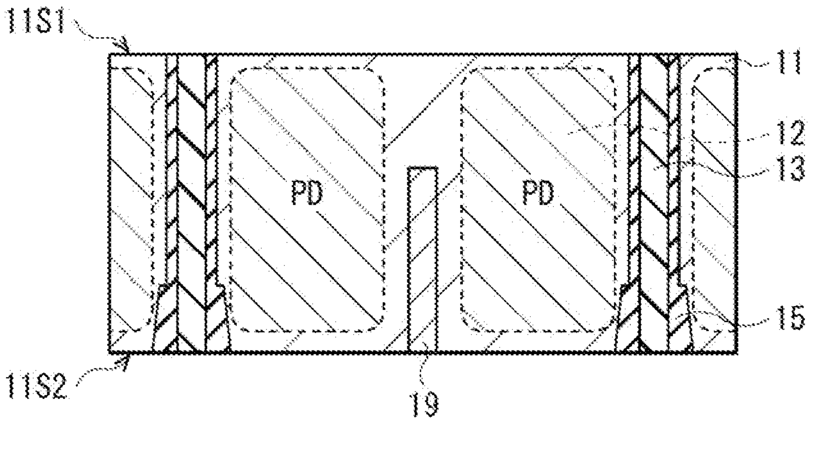
FIG. 28C is a schematic cross-sectional view of a step subsequent to FIG. 28B.
Figure 28D:
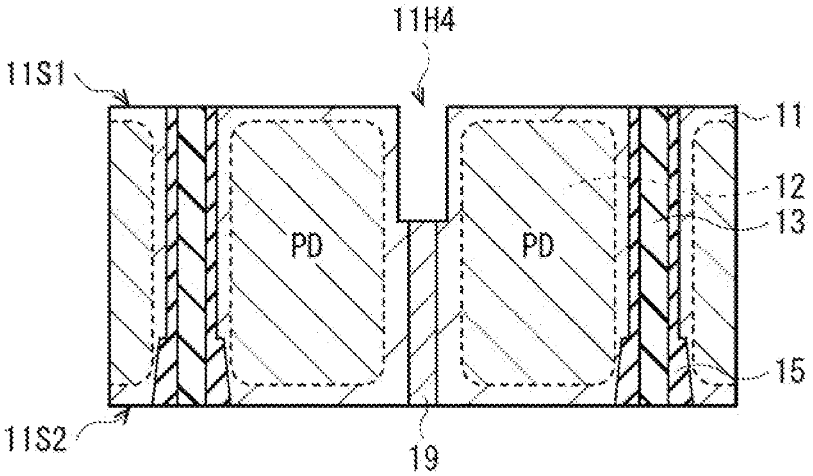
FIG. 28D is a schematic cross-sectional view of a step subsequent to FIG. 28C.

Thereafter, as illustrated in FIG. 28B, the diffusion region 19 and the photoelectric conversion section 12 are formed by, for example, ion-implantation activation at a position where the in-pixel separation section 14 is to be formed. Thereafter, as illustrated in FIG. 28C, the semiconductor substrate 11 is inverted, and the first surface 11S1 of the semiconductor substrate 11 is ground by, for example, CMP, to expose the FFTI. Thereafter, as illustrated in FIG. 28D, the opening 11H4 to be the RDTI is formed by, for example, reactive ion etching (RIE), from the side of the first surface 11S1 of the semiconductor substrate 11 at a position where the in-pixel separation section 14 is to be formed.

Figure 28E:
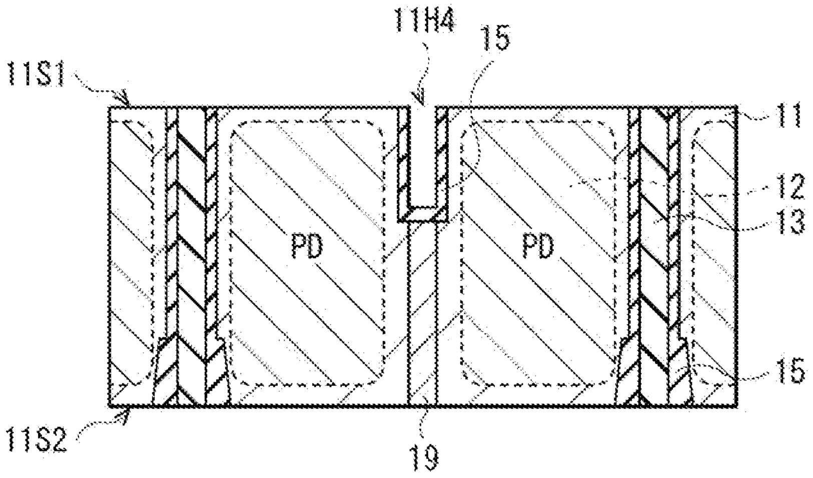
FIG. 28E is a schematic cross-sectional view of a step subsequent to FIG. 28D.

Thereafter, as illustrated in FIG. 28E, the insulating film 15 is formed on the side surface and the bottom surface of the opening 11H4. Thereafter, as illustrated in FIG. 28F, the fixed charge layer 16 is formed on the first surface 11S1 of the semiconductor substrate 11 and on the side surface and the bottom surface of the opening 11H4, following which a predetermined material (a material A) serving as the in-pixel separation section 14 is embedded in the opening 11H4, and the surface is planarized by, for example, CMP.

It is to be noted that, as described above, in the case of changing materials included in the in-pixel separation section 14 depending on the wavelength of the light to be photoelectrically converted in each unit pixel P, the in-pixel separation section 14 is differently formed as follows.

Figure 28F:
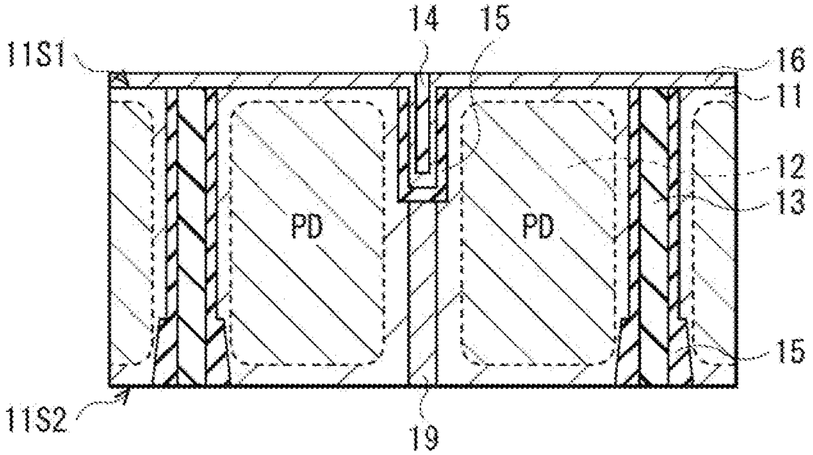
FIG. 28F is a schematic cross-sectional view of a step subsequent to FIG. 28E.
Figure 28G:
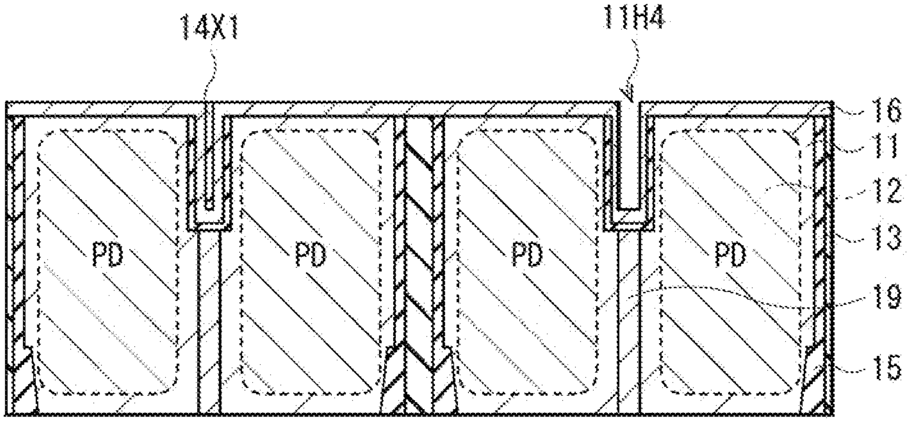
FIG. 28G is a schematic cross-sectional view of a step subsequent to FIG. 28F.

For example, as illustrated in FIG. 28F, the fixed charge layer 16 is formed, and a material included in the in-pixel separation section 14 is embedded in the opening 11H4, following which, for example, a mask is formed at a position, on the in-pixel separation section 14 (an in-pixel separation section 14X1), other than a position where an in-pixel separation section 14X2 is to be formed. As illustrated in FIG. 28G, the material A embedded in an opening 11H4' is removed by, for example, wet etching or dry etching.

Figure 28H:
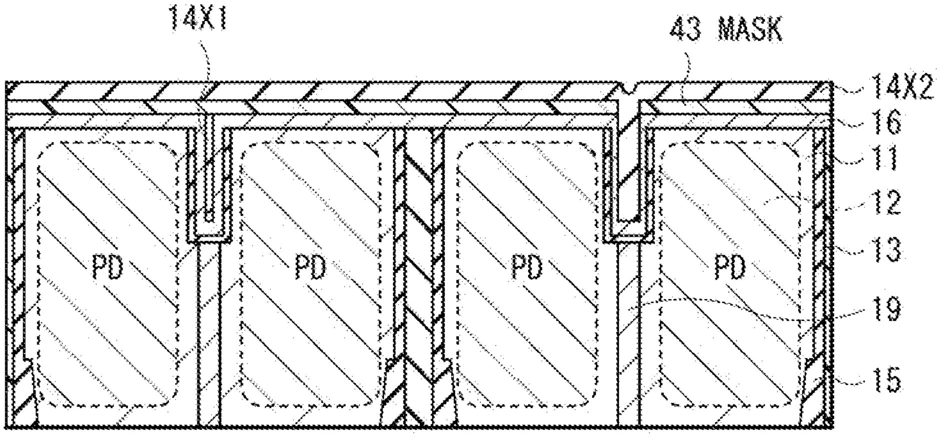
FIG. 28H is a schematic cross-sectional view of a step subsequent to FIG. 28G.
Figure 28I:
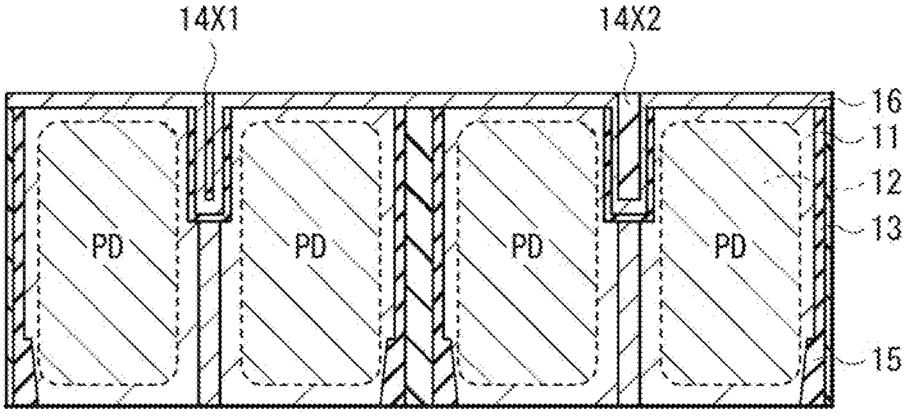
FIG. 28I is a schematic cross-sectional view of a step subsequent to FIG. 28H.

Thereafter, as illustrated in FIG. 28H, the mask 43 is formed on the fixed charge layer 16 formed on the first surface 11S1 of the semiconductor substrate 11, following which a predetermined material (a material B) serving as the in-pixel separation section 14X2 is embedded in the opening 11H4'. Thereafter, as illustrated in FIG. 28I, the mask 43 is removed by, for example, CMP, and the surface of the fixed charge layer 16 is planarized.

Thereafter, similarly to the foregoing embodiment, the color filter 21, the light-shielding section 22, the planarization layer 23, and the lens layer 24 are sequentially formed. Thus, the imaging device 1G illustrated in FIGS. 24 and 26 is completed.

2-12. Modification Example 12

Figure 29:
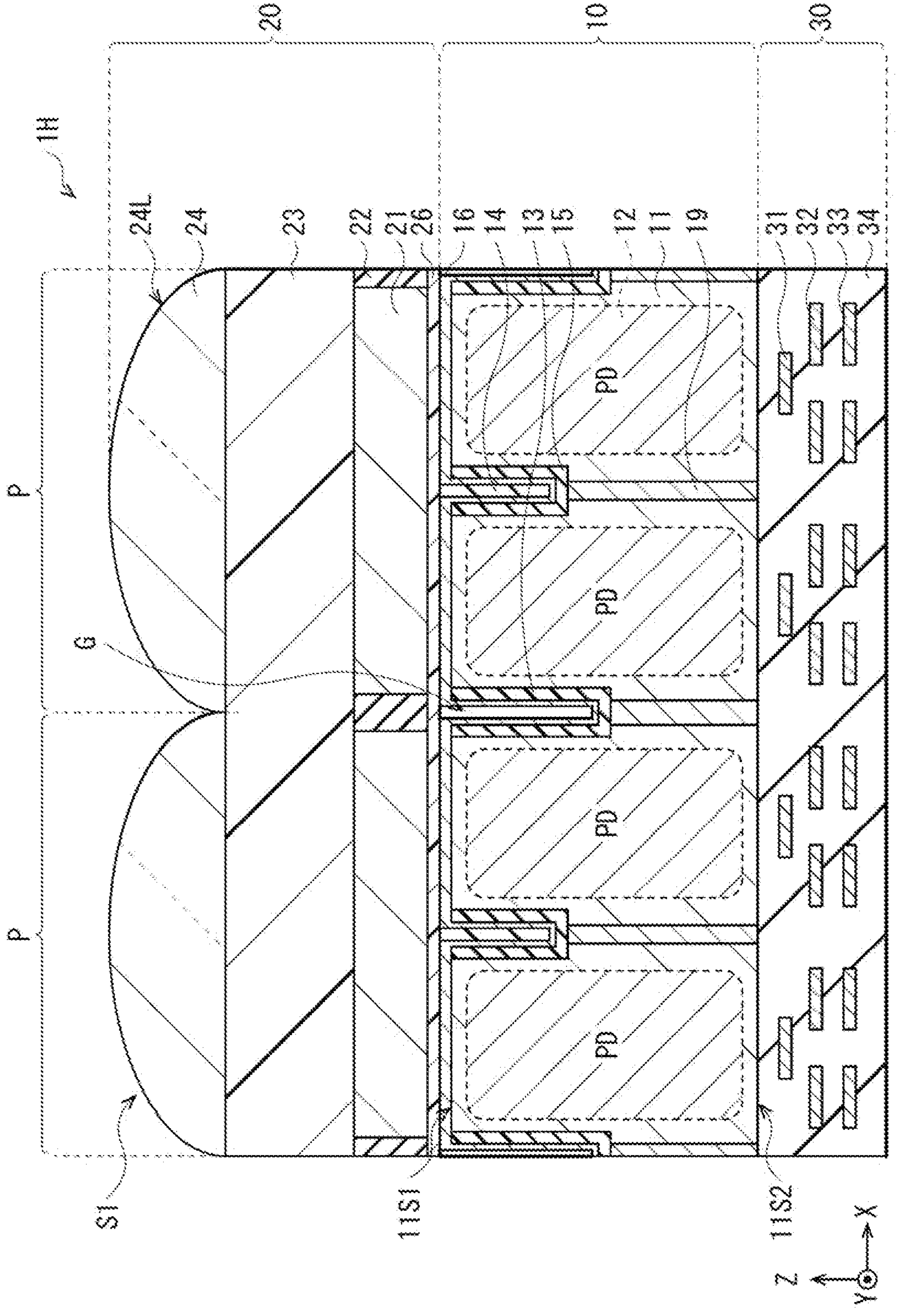
FIG. 29 is a schematic cross-sectional view of an example of a configuration of an imaging device according to Modification Example 12 of the present disclosure.

FIG. 29 schematically illustrates an example of a cross-sectional configuration of an imaging device (an imaging device 1H) according to Modification Example 12 of the present disclosure. The imaging device 1H is a CMOS image sensor or the like to be used, for example, in an electronic apparatus such as a digital still camera or a video camera. Similarly to the foregoing embodiment, the imaging device 1H is, for example, a so-called back-illuminated imaging device.

Modification Example 11 described above indicates the example in which the in-pixel separation section 14 has the RDTI structure; however, as illustrated in FIG. 29, both the inter-pixel separation section 13 and the in-pixel separation section 14 may each have the RDTI structure.

The inter-pixel separation section 13 and the in-pixel separation section 14 each having the RDTI structure may be formed in a similar manner as the in-pixel separation section 14 (14X1, 14X2) of Modification Example 11 described above. First, the diffusion region 19 and the photoelectric conversion section 12 are formed by, for example, ion-implantation activation from the side of the second surface 11S2 of the semiconductor substrate 11, at a position where the inter-pixel separation section 13 and the in-pixel separation section 14 are to be formed. Thereafter, the semiconductor substrate 11 is inverted, and the first surface 11S1 of the semiconductor substrate 11 is ground by, for example, CMP, to form a thin film.

Figure 30A:
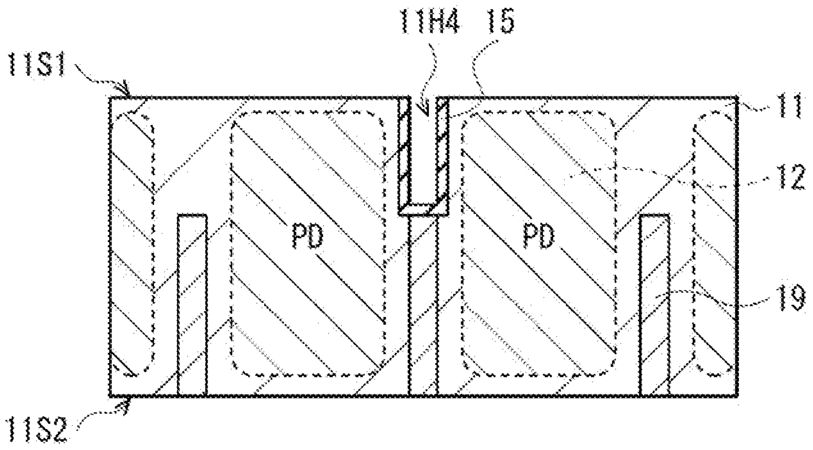
FIG. 30A is a schematic cross-sectional view for describing a method of manufacturing an inter-pixel separation section and an in-pixel separation section illustrated in FIG. 29.
Figure 30B:
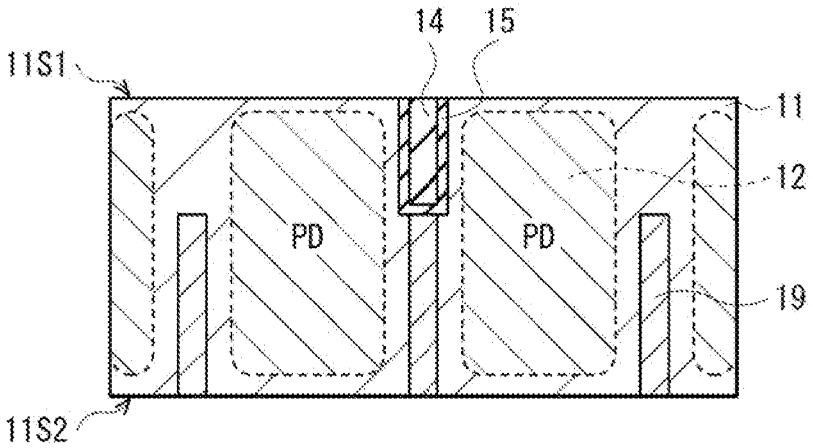
FIG. 30B is a schematic cross-sectional view of a step subsequent to FIG. 30A.
Figure 30C:
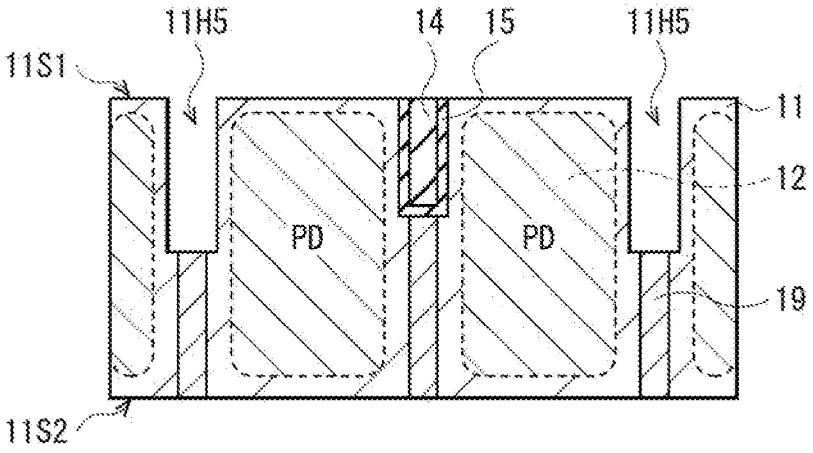
FIG. 30C is a schematic cross-sectional view of a step subsequent to FIG. 30B.

Thereafter, as illustrated in FIG. 30A, the opening 11H4 to be the RDTI is formed by, for example, RIE, from the side of the first surface 11S1 of the semiconductor substrate 11 at a position where the in-pixel separation section 14 is to be formed. Thereafter, as illustrated in FIG. 30B, the insulating film 15 is formed on the side surface and the bottom surface of the opening 11H4, following which a predetermined material serving as the in-pixel separation section 14 is embedded in the opening 11H4, and the surface is planarized by, for example, CMP. Thereafter, a mask is formed on the first surface 11S1 of the semiconductor substrate 11, and as illustrated in FIG. 30C, an opening 11H5 to be the RDTI is formed by, for example, RIE, at a position where the inter-pixel separation section 13 is to be formed.

Figure 30D:
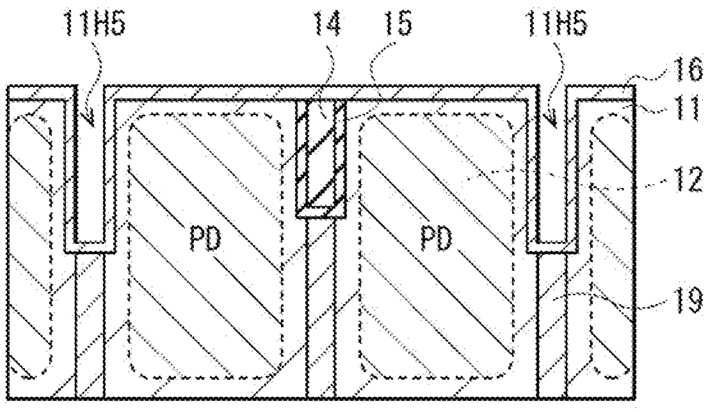
FIG. 30D is a schematic cross-sectional view of a step subsequent to FIG. 30C.
Figure 30E:
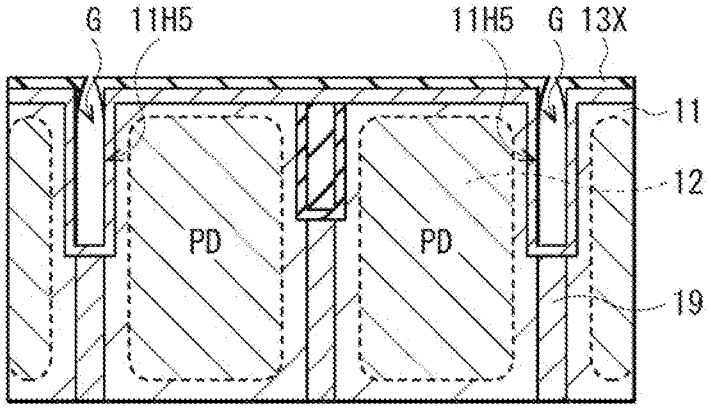
FIG. 30E is a schematic cross-sectional view of a step subsequent to FIG. 30D.
Figure 30F:
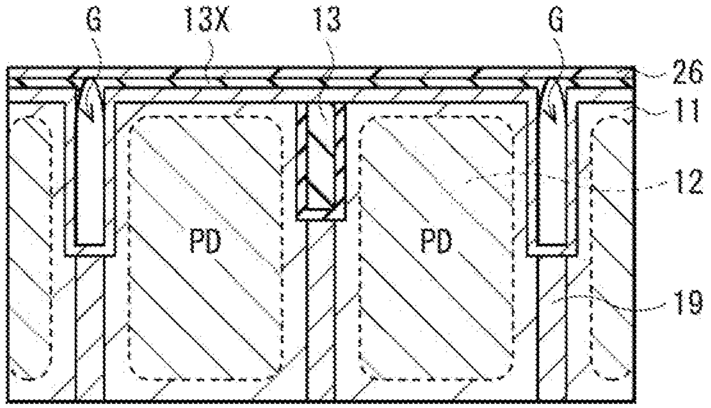
FIG. 30F is a schematic cross-sectional view of a step subsequent to FIG. 30E.

Thereafter, as illustrated in FIG. 30D, the fixed charge layer 16 is formed on the first surface 11S1 of the semiconductor substrate 11 and on the side surface and the bottom surface of the opening 11H4, following which a predetermined material serving as the inter-pixel separation section 13 is embedded in the opening 11H5, and the surface is planarized by, for example, CMP. In the case where the inter-pixel separation section 13 includes the gap G, as illustrated in FIG. 30E, for example, a layer 13X including a predetermined material serving as the inter-pixel separation section 13 is formed on the fixed charge layer 16 by, for example, CVD to form the gap G inside the opening 11H5. Thereafter, as illustrated in FIG. 30F, a protective layer 26 including, for example, silicon oxide is formed on the first surface 11S1 of the semiconductor substrate 11 to close an upper part of the opening 11H5 (the gap G) in which the inter-pixel separation section 13 is formed.

Thereafter, similarly to the foregoing embodiment, the color filter 21, the light-shielding section 22, the planarization layer 23, and the lens layer 24 are sequentially formed. Thus, the imaging device 1H illustrated in FIG. 29 is completed.

2-13. Modification Example 13

Figure 31:
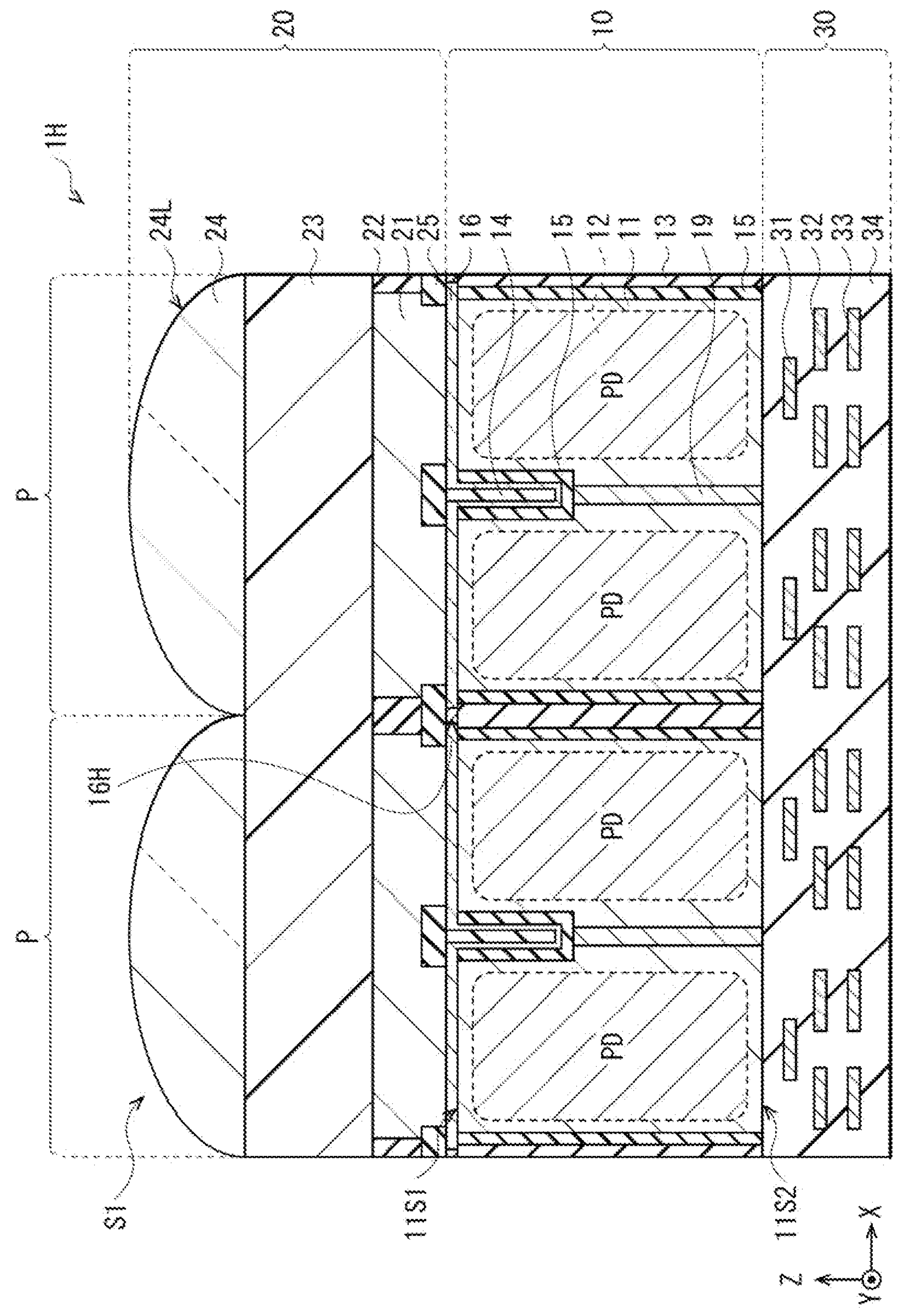
FIG. 31 is a schematic cross-sectional view of an example of a configuration of an imaging device according to Modification Example 13 of the present disclosure.

FIG. 31 schematically illustrates an example of a cross-sectional configuration of an imaging device (an imaging device 1I) according to Modification Example 13 of the present disclosure. The imaging device 1I is a CMOS image sensor or the like to be used, for example, in an electronic apparatus such as a digital still camera or a video camera. Similarly to the foregoing embodiment, the imaging device 1I is, for example, a so-called back-illuminated imaging device.

Figure 32:
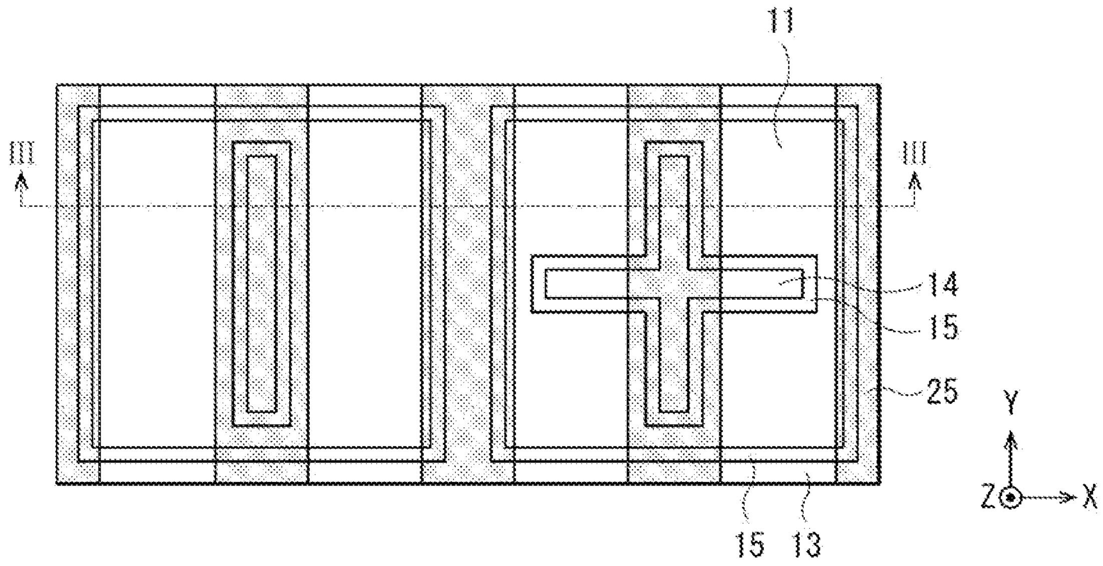
FIG. 32 is a plan schematic view of an example of the configuration of the imaging device illustrated in FIG. 31.

As illustrated in FIG. 31, for example, an electrode 25 may be provided above each of the inter-pixel separation section 13 and the in-pixel separation section 14. Specifically, for example, the electrodes 25 are provided on the fixed charge layer 16, and the inter-pixel separation section 13 and the in-pixel separation section 14 are electrically coupled to the respective electrodes 25 via respective openings 16H provided in the fixed charge layer 16. As illustrated in FIG. 32, for example, the electrode 25 is provided above the inter-pixel separation section 13 and the in-pixel separation section 14 and extends in a Y-axis direction.

Figure 33:
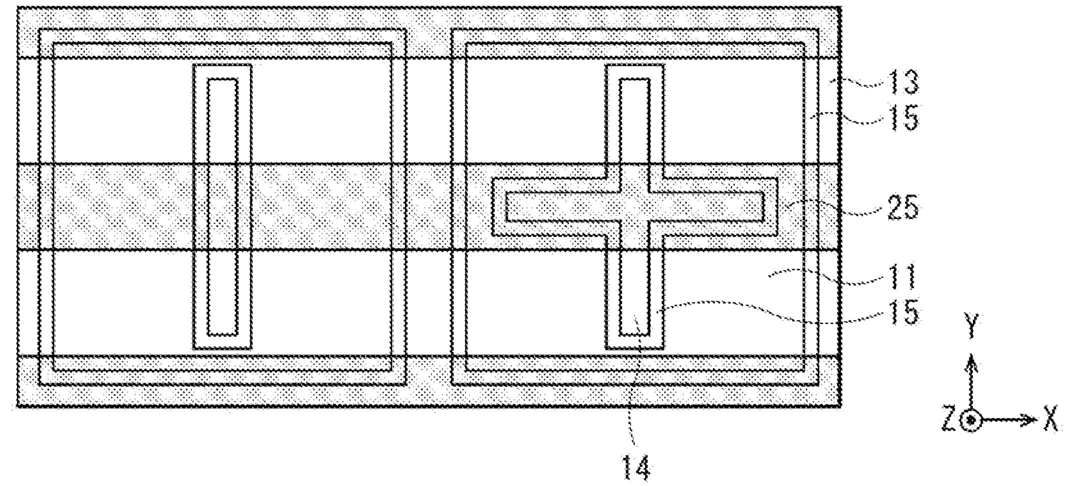
FIG. 33 is a schematic view of another example of a plane configuration of the imaging device according to Modification Example 13 of the present disclosure.
Figure 34:
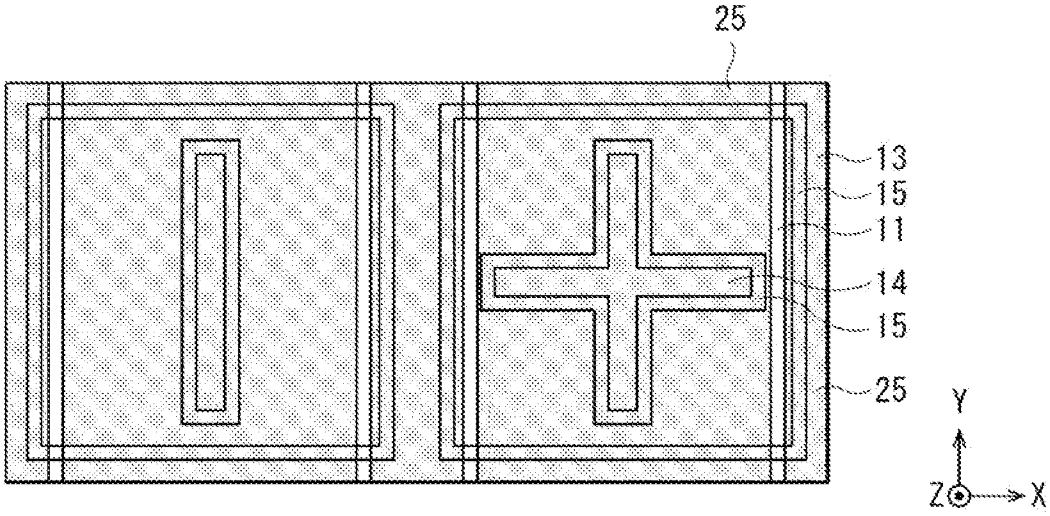
FIG. 34 is a schematic view of another example of the plane configuration of the imaging device according to Modification Example 13 of the present disclosure.
Figure 35:
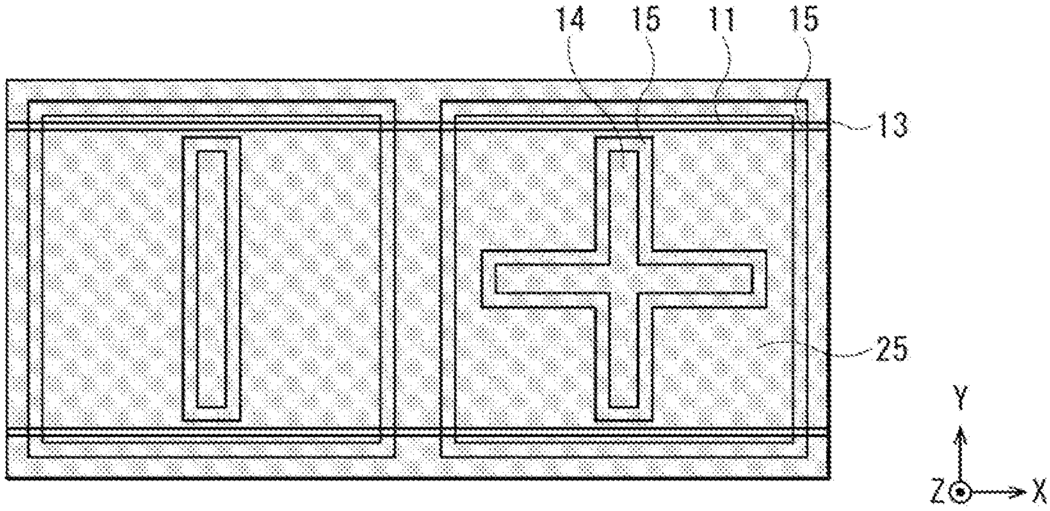
FIG. 35 is a schematic view of another example of the plane configuration of the imaging device according to Modification Example 13 of the present disclosure.

The electrode 25 preferably includes a light-transmissive electrically conductive material, but is not limited thereto depending on a layout of the electrode 25. The following may be given as a layout example of the electrode 25, in addition to the layout illustrated in FIG. 32. As illustrated in FIG. 33, for example, the electrode 25 may be provided above the inter-pixel separation section 13 and the in-pixel separation section 14 and extend in the X-axis direction. Alternatively, as illustrated in FIG. 34, for example, the electrode 25 provided above the in-pixel separation section 14 and extending in the Y-axis direction may also extend in the X-axis direction in such a manner as to cover substantially the entire surface of the unit pixel P. Similarly, as illustrated in FIG. 35, for example, the electrode 25 provided above the in-pixel separation section 14 and extending in the X-axis direction may also extend in the Y-axis direction in such a manner as to cover substantially the entire surface of the unit pixel P.

As described above, providing the electrode 25 above each of the inter-pixel separation section 13 and the in-pixel separation section 14 and applying, for example, a negative bias to the inter-pixel separation section 13 and the in-pixel separation section 14, increases knobs for optimizing pixel performance, and makes it possible to improve a pixel characteristic.

2-14. Modification Example 14

FIGS. 36 to 40 each illustrate another example of the layout of the unit pixels P and the on-chip lenses 24L according to a modification example (Modification Example 14) of the above-described embodiment.

Figure 36:
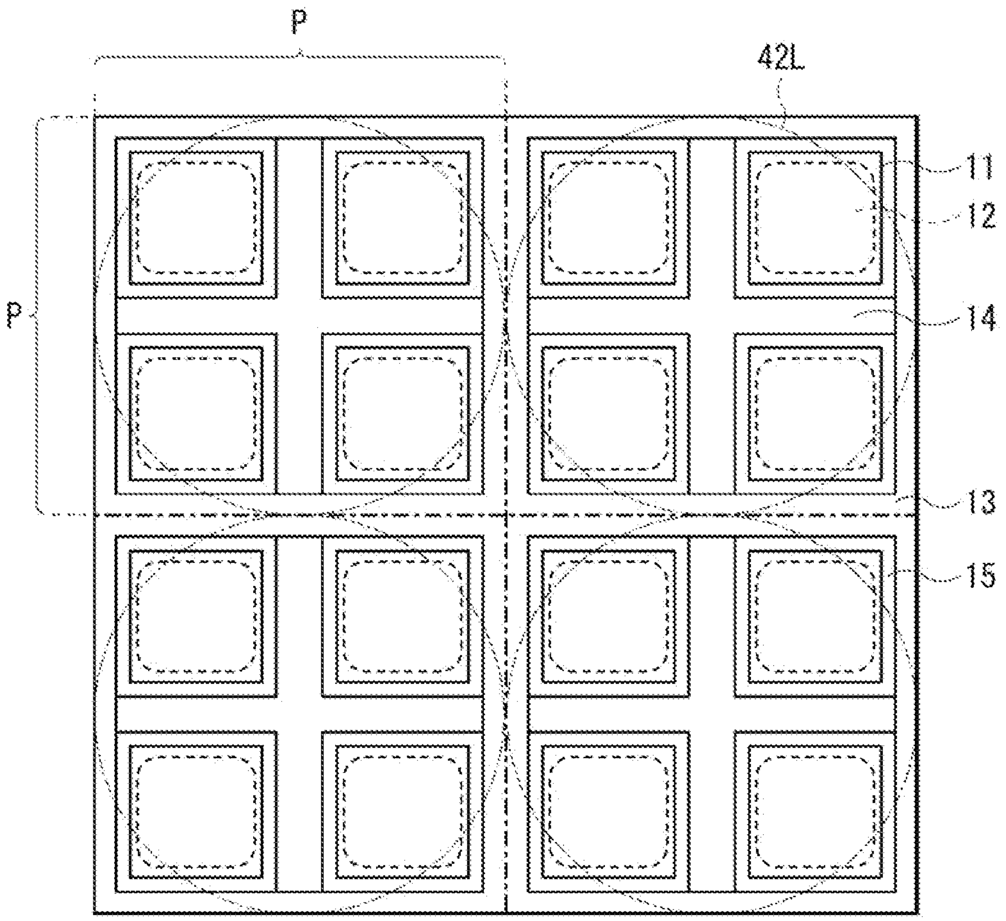
FIG. 36 is a plan schematic view of an example of a layout of unit pixels and on-chip lenses according to Modification Example 14 of the present disclosure.
Figure 37:
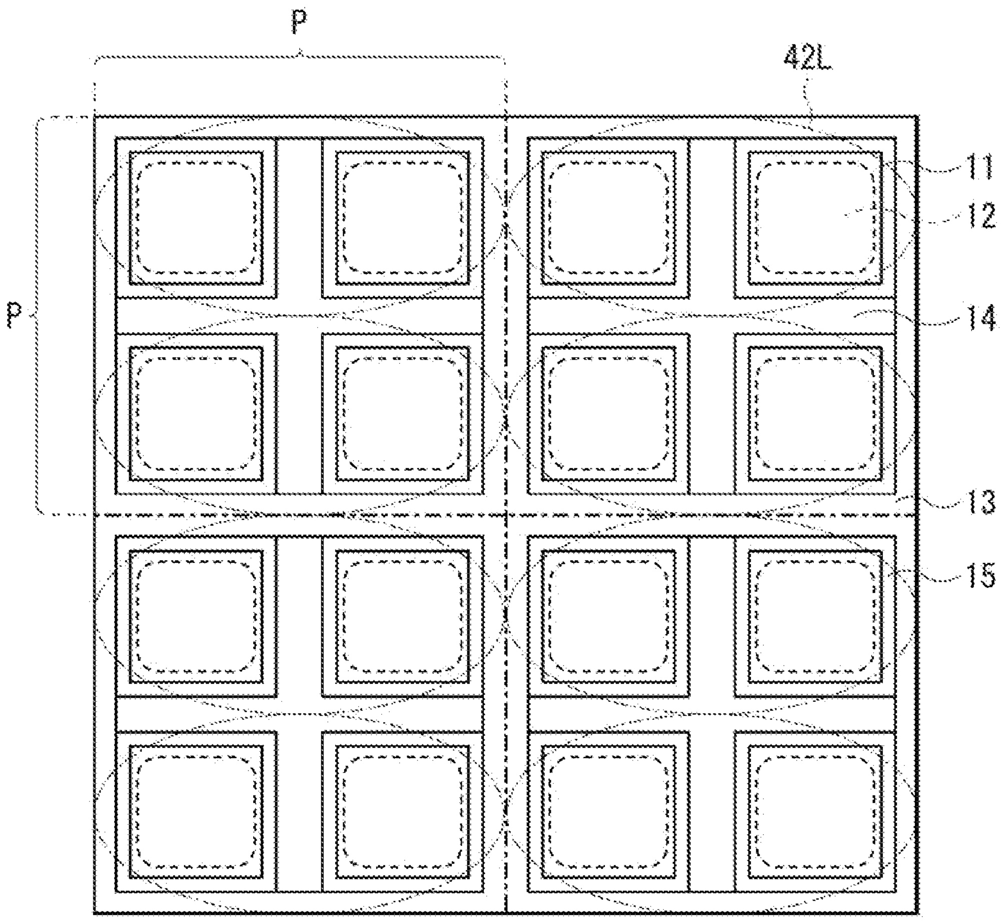
FIG. 37 is a plan schematic view of another example of the layout of the unit pixels and the on-chip lenses according to Modification Example 14 of the present disclosure.

For example, the photoelectric conversion sections 12 inside the unit pixel P may have a layout in which two photoelectric conversion sections are disposed in parallel as illustrated in FIG. 2, and may also have a layout in which four photoelectric conversion sections 12 are disposed in 2 rows×2 columns as illustrated in FIG. 36, for example. Further, as illustrated in FIG. 37, for example, for the unit pixel P, one on-chip lens 24L may be disposed for two adjacent photoelectric conversion sections 12 inside the unit pixel P.

Figure 38:
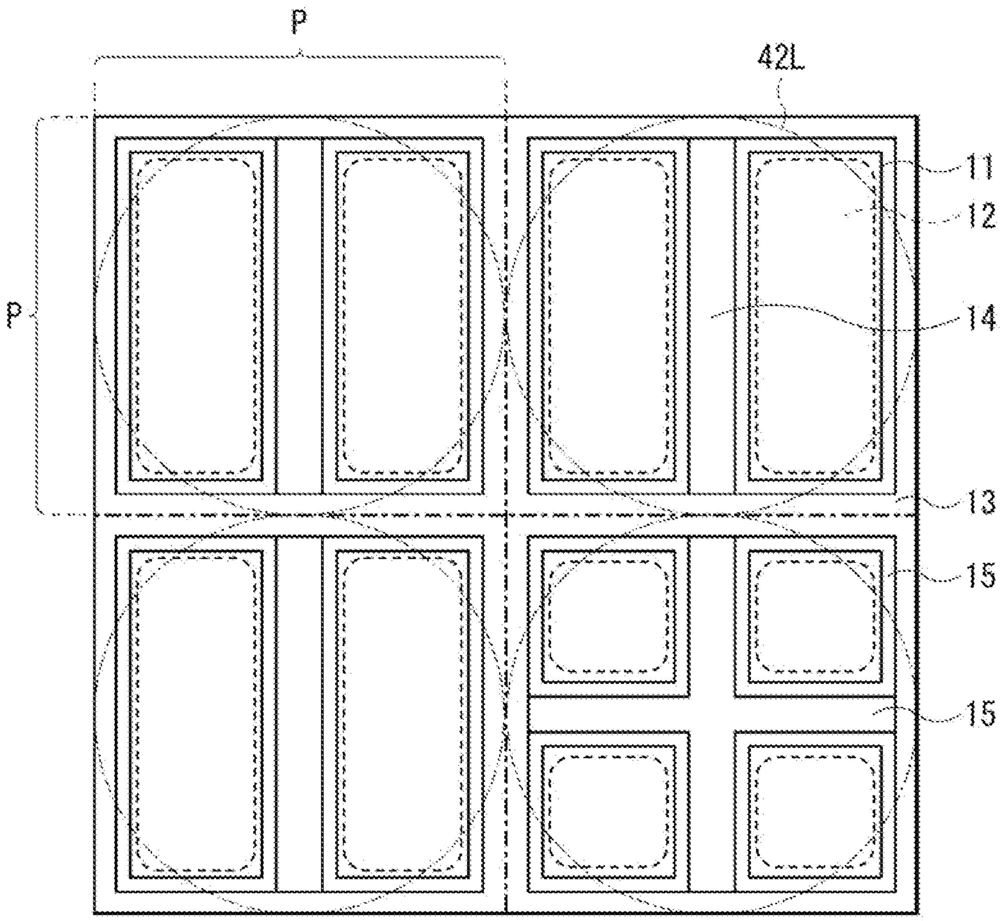
FIG. 38 is a plan schematic view of another example of the layout of the unit pixels and the on-chip lenses according to Modification Example 14 of the present disclosure.

Further, the number of photoelectric conversion sections 12 inside the unit pixel P do not necessarily have to be the same in all pixels. As illustrated in FIG. 38, for example, the unit pixel P that photoelectrically converts the red light (R) and the green light (G) each having a relatively long wavelength may include two photoelectric conversion sections disposed in 2 rows×1 column, and the unit pixel P that photoelectrically converts the blue light (B) having a relatively short wavelength may include four photoelectric conversion sections 12 disposed in 2 rows×2 columns.

Figure 39:
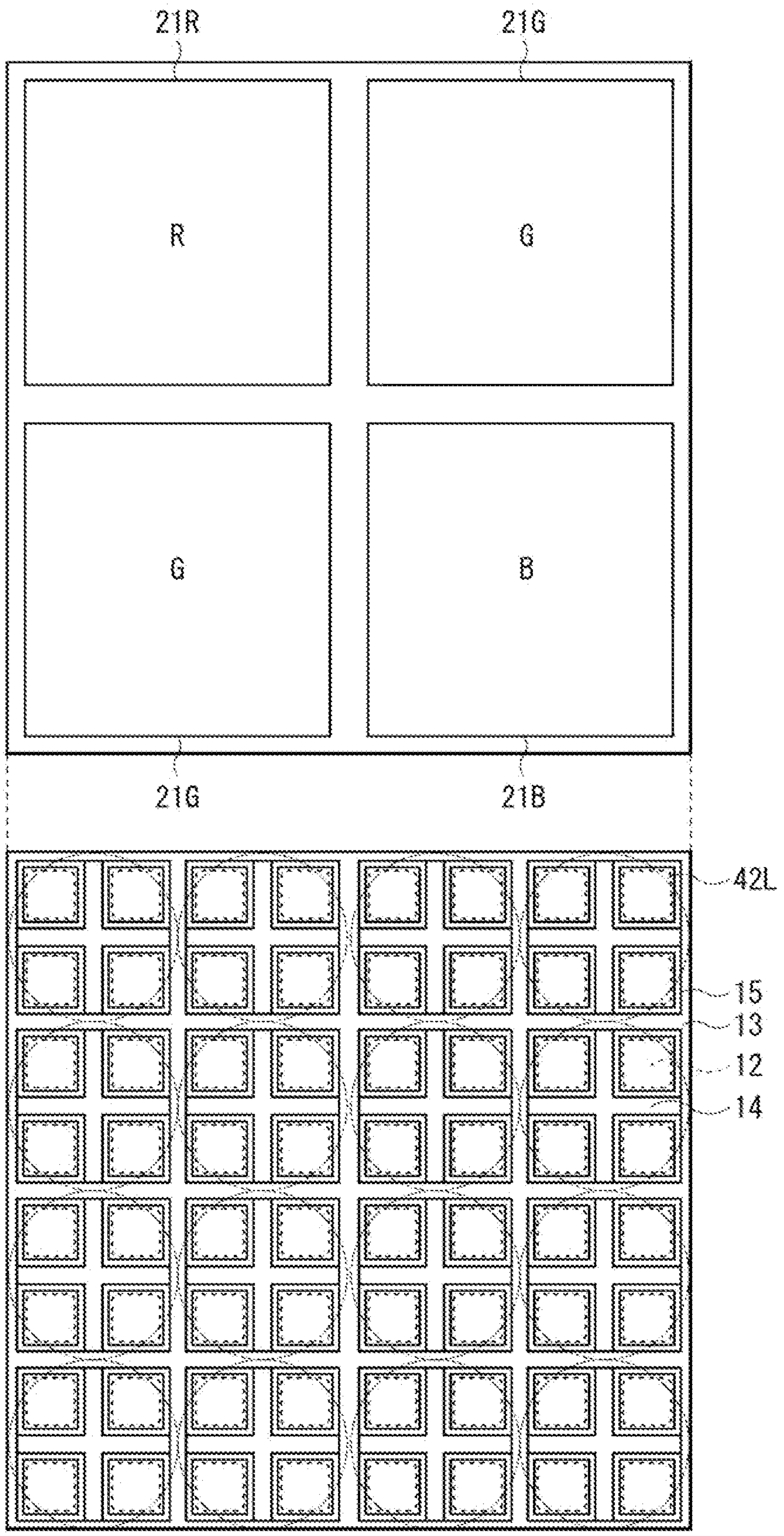
FIG. 39 is a plan schematic view of another example of the layout of the unit pixels and the on-chip lenses according to Modification Example 14 of the present disclosure.

Further, Modification Example 3 and the like described above indicate the example in which the color filters 21R, 21G, and 21B are disposed one by one in one unit pixel P; however, the present disclosure is not limited thereto. As illustrated in FIG. 39, for example, the color filters 21R, 21G, and 21B may be disposed one by one over the plurality of unit pixels P (for example, four unit pixels P).

Figure 40:
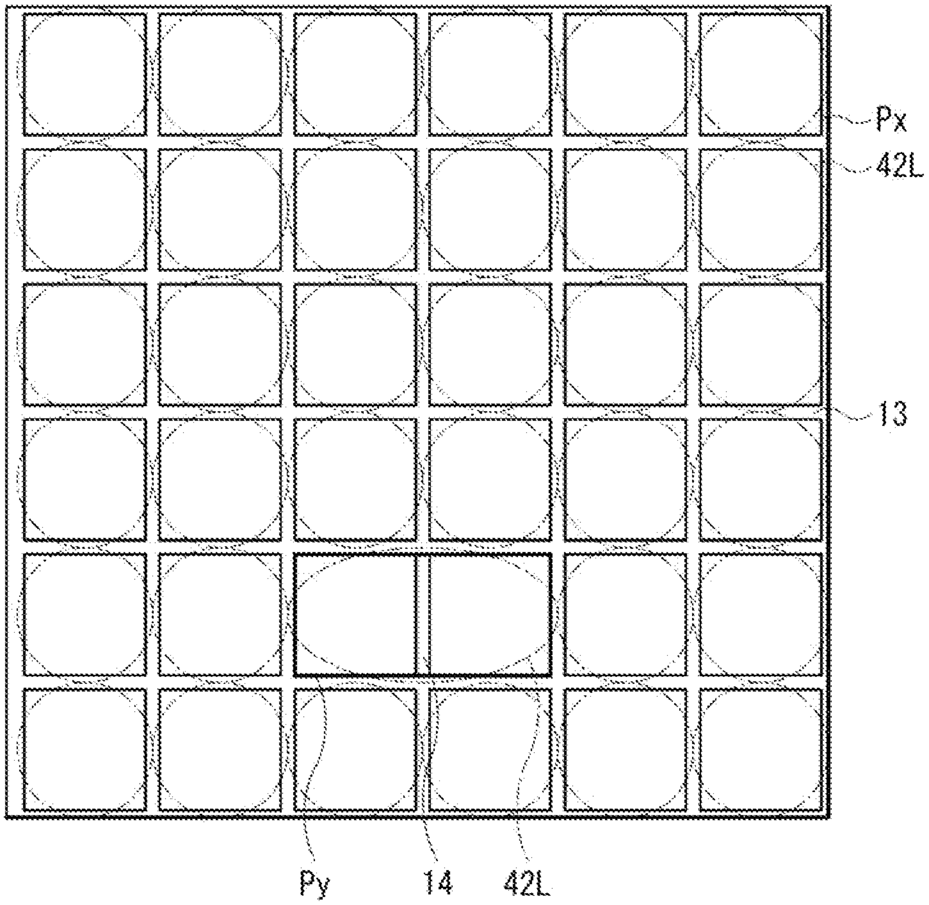
FIG. 40 is a plan schematic view of another example of the layout of the unit pixels and the on-chip lenses according to Modification Example 14 of the present disclosure.

Still further, the embodiment and the like described above indicate the example in which the unit pixels P that are able to acquire the imaging information and the parallax information simultaneously are two-dimensionally arranged in a matrix in a pixel section 100A; however, the unit pixels P that are able to acquire the imaging information and the parallax information simultaneously may be discretely arranged inside pixel section 100A. Specifically, as illustrated in FIG. 40, for example, a unit pixel Py that is able to acquire the parallax information may be disposed in a portion of the pixel section 100A in which unit pixels Px that acquire the imaging information are two-dimensionally arranged in a matrix.

2-15. Modification Example 15

Figure 41:
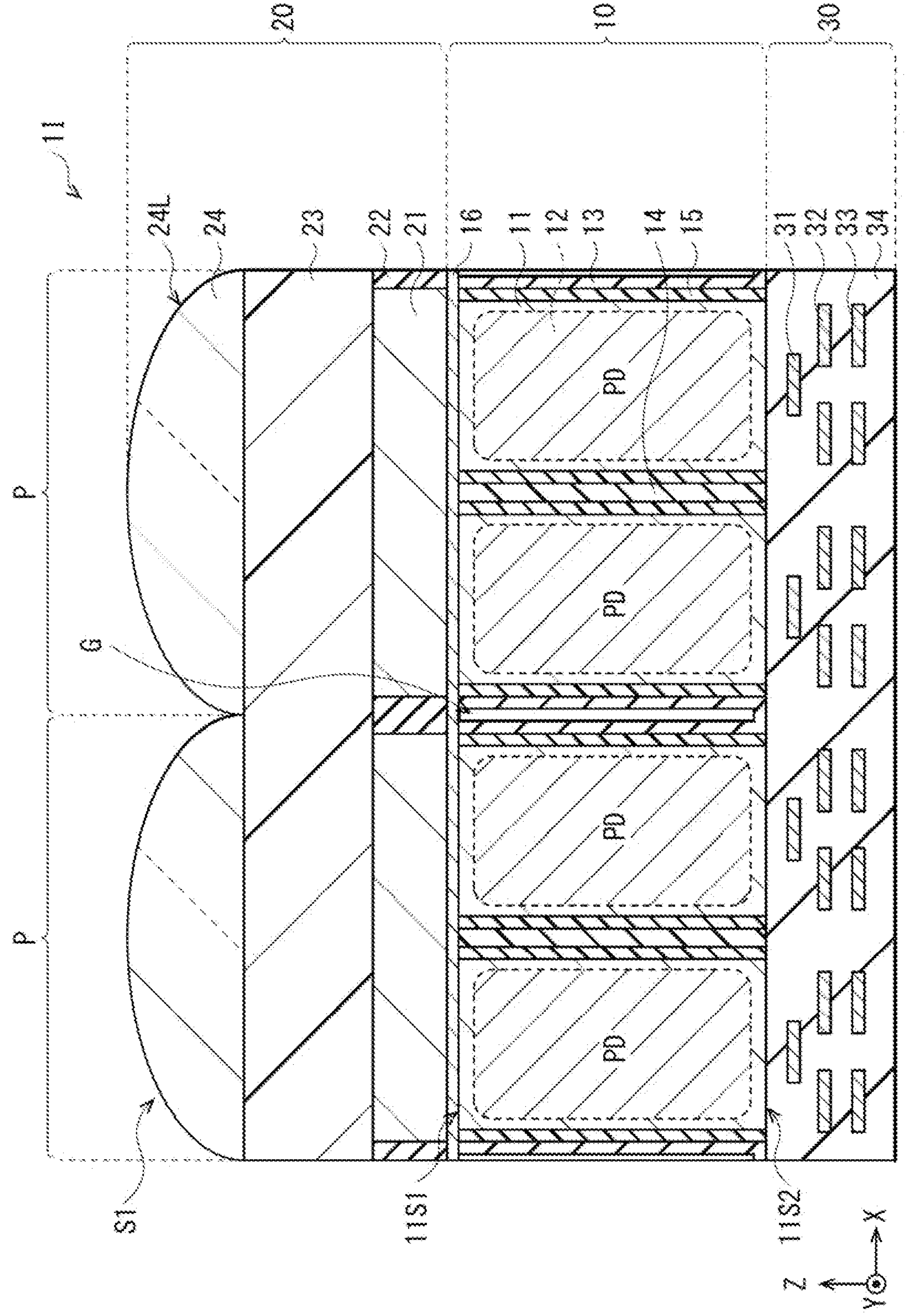
FIG. 41 is a schematic cross-sectional view of an example of a configuration of an imaging device according to Modification Example 15 of the present disclosure.
Figure 42:
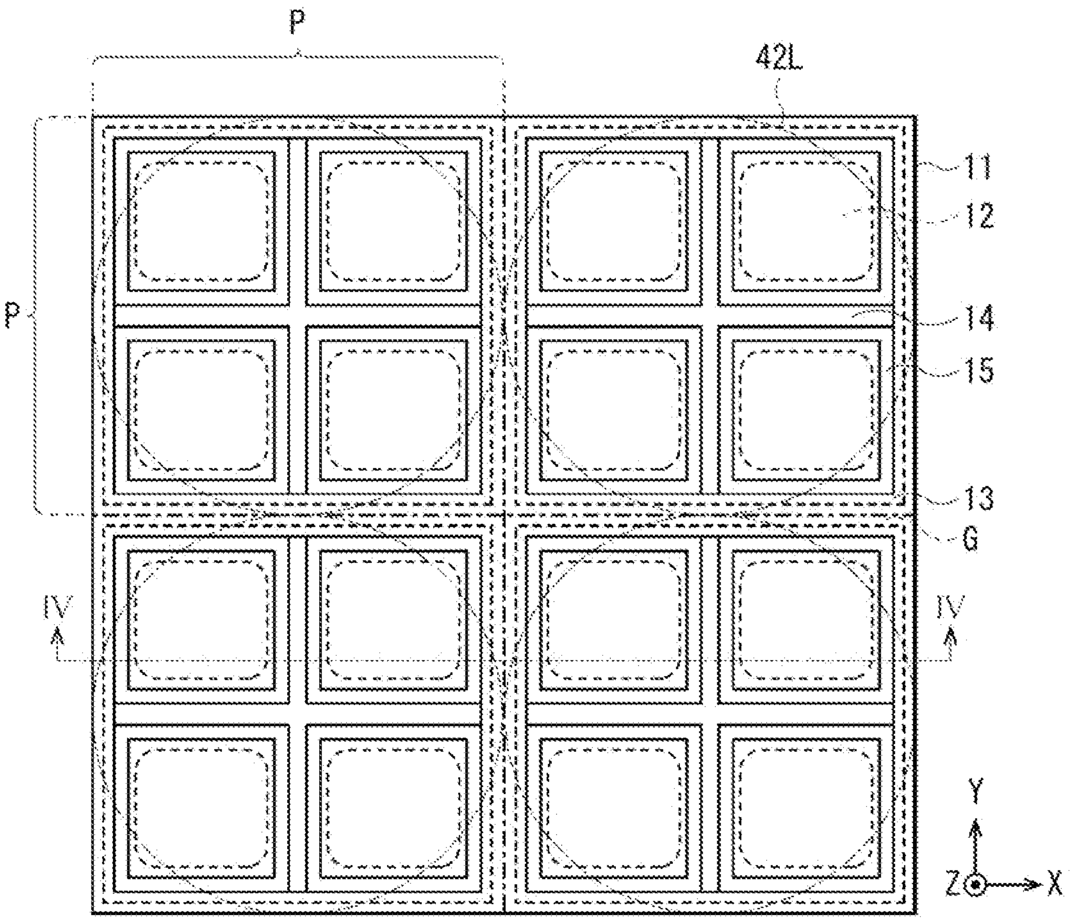
FIG. 42 is a plan schematic view of an example of the configuration of the imaging device illustrated in FIG. 41.

FIG. 41 schematically illustrates an example of a cross-sectional configuration of an imaging device (an imaging device 1I) according to Modification Example 15 of the present disclosure. FIG. 42 schematically illustrates an example of a plane configuration of the imaging device 1 illustrated in FIG. 41, and FIG. 41 illustrates a cross section taken along a line IV-IV indicated in FIG. 42. The imaging device 1I is a CMOS image sensor or the like to be used, for example, in an electronic apparatus such as a digital still camera or a video camera. Similarly to the foregoing embodiment, the imaging device 1I is, for example, a so-called back-illuminated imaging device.

Modification Example 3 described above indicates the example in which the width of the in-pixel separation section 14 is narrower than the width of the inter-pixel separation section 13, and Modification Example 12 indicates the example in which the gap G is formed inside the inter-pixel separation section 13; however, it is possible to combine these examples.

The inter-pixel separation section 13 and the in-pixel separation section 14 according to the present modification example may be formed, for example, as follows.

Figure 43A:
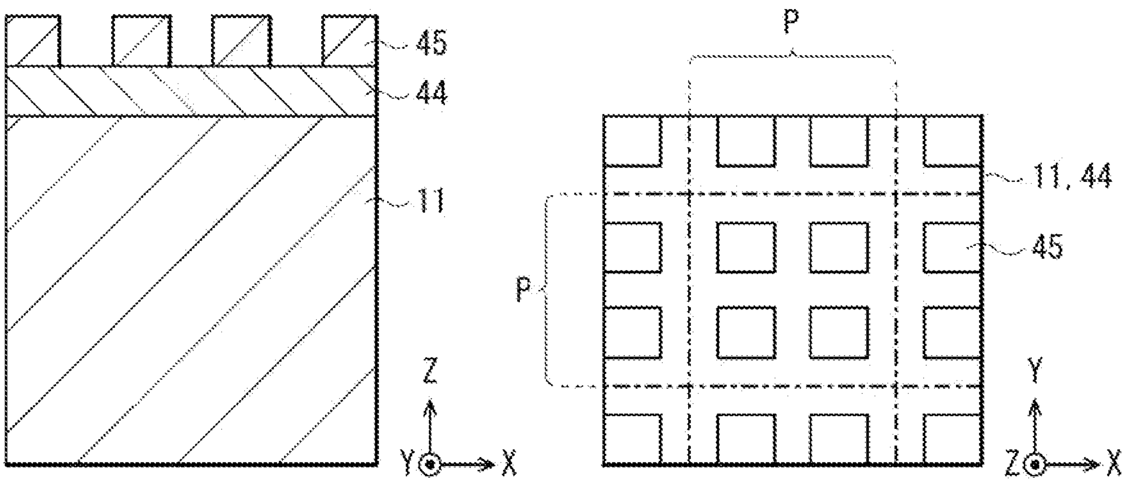
FIG. 43A is a schematic cross-sectional view for describing a method of manufacturing an inter-pixel separation section and an in-pixel separation section illustrated in FIG. 41.
Figure 43B:
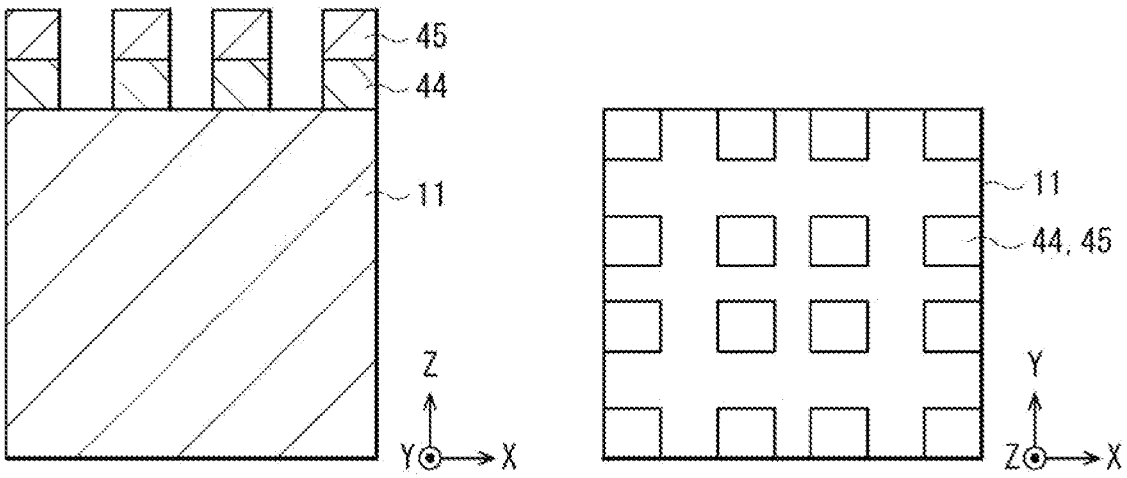
FIG. 43B is a schematic cross-sectional view of a step subsequent to FIG. 43A.

First, as illustrated in FIG. 43A, a film of a hard mask 44 is formed on the first surface 11S1 of the semiconductor substrate 11. Thereafter, a resist film 45 is formed on the hard mask 44 by photolithography technology. The resist film 45 is patterned in such a manner that a line width inside the unit pixel P where the in-pixel separation section 14 is to be formed is narrower than a line width between the adjacent unit pixels P where the inter-pixel separation section 13 is to be formed. Thereafter, as illustrated in FIG. 43B, the hard mask 44 is processed by, for example, dry etching.

Figure 43C:
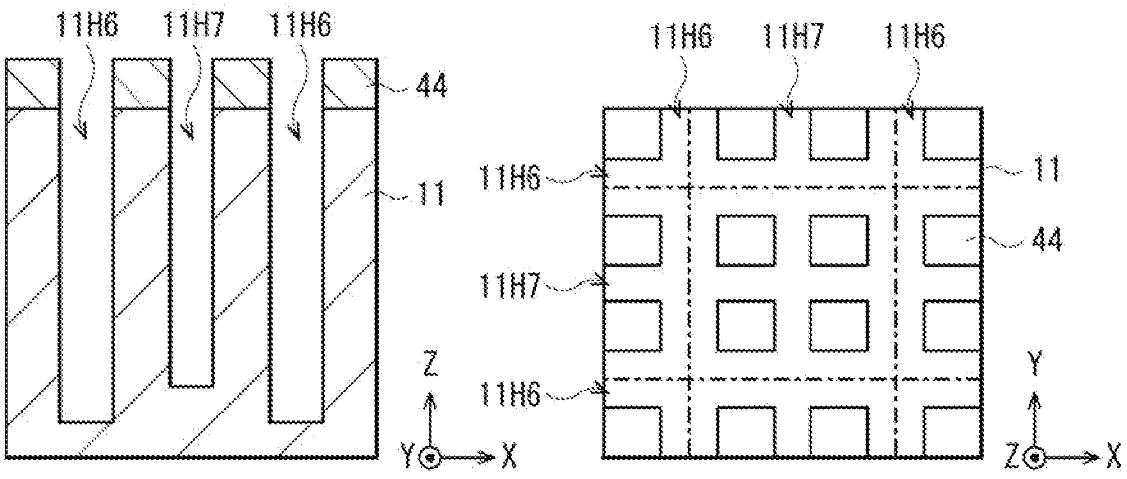
FIG. 43C is a schematic cross-sectional view of a step subsequent to FIG. 43B.
Figure 43D:
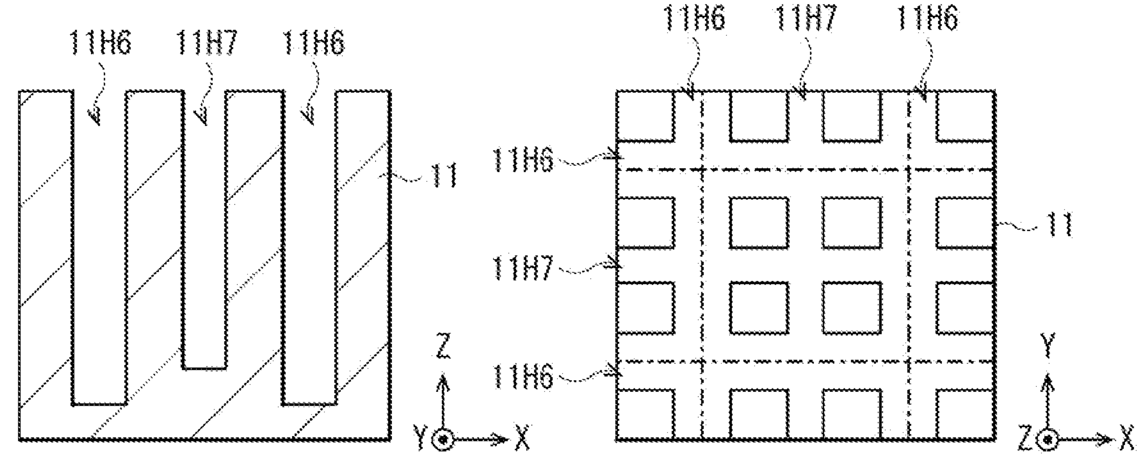
FIG. 43D is a schematic cross-sectional view of a step subsequent to FIG. 43C.

Thereafter, as illustrated in FIG. 43C, the semiconductor substrate 11 is processed by, for example, dry-etching to form an opening 11H6 for forming the inter-pixel separation section 13 and an opening 11H7 for forming the in-pixel separation section 14. Thereafter, as illustrated in FIG. 43D, the hard mask 44 is removed.

Figure 43E:
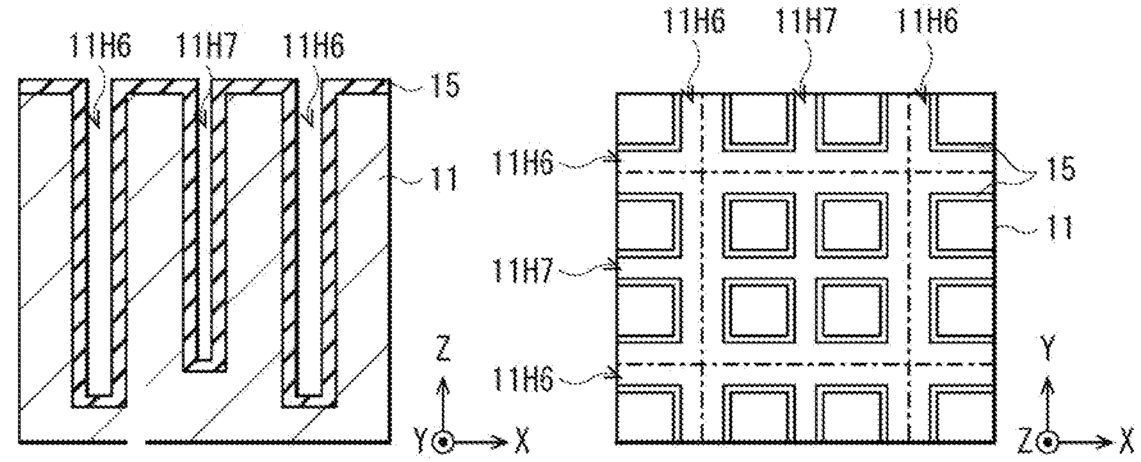
FIG. 43E is a schematic cross-sectional view of a step subsequent to FIG. 43D.
Figure 43F:
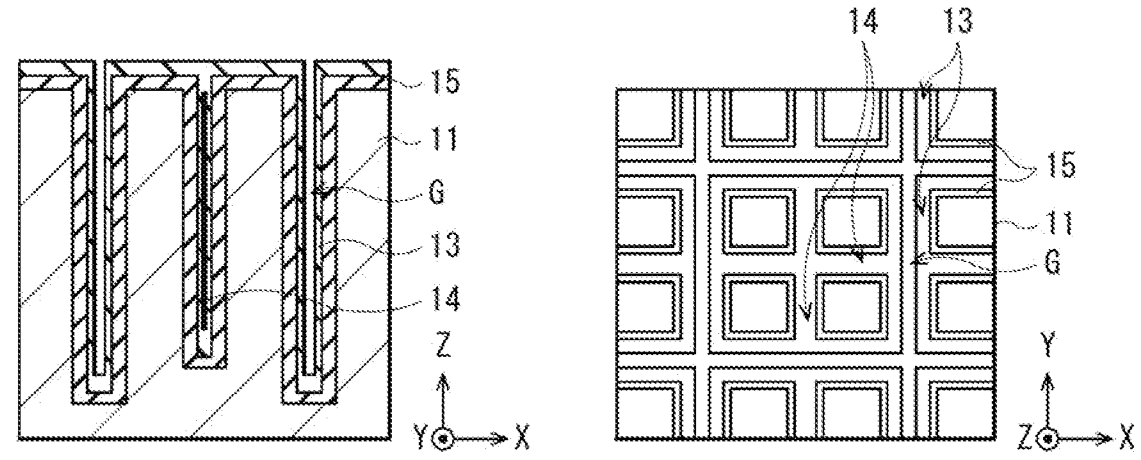
FIG. 43F is a schematic cross-sectional view of a step subsequent to FIG. 43E.

Thereafter, as illustrated in FIG. 43E, for example, an aluminum oxide film is formed to form the insulating film 15 that covers the first surface 11S1 of the semiconductor substrate 11 and the respective side surfaces and the respective bottom surfaces of the openings 11H6 and 11H7. Thereafter, as illustrated in FIG. 43F, for example, a titanium oxide film is formed using, for example, an ALD method. As a result, the inter-pixel separation section 13 having the gap G is formed in the opening 11H6, and the in-pixel separation section 14 is formed in the opening 11H7 that is closed by the titanium oxide film.

Figure 44:
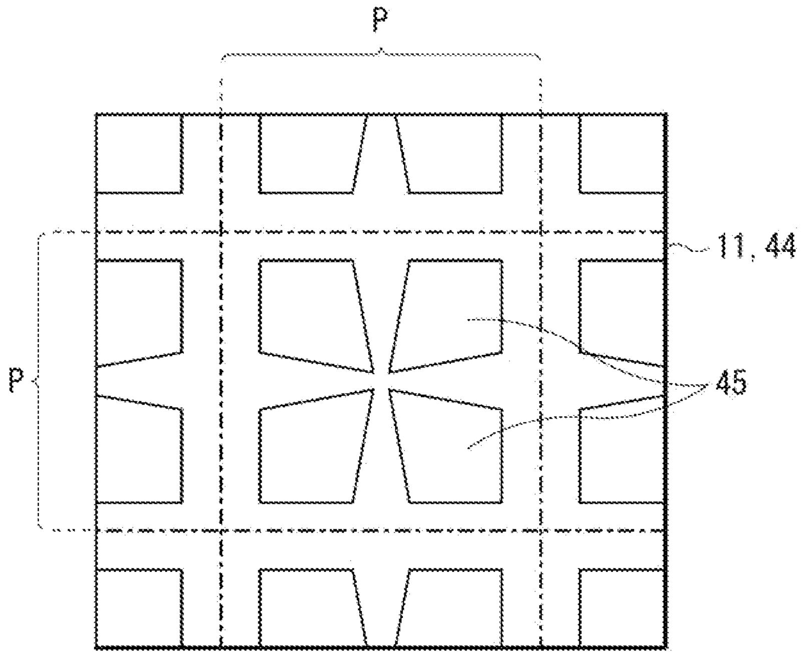
FIG. 44 is a plan schematic view of an example of a pattern of a resist film illustrated in FIG. 43A.
Figure 45:
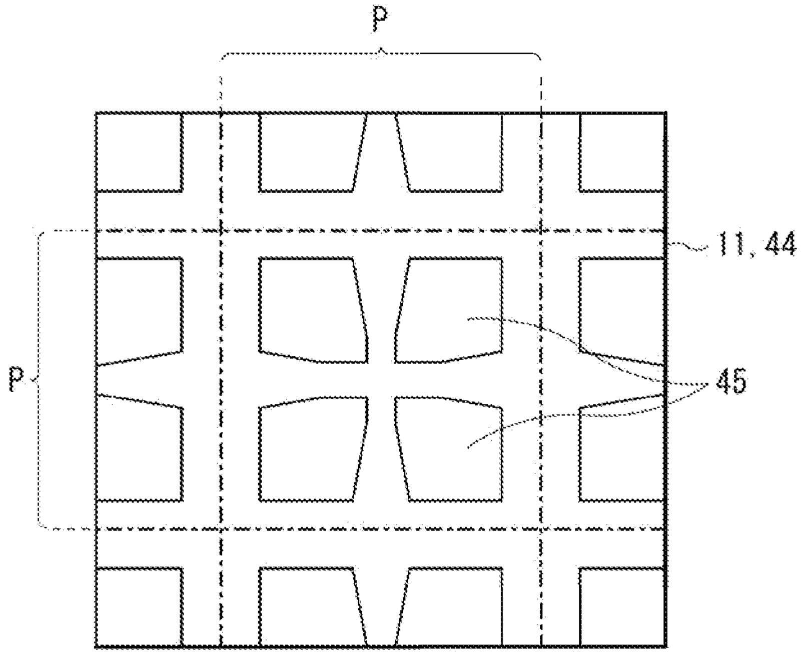
FIG. 45 is a plan schematic view of another example of the pattern of the resist film illustrated in FIG. 43A.

It is to be noted that FIG. 42 illustrates the in-pixel separation section 14 having a constant width, the present disclosure is not limited thereto. As illustrated in FIGS. 44 and 45, for example, patterning the resist film 45 makes it possible to form the in-pixel separation section 14 extending in the X-axis direction and the Y-axis direction in such a manner that the line width is narrower at and near an intersection thereof.

3. APPLICATION EXAMPLES

Figure 46:
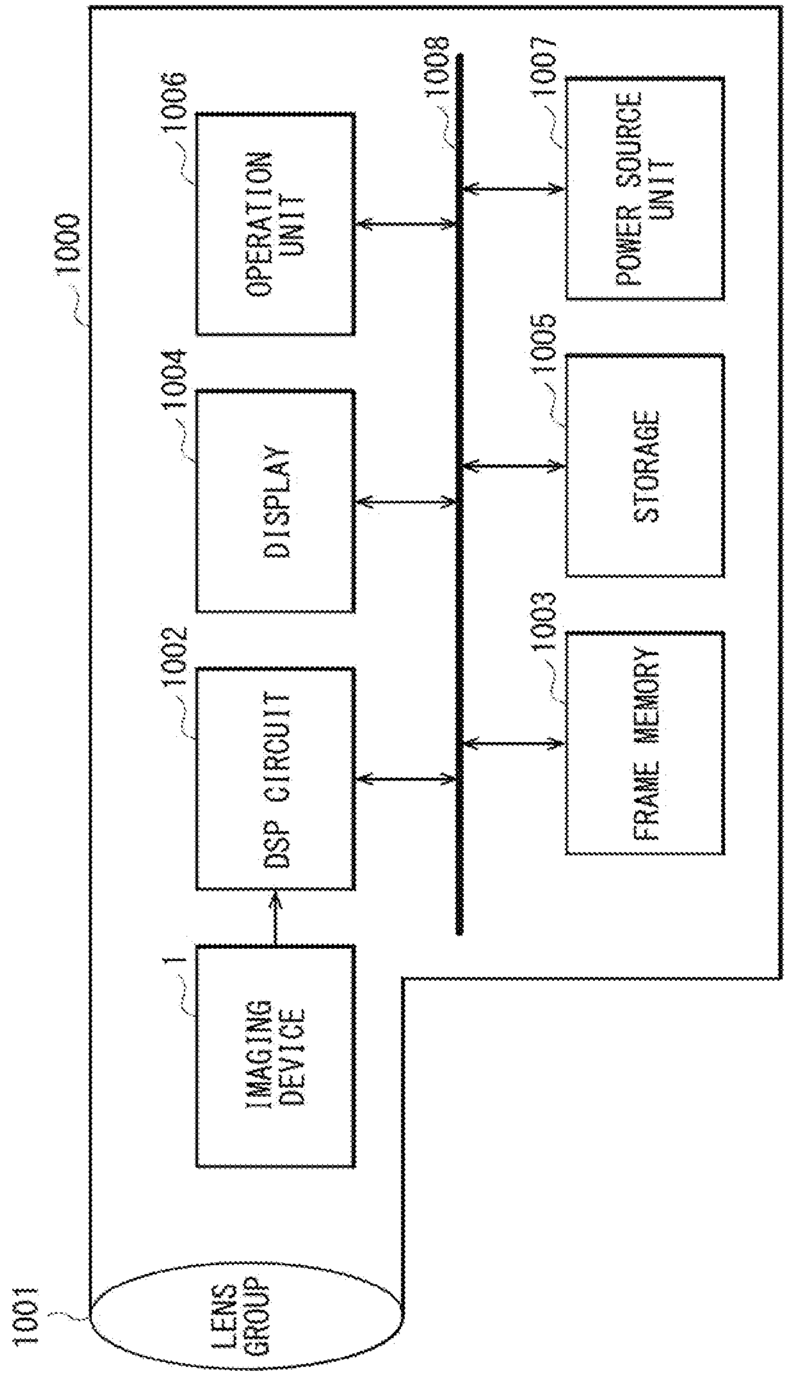
FIG. 46 is a block diagram illustrating a configuration example of an electronic apparatus including the imaging device illustrated in FIG. 3.

The imaging device 1 or the like described above is applicable to various types of electronic apparatuses each having an imaging function, examples of which include a camera system such as a digital still camera or a video camera, and a mobile telephone having an imaging function. FIG. 46 illustrates a schematic configuration of an electronic apparatus 1000.

The electronic apparatus 1000 includes, for example, a lens group 1001, the imaging device 1, a DSP (Digital Signal Processor) circuit 1002, a frame memory 1003, a display 1004, a recording unit 1005, an operation unit 1006, and a power source unit 1007, and they are coupled to each other via a bus line 1008.

The lens group 1001 captures incident light (image light) from a subject and forms an image on an imaging surface of the imaging device 1. The imaging device 1 converts an amount of incident light, which has been formed into an image on the imaging surface by the lens group 1001, into an electric signal in units of pixel, and supplies the electric signal to the DSP circuit 1002 as a pixel signal.

The DSP circuit 1002 is a signal processing circuit that processes a signal supplied from the imaging device 1. The DSP circuit 1002 outputs image data obtained by processing the signal supplied from the imaging device 1. The frame memory 1003 temporarily holds, in units of frames, the image data processed by the DSP circuit 1002.

The display 1004 includes, for example, a panel-type display device such as a liquid crystal panel or an organic EL (Electro Luminescence) panel, and records image data of a moving image or a still image captured by the imaging device 1 on a recording medium such as a semiconductor memory or a hard disk.

The operation unit 1006 outputs an operation signal for various functions owned by the electronic apparatus 1000 in accordance with an operation performed by a user. The power source unit 1007 supplies various types of power sources, which serve as operation power sources for the DSP circuit 1002, the frame memory 1003, the display 1004, the recording unit 1005, and the operation unit 1006, to those supply targets as appropriate.

4. PRACTICAL APPLICATION EXAMPLES (Example of Practical Application to Mobile Body)

The technology (the present technology) according to the present disclosure is applicable to a variety of products. For example, the technology according to the present disclosure may be achieved as a device mounted on any type of mobile body such as an automobile, an electric vehicle, a hybrid electric vehicle, a motorcycle, a bicycle, a personal mobility, an aircraft, a drone, a vessel, or a robot.

Figure 47:
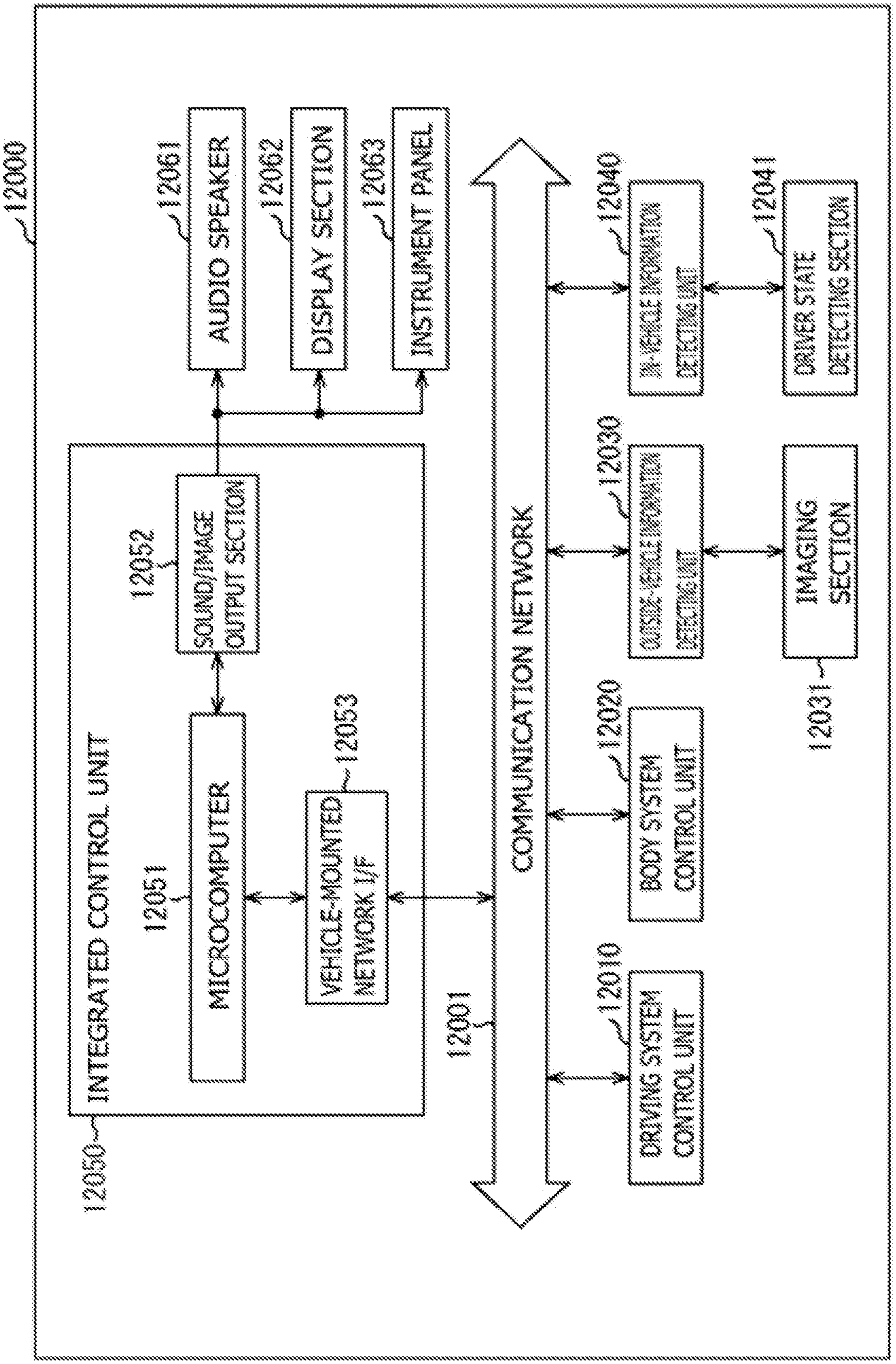
FIG. 47 is a block diagram depicting an example of schematic configuration of a vehicle control system.

FIG. 47 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 47, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 57, an audio speaker 12061, a display section 12062, and an instrument panel 12063 are illustrated as the output device. The display section 12062 may, for example, include at least one of an on-board display and a head-up display.

Figure 48:
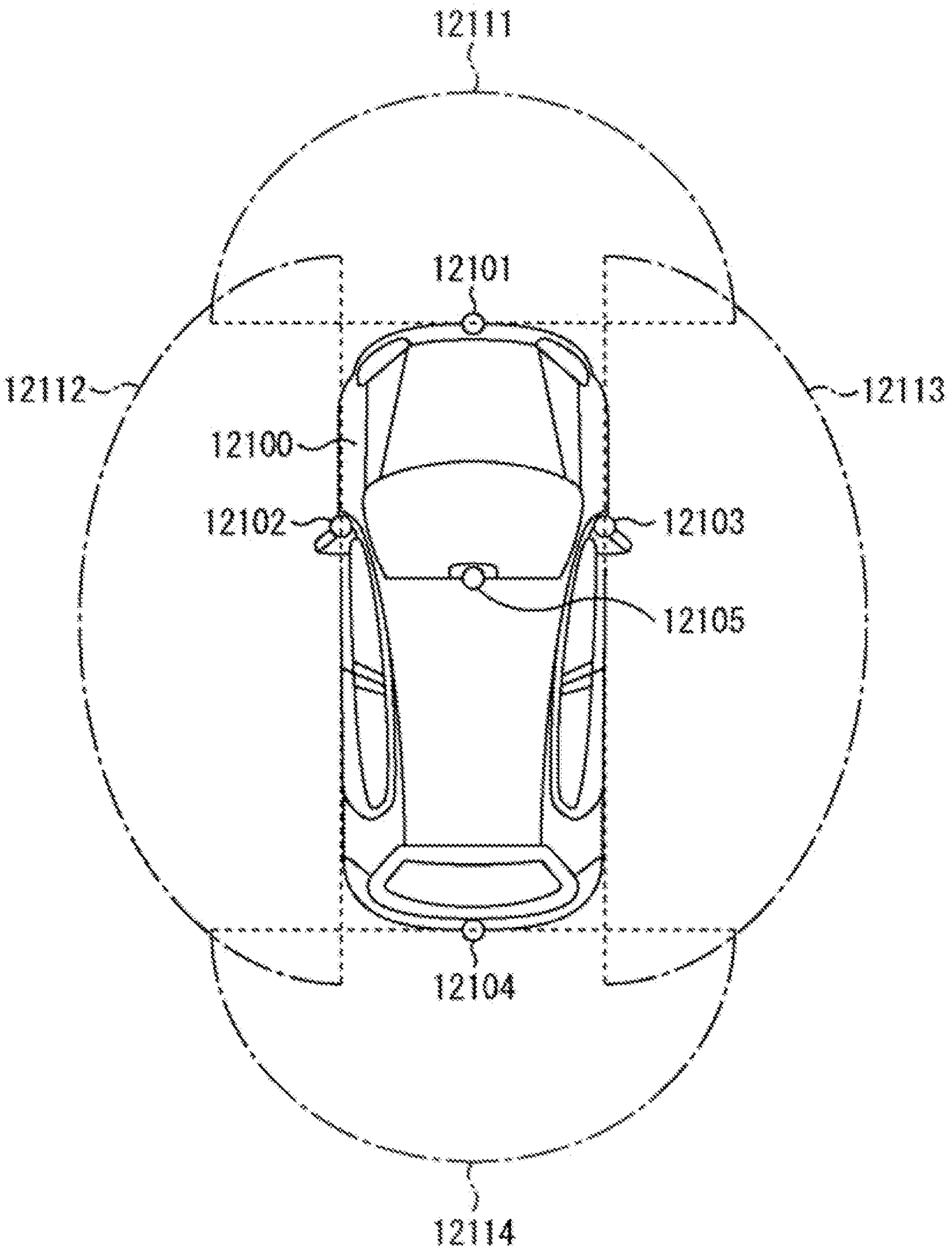
FIG. 48 is a diagram of assistance in explaining an example of installation positions of an outside-vehicle information detecting section and an imaging section.

FIG. 48 is a diagram depicting an example of the installation position of the imaging section 12031.

In FIG. 48, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 48 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The description has been given hereinabove of one example of the mobile body control system, to which the technology according to an embodiment of the present disclosure may be applied. The technology according to an embodiment of the present disclosure may be applied to the imaging section 12031 among components of the configuration described above. Specifically, the imaging device 100 is applicable to the imaging section 12031. The application of the technology according to an embodiment of the present disclosure to the imaging section 12031 allows for a high-definition captured image with less noise, thus making it possible to perform highly accurate control utilizing the captured image in the mobile body control system.

(Example of Practical Application to Endoscopic Surgery System)

The technology according to an embodiment of the present disclosure (present technology) is applicable to various products. For example, the technology according to an embodiment of the present disclosure may be applied to an endoscopic surgery system.

Figure 49:
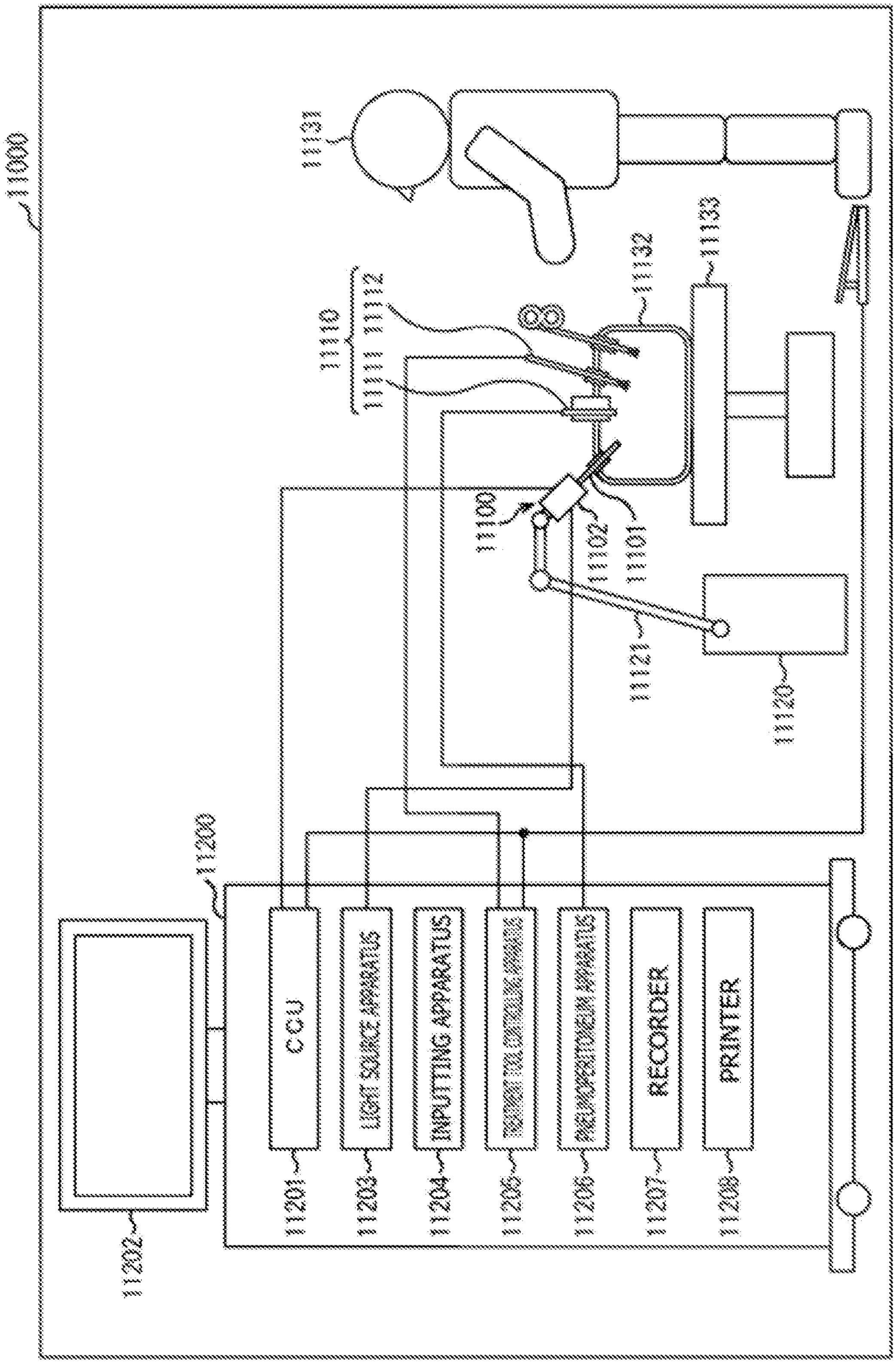
FIG. 49 is a view depicting an example of a schematic configuration of an endoscopic surgery system.

FIG. 49 is a view depicting an example of a schematic configuration of an endoscopic surgery system to which the technology according to an embodiment of the present disclosure (present technology) can be applied.

In FIG. 49, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photoelectrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 50:
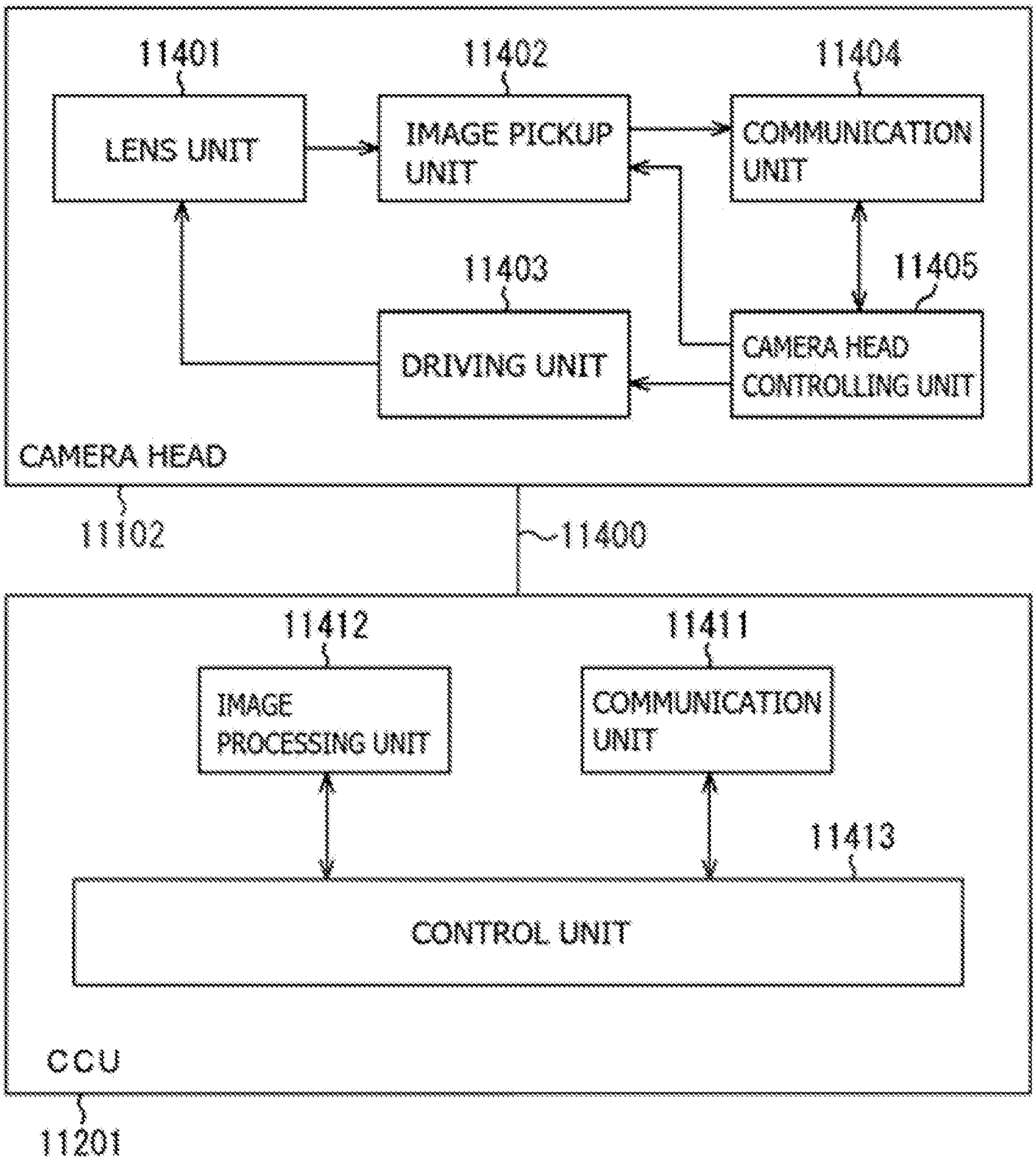
FIG. 50 is a block diagram depicting an example of a functional configuration of a camera head and a camera control unit (CCU).

FIG. 50 is a block diagram depicting an example of a functional configuration of the camera head 11102 and the CCU 11201 depicted in FIG. 49.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The description has been given above of one example of the endoscopic surgery system, to which the technology according to an embodiment of the present disclosure is applicable. The technology according to an embodiment of the present disclosure is applicable to the image pickup unit 11402, provided in the camera head 11102 of the endoscope 11100, of the configurations described above. Applying the technology according to an embodiment of the present disclosure to the image pickup unit 11402 enables the image pickup unit 11402 to have a smaller size or higher definition property, thus making it possible to provide the small-sized or high-definition endoscope 11100.

Description has been given hereinabove referring to the embodiment, Modification Examples 1 to 15, Application Examples, and Practical Application Examples; however, the present technology is not limited to the foregoing embodiment and the like, and may be modified in a wide variety of ways. For example, Modification Examples 1 to 15 above have been described as modification examples of the foregoing embodiment; however, the configurations of the respective modification examples may be appropriately combined.

It is to be noted that the effects described herein are merely exemplary and should not be limited to the description, and may further include other effects.

It is to be noted that the present disclosure may also have the following configuration. According to the present technology of the following configurations, the pixel separation section having the first refractive index is provided between the adjacent pixels of the semiconductor substrate, and the in-pixel separation section having the second refractive index whose difference with the refractive index of the semiconductor substrate is smaller than difference between the first refractive index and the refractive index of the semiconductor substrate is provided between the photoelectric conversion sections adjacent to each other inside each of the pixels. This allows for light entered in each pixel at a wide angle to be totally reflected between adjacent pixels, and to be prevented from reflecting between adjacent photoelectric conversion sections inside the pixel. This makes it possible to improve the optical characteristic.

(1)

An imaging device including:

a semiconductor substrate which has a first surface and a second surface opposed to each other, and in which a plurality of pixels is arranged in a matrix, the semiconductor substrate including a plurality of photoelectric conversion sections that each generate electric charge corresponding to a light receiving amount by photoelectric conversion for each of the pixels;

an inter-pixel separation section provided between the pixels adjacent to each other, electrically and optically separating the adjacent pixels from each other, and having a first refractive index; and an in-pixel separation section provided between the photoelectric conversion sections adjacent to each other inside each of the pixels, electrically separating the adjacent photoelectric conversion sections, and having a second refractive index, a difference between the second refractive index and a refractive index of the semiconductor substrate being smaller than a difference between the first refractive index and the refractive index of the semiconductor substrate.

(2)

The imaging device according to (1), in which the second refractive index is higher than the first refractive index.

(3)

The imaging device according to (1) or (2), in which the second refractive index of the in-pixel separation section differs for each of the pixels depending on a wavelength of light to be photoelectrically converted in the plurality of photoelectric conversion sections inside each of the pixels.

(4)

The imaging device according to (3), in which the second refractive index of the in-pixel separation section is higher as the wavelength of the light to be photoelectrically converted in the plurality of photoelectric conversion sections inside each of the pixels is longer.

(5)

The imaging device according to any one of (1) to (4), in which the in-pixel separation section has a refractive index gradient in which a refractive index changes continuously or intermittently from a center part toward an outer edge part in a neighboring direction of the adjacent photoelectric conversion sections inside each of the pixels, and a refractive index of the outer edge part is higher than a refractive index of the center part.

(6)

The imaging device according to (5), in which the center part of the in-pixel separation section includes a material having a bandgap higher than a bandgap of the outer edge part.

(7)

The imaging device according to (5) or (6), in which the in-pixel separation section includes a stacked film in which a first layer and a second layer having respective bandgaps different from each other are alternately stacked, respective film thicknesses of the first layer and the second layer in the center part being changed from the respective thicknesses in the outer edge part, the first layer and the second layer each extending between the first surface of the semiconductor substrate and the second surface of the semiconductor substrate.

(8)

The imaging device according to any one of (1) to (7), in which the in-pixel separation section includes amorphous silicon or polysilicon embedded in the semiconductor substrate, and a barrier film that is provided around and covers the amorphous silicon or the polysilicon.

(9)

The imaging device according to (8), in which the barrier film includes a metal oxide film.

(10)

The imaging device according to any one of (1) to (9), in which a width of the in-pixel separation section in an in-plane direction of the semiconductor substrate is narrower than a width of the inter-pixel separation section in the in-plane direction of the semiconductor substrate.

(11)

The imaging device according to any one of (1) to (10), in which the in-pixel separation section has a space between the in-pixel separation section and the first surface of the semiconductor substrate, and a width of the in-pixel separation section in an in-plane direction of the semiconductor substrate increases from a side of the first surface toward a side of the second surface.

(12)

The imaging device according to (11), in which the in-pixel separation section has a gap inside the in-pixel separation section.

(13)

The imaging device according to any one of (1) to (12), in which the in-pixel separation section includes a first separation section and a second separation section that are independent from each other and extend from corresponding one of a pair of opposite sides of the inter-pixel separation section that surrounds each of the pixels toward a center of each of the pixels, and the first separation section has a space between the first separation section and the inter-pixel separation section, and the second separation section has a space between the second separation section and the inter-pixel separation section.

(14)

The imaging device according to (13), in which a distance between the first separation section and the second separation section inside each of the pixels differs depending on a wavelength of light to be photoelectrically converted in the plurality of photoelectric conversion sections inside each of the pixels, and the distance is greater as the wavelength is longer.

(15)

The imaging device according to any one of (1) to (14), in which the inter-pixel separation section and the in-pixel separation section are covered around with a barrier film.

(16)

The imaging device according to (15), in which the barrier film includes an aluminum oxide film.

(17)

The imaging device according to any one of (1) to (16), in which the inter-pixel separation section and the in-pixel separation section each extend from the first surface of the semiconductor substrate toward the second surface of the semiconductor substrate.

(18)

The imaging device according to (17), in which an impurity diffusion layer is formed between a bottom of the inter-pixel separation section and the second surface and between a bottom of the in-pixel separation section and the second surface.

(19)

The imaging device according to any one of (1) to (18), in which an electrode is further provided on the first surface of the semiconductor substrate, the electrode being configured to apply voltage to each of the inter-pixel separation section and the in-pixel separation section.

(20)

The imaging device according to any one of (1) to (19), in which the inter-pixel separation section and the in-pixel separation section each penetrate between the first surface of the semiconductor substrate and the second surface the semiconductor substrate.

(21)

The imaging device according to any one of (1) to (20), in which a width of the in-pixel separation section in an in-plane direction of the semiconductor substrate is narrower than a width of the inter-pixel separation section in the in-plane direction of the semiconductor substrate, and the inter-pixel separation section has a gap inside the inter-pixel separation section.

(22)

The imaging device according to (21), in which the plurality of pixels each includes four photoelectric conversion section disposed in two rows and two columns, and the in-pixel separation section extends in a first direction and a second direction to separate from each other the four photoelectric conversion sections that are adjacent to each other, the second direction being perpendicular to the first direction, and the width in the in-plane direction of the semiconductor substrate is narrower at and near an intersection of the in-pixel separation section.

(23)

An imaging device including:

a semiconductor substrate which has a first surface and a second surface opposed to each other, and in which a plurality of pixels is arranged in a matrix, the semiconductor substrate including a plurality of photoelectric conversion sections that each generate electric charge corresponding to a light receiving amount by photoelectric conversion for each of the pixels;

an inter-pixel separation section provided between the pixels adjacent to each other, electrically and optically separating the adjacent pixels from each other, and having a first refractive index; and an in-pixel separation section provided between the photoelectric conversion sections adjacent to each other inside each of the pixels, electrically separating the adjacent photoelectric conversion sections, and having a second refractive index that is higher than the first refractive index.

(24)

An imaging device including:

a semiconductor substrate which has a first surface and a second surface opposed to each other, and in which a plurality of pixels is arranged in a matrix, the semiconductor substrate including a plurality of photoelectric conversion sections that each generate electric charge corresponding to a light receiving amount by photoelectric conversion for each of the pixels;

an inter-pixel separation section provided between the pixels adjacent to each other, and electrically and optically separating the adjacent pixels from each other; and an in-pixel separation section provided between the photoelectric conversion sections adjacent to each other inside each of the pixels, electrically separating the adjacent photoelectric conversion sections, and having a refractive index gradient in which a refractive index changes continuously or intermittently from a center part toward an outer edge part in a neighboring direction of the adjacent photoelectric conversion sections inside each of the pixels.

(25)

An imaging device including:

a semiconductor substrate which has a first surface and a second surface opposed to each other, and in which a plurality of pixels is arranged in a matrix, the semiconductor substrate including a plurality of photoelectric conversion sections that each generate electric charge corresponding to a light receiving amount by photoelectric conversion for each of the pixels;

an inter-pixel separation section provided between the pixels adjacent to each other, and electrically and optically separating the adjacent pixels from each other; and an in-pixel separation section provided between the photoelectric conversion sections adjacent to each other inside each of the pixels, electrically separating the adjacent photoelectric conversion sections, and having a width in an in-plane direction of the semiconductor substrate that is narrower than a width of the inter-pixel separation section in the in-plane direction of the semiconductor substrate.

(26)

An imaging device including:

a semiconductor substrate which has a first surface and a second surface opposed to each other, and in which a plurality of pixels is arranged in a matrix, the semiconductor substrate including a plurality of photoelectric conversion sections that each generate electric charge corresponding to a light receiving amount by photoelectric conversion for each of the pixels;

an inter-pixel separation section provided between the pixels adjacent to each other, and electrically and optically separating the adjacent pixels from each other; and an in-pixel separation section provided between the photoelectric conversion sections adjacent to each other inside each of the pixels, electrically separating the adjacent photoelectric conversion sections, and having a width in an in-plane direction of the semiconductor substrate that gradually increases from a side of the first surface toward a side of the second surface.

This application claims the benefit of Japanese Priority Patent Application JP2021-069276 filed with the Japan Patent Office on Apr. 15, 2021, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. An imaging device, comprising:

a semiconductor substrate which has a first surface and a second surface opposed to each other, and in which a plurality of pixels is arranged in a matrix, the semiconductor substrate including a plurality of photoelectric conversion sections that each generate electric charge corresponding to a light receiving amount by photoelectric conversion for each of the pixels;

an inter-pixel separation section provided between the pixels adjacent to each other, electrically and optically separating the adjacent pixels from each other, and having a first refractive index; and an in-pixel separation section provided between the photoelectric conversion sections adjacent to each other inside each of the pixels, electrically separating the adjacent photoelectric conversion sections, and having a second refractive index, a difference between the second refractive index and a refractive index of the semiconductor substrate being smaller than a difference between the first refractive index and the refractive index of the semiconductor substrate, wherein the refractive index of the in-pixel separation section differs for each of the pixels depending on a wavelength of light to be photoelectrically converted in the plurality of photoelectric conversion sections inside each of the pixels.

2. The imaging device according to claim 1, wherein the in-pixel separation section includes a first separation section and a second separation section that are independent from each other and extend from corresponding one of a pair of opposite sides of the inter-pixel separation section that surrounds each of the pixels toward a center of each of the pixels, and the first separation section has a space between the first separation section and the inter-pixel separation section, and the second separation section has a space between the second separation section and the inter-pixel separation section.

3. The imaging device according to claim 1, wherein the second refractive index of the in-pixel separation section is higher as the wavelength of the light to be photoelectrically converted in the plurality of photoelectric conversion sections inside each of the pixels is longer.

4. The imaging device according to claim 1, wherein the in-pixel separation section has a space between the in-pixel separation section and the first surface of the semiconductor substrate, and a width of the in-pixel separation section in an in-plane direction of the semiconductor substrate increases from a side of the first surface toward a side of the second surface.

5. The imaging device according to claim 4, wherein the in-pixel separation section has a gap inside the in-pixel separation section.

6. The imaging device according to claim 2, wherein the refractive index of the in-pixel separation section is higher than the refractive index of the inter-pixel separation section.

7. The imaging device according to claim 2, wherein a distance between the first separation section and the second separation section inside each of the pixels differs depending on a wavelength of light to be photoelectrically converted in the plurality of photoelectric conversion sections inside each of the pixels, and the distance is greater as the wavelength is longer.

8. The imaging device according to claim 1, wherein the inter-pixel separation section and the in-pixel separation section are covered with a barrier film.

9. The imaging device according to claim 8, wherein the barrier film comprises an aluminum oxide film.

10. The imaging device according to claim 1, wherein the inter-pixel separation section and the in-pixel separation section each extend from the first surface of the semiconductor substrate toward the second surface of the semiconductor substrate.

11. The imaging device according to claim 10, wherein an impurity diffusion layer is formed between a bottom of the inter-pixel separation section and the second surface and between a bottom of the in-pixel separation section and the second surface.

12. The imaging device according to claim 1, wherein an electrode is further provided on the first surface of the semiconductor substrate, the electrode being configured to apply voltage to each of the inter-pixel separation section and the in-pixel separation section.

13. The imaging device according to claim 1, wherein the inter-pixel separation section and the in-pixel separation section each penetrate between the first surface of the semiconductor substrate and the second surface the semiconductor substrate.

14. The imaging device according to claim 1, wherein the in-pixel separation section has a refractive index gradient in which the refractive index of the in-pixel separation section changes continuously or intermittently from a center part toward an outer edge part in a neighboring direction of the adjacent photoelectric conversion sections inside each of the pixels, and wherein the refractive index of the outer edge part of the in-pixel separation section is higher than the refractive index of the center part of the in-pixel separation section.

15. An imaging device, comprising:

a semiconductor substrate which has a first surface and a second surface opposed to each other, and in which a plurality of pixels is arranged in a matrix, the semiconductor substrate including a plurality of photoelectric conversion sections that each generate electric charge corresponding to a light receiving amount by photoelectric conversion for each of the pixels;

an inter-pixel separation section provided between the pixels adjacent to each other, electrically and optically separating the adjacent pixels from each other; and an in-pixel separation section provided between the photoelectric conversion sections adjacent to each other inside each of the pixels, electrically separating the adjacent photoelectric conversion sections, wherein a difference between a refractive index of the in-pixel section and a refractive index of the semiconductor substrate is smaller than a difference between a refractive index of the inter-pixel separation section the refractive index of the semiconductor substrate, wherein the in-pixel separation section has a refractive index gradient in which the refractive index of the in-pixel separation section changes continuously or intermittently from a center part toward an outer edge part in a neighboring direction of the adjacent photoelectric conversion sections inside each of the pixels, and wherein a refractive index of the outer edge part of the in-pixel separation section is higher than a refractive index of the center part of the in-pixel separation section.

16. The imaging device according to claim 15, wherein the center part of the in-pixel separation section includes a material having a bandgap higher than a bandgap of the outer edge part.

17. The imaging device according to claim 15, wherein the in-pixel separation section includes a stacked film in which a first layer and a second layer having respective bandgaps different from each other are alternately stacked, respective film thicknesses of the first layer and the second layer in the center part being changed from the respective thicknesses in the outer edge part, the first layer and the second layer each extending between the first surface of the semiconductor substrate and the second surface of the semiconductor substrate.

18. An imaging device, comprising:

a semiconductor substrate which has a first surface and a second surface opposed to each other, and in which a plurality of pixels is arranged in a matrix, the semiconductor substrate including a plurality of photoelectric conversion sections that each generate electric charge corresponding to a light receiving amount by photoelectric conversion for each of the pixels;

an inter-pixel separation section provided between the pixels adjacent to each other, electrically and optically separating the adjacent pixels from each other, and having a first refractive index; and an in-pixel separation section provided between the photoelectric conversion sections adjacent to each other inside each of the pixels, electrically separating the adjacent photoelectric conversion sections, and having a second refractive index, a difference between the second refractive index and a refractive index of the semiconductor substrate being smaller than a difference between the first refractive index and the refractive index of the semiconductor substrate, wherein the in-pixel separation section includes amorphous silicon or polysilicon embedded in the semiconductor substrate, and a barrier film that is provided around and covers the amorphous silicon or the polysilicon.

19. The imaging device according to claim 18, wherein the barrier film comprises a metal oxide film.

20. An imaging device, comprising:

a semiconductor substrate which has a first surface and a second surface opposed to each other, and in which a plurality of pixels is arranged in a matrix, the semiconductor substrate including a plurality of photoelectric conversion sections that each generate electric charge corresponding to a light receiving amount by photoelectric conversion for each of the pixels;

an inter-pixel separation section provided between the pixels adjacent to each other, electrically and optically separating the adjacent pixels from each other, and having a first refractive index; and an in-pixel separation section provided between the photoelectric conversion sections adjacent to each other inside each of the pixels, electrically separating the adjacent photoelectric conversion sections, and having a second refractive index, a difference between the second refractive index and a refractive index of the semiconductor substrate being smaller than a difference between the first refractive index and the refractive index of the semiconductor substrate, wherein a width of the in-pixel separation section in an in-plane direction of the semiconductor substrate is narrower than a width of the inter-pixel separation section in the in-plane direction of the semiconductor substrate.

* * * * *